United States Patent
Camardello et al.

(10) Patent No.: US 10,720,554 B2
(45) Date of Patent: Jul. 21, 2020

(54) GREEN-EMITTING PHOSPHORS AND DEVICES THEREOF

(71) Applicant: GENERAL ELECTRIC COMPANY, Schenectady, NY (US)

(72) Inventors: Samuel Joseph Camardello, Ballston Spa, NY (US); Anant Achyut Setlur, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 352 days.

(21) Appl. No.: 15/710,780

(22) Filed: Sep. 20, 2017

(65) Prior Publication Data
US 2019/0088827 A1    Mar. 21, 2019

(51) Int. Cl.
*H01L 33/50*    (2010.01)
*C01F 11/00*    (2006.01)
(Continued)

(52) U.S. Cl.
CPC .............. *H01L 33/502* (2013.01); *C01F 5/00* (2013.01); *C01F 11/00* (2013.01); *C01F 11/06* (2013.01);
(Continued)

(58) Field of Classification Search
CPC ............ H01L 33/502; C09K 11/08333; C09K 11/0838; C09K 11/0844; C09K 11/0861; C09K 11/0866
See application file for complete search history.

(56) References Cited

U.S. PATENT DOCUMENTS

| 3,457,179 A | 7/1969 | Natansohn |
| 3,597,363 A | 8/1971 | Avella |

(Continued)

FOREIGN PATENT DOCUMENTS

| WO | WO 2014/146748 | * | 9/2014 |
| WO | WO 2016/186637 | * | 11/2016 |
| WO | 2017073815 A1 | | 5/2017 |

OTHER PUBLICATIONS

R. C. Gibbs.,"The Effect of Temperature on Fluorescence and Absorption", vol. XXX, issue No. 3, Fluorescence and Absorption, Aug. 1909 (summary of the work described in this paper was presented), 10 Pages.
(Continued)

*Primary Examiner* — C Melissa Koslow
(74) *Attorney, Agent, or Firm* — Armstrong Teasdale LLP

(57) ABSTRACT

A device including an LED light source optically coupled to a green-emitting $U^{6+}$-doped phosphor having a composition selected from the group consisting of $U^{6+}$-doped phosphate-vanadate phosphors, $U^{6+}$-doped halide phosphors, $U^{6+}$-doped oxyhalide phosphors, $U^{6+}$-doped silicate-germanate phosphors, $U^{6+}$-doped alkali earth oxide phosphors, and combinations thereof, is presented. The $U^{6+}$-doped phosphate-vanadate phosphors are selected from the group consisting of compositions of formulas (A1)-(A12). The $U^{6+}$-doped halide phosphors are selected from the group consisting of compositions for formulas (B1)-(B3). The $U^{6+}$-doped oxyhalide phosphors are selected from the group consisting of compositions of formulas (C1)-(C5). The $U^{6+}$-doped silicate-germanate phosphors are selected from the group consisting of compositions of formulas (D1)-(D11). The $U^{6+}$-doped alkali earth oxide phosphors are selected from the group consisting of formulas (E1)-(E11).

21 Claims, 56 Drawing Sheets

(51) Int. Cl.
| | |
|---|---|
| C01G 43/00 | (2006.01) |
| C01G 17/00 | (2006.01) |
| C01G 33/00 | (2006.01) |
| C01G 15/00 | (2006.01) |
| C09K 11/71 | (2006.01) |
| C09K 11/62 | (2006.01) |
| C09K 11/61 | (2006.01) |
| C01G 31/00 | (2006.01) |
| C09K 11/08 | (2006.01) |
| C09K 11/64 | (2006.01) |
| C01F 11/22 | (2006.01) |
| C01F 11/06 | (2006.01) |
| C01F 5/00 | (2006.01) |
| C01F 11/20 | (2006.01) |
| G02F 1/13357 | (2006.01) |

(52) U.S. Cl.
CPC ............. *C01F 11/20* (2013.01); *C01F 11/22* (2013.01); *C01G 15/00* (2013.01); *C01G 15/006* (2013.01); *C01G 17/00* (2013.01); *C01G 31/00* (2013.01); *C01G 31/006* (2013.01); *C01G 33/00* (2013.01); *C01G 33/006* (2013.01); *C01G 43/006* (2013.01); *C09K 11/085* (2013.01); *C09K 11/0816* (2013.01); *C09K 11/0838* (2013.01); *C09K 11/0844* (2013.01); *C09K 11/0861* (2013.01); *C09K 11/0866* (2013.01); *C09K 11/616* (2013.01); *C09K 11/625* (2013.01); *C09K 11/643* (2013.01); *C09K 11/647* (2013.01); *C09K 11/71* (2013.01); *C01P 2002/50* (2013.01); *C01P 2002/54* (2013.01); *G02F 1/133603* (2013.01)

(56) References Cited

U.S. PATENT DOCUMENTS

| | | | |
|---|---|---|---|
| 5,313,485 | A | 5/1994 | Hamil et al. |
| 5,793,158 | A | 8/1998 | Wedding, Sr. |
| 8,236,199 | B2 | 8/2012 | Mahany et al. |
| 8,663,501 | B2 | 3/2014 | Srivastava et al. |
| 8,721,925 | B2 * | 5/2014 | Winkler .............. C01B 21/0821 252/301.4 F |
| 9,512,356 | B2 | 12/2016 | Lyons et al. |

OTHER PUBLICATIONS

Anderson et al.,"Luminescent Barium and Magnesium Halophosphates", Research Laboratories, British Thomson-Houston Company, Ltd., Rugby, England, J.Electrochem. Soc. 1951,vol. 98 No. 10, 3 Pages.

J. V. Nicholas.,"Luminescence of Hexavalent Uranium in CaF2 and SrF2 Powders", The Physical review, second series, Mar. 10, 1967, issue No. 2, vol. 155, 6 Pages.

G. Blasse.,"Fluorescence of Uranium-Activated Compounds with Rocksalt Lattice", J. Electrochem. Soc.: Solid State Science, Jul. 1968, vol. 115, No. 7, 5 Pages.

S. Natansohn et al.,"Luminescence Properties of Rare Earth Tellurates", J. Electrochem. Soc.: Solid State Science, vol. 116, No. 9, Sep. 1969, 5 Pages.

M. V. Hoffman.,"Fluorescence and Energy Transfer in SrZnP2 O7. UO2", J. Electrochem. Soc.: Solid State Science, Feb. 1970, No. 2, vol. 117, 6 Pages.

S. Natansohn et al.,"Fluorescence Properties of Alkaline Earth Tellurates", J. Electrochem. Soc.: Solid-State Science and Technology, May 1973, No. 5, vol. 120, 5 Pages.

G. Blasse.,"The Structure Sensitivity of the U 6+ Ion Luminescence in Oxides", J. Electrochem. Soc.: Solid-State Science and Technology, Aug. 1977, No. 8, vol. 124, 6 Pages.

Blasse et al.,"Luminescence of Doped and Undoped Al2 (W04)3, Sc2(WO4)3 and Lu2(W04)3", J. Electrochem. Soc.: Solid-State Science and Technology, Feb. 1980, No. 2, vol. 127, 6 Pages.

Lam et al.,"The luminescence of uranium-activated tungstates and molybdates with scheelite structure", The Journal of Chemical Physics, 72, 1803 (1980); 7 Pages.

Raukas et al.,"Optical spectra and photoconductivity of Uranium-doped CaF2 crystals", Journal of Luminescence, Elsevier Science B.V., 72-74, 1997, pp. 250-252.

Tanner et al.,"Luminescence of Uranium-Doped Strontium Tetraborate (SrB407)", J. Phys. Chera Solids vol. 58, No. 7, 1997, pp. 1143-1146.

Joshi et al., Sensitizing Sm3+ emission by non-radiative energy transfer from UO++ 2 in zinc phosphate glass, Journal of Non-Crystalline Solids, 337, 2004, pp. 97-99.

DeRose et al.,"Characterization of Standard Reference Material 2941, uranyl-ion-doped glass, spectral correction standard for fluorescence", Journal of Luminescence, Elsevier B.V.,128, 2008, pp. 257-266.

Wang et al.,"Parametric Investigation of Laser-Induced Fluorescence of Solid-State Uranyl Compounds", J. Phys. Chem. A 2008, 112, pp. 10502-10508.

Jia et al.,"Energy transfer between UO2 2+ and Eu3+ in B—NaYF4", Journal of Alloys and Compounds, 471, 2009, pp. 557-560.

Yagoubi et al.,"Molten salt flux synthesis and crystal structure of a new open-framework uranyl phosphate Cs3(UO2) 2(PO4)O2: Spectroscopic characterization and cationic mobility studies", Journal of Solid State Chemistry 200, (2013) pp. 13-21.

Pote et al.,"Preparation of CaF2: U Phosphor by Solid State Metathesis Reaction", International Journal of Self-Propagating High-Temperature Synthesis, 2013, vol. 22, No. 1, pp. 37-40.

Taikar et al.,"SrO: U6+ green light emitting phosphor", Luminescence, Elsevier, Science direct, 153, 2014, pp. 304-306.

Wu et al.,"Highly Distorted Uranyl Ion Coordination and One/Two-Dimensional Structural Relationship in the Ba2[UO2 (TO4)2] (T=P, As) System: An Experimental and Computational Study", Inorganic Chemistry, ACS Publications, 2014, 53, pp. 7650-7660.

Kumar et al., "On the photo and thermally stimulated luminescence properties of U doped SrBPO5", Materials Research Bulletin, vol. 60, Dec. 2014, 7 Pages.

Rout et al., "Photoluminescence properties of U in SrBPO5 host: Effect of concentration and annealing temperature", Journal of Luminescence, vol. 167, Nov. 2015, 7 Pages.

PCT International Search Report and Written Opinion, Application No. PCT/US2018/045888, dated Mar. 14, 2019, 12 pps.

\* cited by examiner

GREEN-EMITTING PHOSPHORS AND DEVICES THEREOF

BACKGROUND

Current display device technology relies on liquid crystal displays (LCDs), which is one of the most widely used flat panel displays for industrial and residential applications. However, next-generation devices that will have low energy consumption, compact size, and high brightness, requiring improved color gamut (NTSC ratio).

LED backlight units (BLU) for use in displays are based on a combination of a blue LED, a green phosphor and a red phosphor. The color gamut of LED BLUs is largely determined by the choice of phosphors. Red phosphor $K_2SiF_6$: $Mn^{4+}$ has a peak with full width at half maximum (FWHM) of 6 to 8 nm yields high color reproducibility in correspondence with the relative intensity of the emission peak. Green phosphor, $\beta$-SiAlON: $Eu^{2+}$ has a half width of 46 to 52 nm and has peak wavelength of 534 nm, which is not a pure green but greenish yellow in color. Accordingly, there is also a need for new green emitting phosphors that efficiently absorb blue radiation, provide high quantum efficiency, and have improved color rendering.

BRIEF DESCRIPTION

Briefly, in one aspect, the present disclosure relates to a device including an LED light source optically coupled to a green-emitting $U^{6+}$-doped phosphor having a composition selected from the group consisting of $U^{6+}$-doped phosphate-vanadate phosphors, $U^{6+}$-doped halide phosphors, $U^{6+}$-doped oxyhalide phosphors, $U^{6+}$-doped silicate-germanate phosphors, $U^{6+}$-doped alkali earth oxide phosphors, and combinations thereof. The $U^{6+}$-doped phosphate-vanadate phosphors are selected from the group consisting of compositions of formulas (A1)-(A12). The $U^{6+}$-doped halide phosphors are selected from the group consisting of compositions for formulas (B1)-(B3). The $U^{6+}$-doped oxyhalide phosphors are selected from the group consisting of compositions of formulas (C1)-(C5). The $U^{6+}$-doped silicate-germanate phosphors are selected from the group consisting of compositions of formulas (D1)-(D11). The $U^{6+}$-doped alkali earth oxide phosphors are selected from the group consisting of formulas (E1)-(E11).

In another aspect, the present disclosure relates a device including an LED light source optically coupled to a green-emitting $U^{6+}$-doped phosphor selected from the group consisting of $U^{6+}$-doped phosphate-vanadate phosphors, $U^{6+}$-doped halide phosphors, $U^{6+}$-doped oxyhalide phosphors, $U^{6+}$-doped silicate-germanate phosphors, $U^{6+}$-doped alkali earth oxide phosphors, and combinations thereof, with the proviso that the $U^{6+}$-doped phosphate-vanadate phosphors do not include $Ba_2P_2O_7$: $U^{6+}$ and $Ba_3P_2O_8$: $U^{6+}$ and the $U^{6+}$-doped oxyhalide phosphors do not include $Ba_5P_3O_{12}F$: $U^{6+}$.

In one aspect, the present disclosure relates to a green-emitting $U^{6+}$-doped phosphor selected from [Ba, Sr, Ca, Mg]$_4$[B, Al, Ga, In][P, V]O$_8$: $U^{6+}$ and [Ba, Sr, Ca, Mg]$_6$[B, Al, Ga, In]$_5$[P, V]$_5$O$_{26}$: $U^{6+}$.

DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

Figure 1:
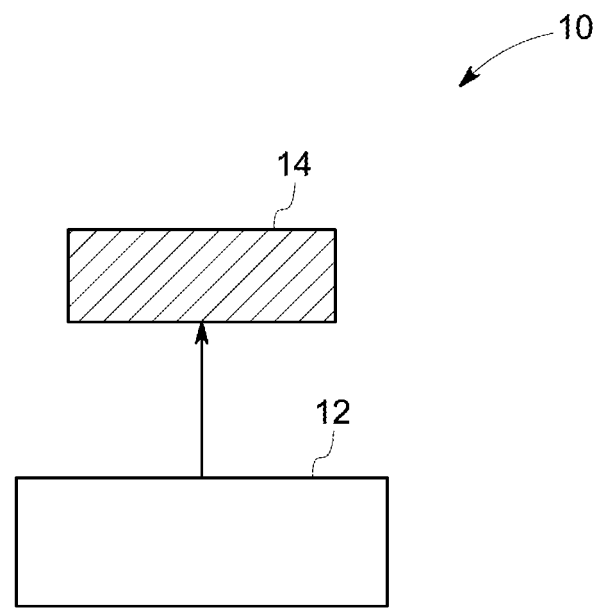
FIG. 1 is a schematic cross-sectional view of a device, in accordance with one embodiment of the disclosure.

In the following specification and the claims, the singular forms "a", "an" and "the" include plural referents unless the context clearly dictates otherwise. As used herein, the term "or" is not meant to be exclusive and refers to at least one of the referenced components being present and includes instances in which a combination of the referenced components may be present, unless the context clearly dictates otherwise.

Approximating language, as used herein throughout the specification and claims, may be applied to modify any quantitative representation that could permissibly vary without resulting in a change in the basic function to which it is related. Accordingly, a value modified by a term or terms, such as "about" and "substantially" is not limited to the precise value specified. In some instances, the approximating language may correspond to the precision of an instrument for measuring the value.

Devices according to the present disclosure include an LED light source optically coupled to a green-emitting $U^{6+}$-doped phosphor selected from the group consisting of $U^{6+}$-doped phosphate-vanadate phosphors, $U^{6+}$-doped halide phosphors, $U^{6+}$-doped oxyhalide phosphors, $U^{6+}$-doped silicate-germanate phosphors, $U^{6+}$-doped alkali earth oxide phosphors, and combinations thereof. In some embodiments, the $U^{6+}$-doped phosphate-vanadate phosphors are selected from the group consisting of compositions of formulas (A1)-(A12). In some embodiments, the $U^{6+}$-doped phosphate-vanadate phosphors do not include $Ba_2P_2O_7$: $U^{6+}$ and $Ba_3P_2O_8$: $U^{6+}$. In some embodiments, the $U^{6+}$-doped halide phosphors are selected from the group consisting of compositions for formulas (B1)-(B3). In some embodiments, the $U^{6+}$-doped oxyhalide phosphors are selected from the group consisting of compositions of formulas (C1)-(C5). In some embodiments, the $U^{6+}$-doped oxyhalide phosphors do not include $Ba_5P_3O_{12}F$: $U^{6+}$. In some embodiments, the $U^{6+}$-doped silicate-germanate phosphors are selected from the group consisting of compositions of formulas (D1)-(D11). In some embodiments, the $U^{6+}$-doped alkali earth oxide phosphors are selected from the group consisting of formulas (E1)-(E11).

Each formula of the green-emitting $U^{6+}$-doped phosphor may represent various compositions. The square brackets in the formulas (A1)-(A12), (B1)-(B3), (C1)-(C5), (D1)-(D11), and (E1)-(E11) indicate that at least one of the elements, is present in the phosphor composition, and any combination of two or more thereof may be present. For example, formula (A1) is [Ba, Sr, Ca, Mg][B, Al, Ga, In][P, V]O5: $U^{6+}$ and encompasses at least one of Ba, Sr, Ca, Mg or any combination of two or more of Ba, Sr, Ca, Mg; and at least one of B, Al, Ga, In, or any combination of two or more of B, Al, Ga, In. Examples include $BaBPO_5$:$U^{6+}$, $SrBPO_5$:$U^{6+}$, $MgAlPO_5$:$U^{6+}$, $Sr[B_xAl_{1-x}]PO_5$:$U^{6+}$, where 0≤x≤1, or a combination thereof. Furthermore, the compositions of formulas (A1)-(A12), (B1)-(B3), (C1)-(C5), (D1)-(D11), and (E1)-(E11) show $U^{6+}$ after the colon ":" in the formulas. This representation indicates that the phosphor compositions are doped with $U^{6+}$ and may be referred to as $U^{6+}$-doped phosphor.

As used herein, the term 'phosphate-vanadate phosphor' refers to a compound having a composition selected from the formulas (A1)-(A12) that encompasses P, V or a combination thereof.

As used herein, the term 'silicate-germanate phosphor' refers to a compound having a composition selected from the formulas (D1)-(D11) that encompasses Si, Ge, or a combination thereof.

The green-emitting $U^{6+}$-doped phosphors disclosed herein absorb radiation in the near-UV or blue region (a wavelength range between about 400 nm and 470 nm) and emit in a narrow region with an emission peak centered in a wavelength range from about 510 nm to about 540 nm, particularly from about 520 nm to about 530 nm. In some embodiments, these phosphors may be utilized in a phosphor blend to produce white light. These narrow green-emitting phosphors are useful in display applications, in particular.

The green-emitting $U^{6+}$-doped phosphors are activated or doped with an activator ion $U^{6+}$. In some embodiments, an additional activator ion may be present such as $Mn^{2+}$, $Mn^{4+}$, $Ce^{3+}$, $Sn^{2+}$, $Bi^{3+}$, $Sb^{3+}$, $Cr^{3+}$, $Tb^{3+}$, $Pr^{3+}$, $Eu^{3+}$, $Ti^{4+}$, $In^+$, $Tl^+$, $Dy^{3+}$ and $Pb^{2+}$.

In some embodiments, the green-emitting $U^{6+}$-doped phosphor is a $U^{6+}$-doped phosphate-vanadate phosphor selected from the group consisting of compositions of formulas (A1)-(A12) and a combination thereof. Formula (A1) is [Ba, Sr, Ca, Mg][B, Al, Ga, In][P, V]O5: $U^{6+}$; formula (A2) is $Ba_{2-x}$[Sr, Ca, Mg]$_x$[$P_{1-y}V_y$]$_2O_7$: $U^{6+}$; wherein 0≤x≤2, 0≤y≤1, and x≠0 when y=0; formula (A3) is [Ba, Sr, Ca, Mg]$_4$[P, V]$_2O_9$: $U^{6+}$; formula (A4) is [Ba, Sr, Ca, Mg]$_3$[P, V]$_4O_{13}$: $U^{6+}$; formula (A5) is [Ba, Sr, Ca, Mg]$_4$[B, Al, Ga, In][P, V]$O_8$: $U^{6+}$; formula (A6) is [Ba, Sr, Ca, Mg]$_6$[B, Al, Ga, In]$_5$[P, V]$_5O_{26}$: $U^{6+}$; formula (A7) is $Ba_{3-x}$[Sr, Ca, Mg]$_x$[$P_{1-y}$, $V_y$]$_2O_8$: $U^{6+}$, wherein 0≤x≤3, 0≤y≤1, and x≠0 when y=0; formula (A8) is $A_2$[Ba, Sr, Ca, Mg][P, V]$_2O_7$: $U^{6+}$; formula (A9) is A[Ba, Sr, Ca, Mg][P, V]$O_4$: $U^{6+}$; formula (A10) is [Ba, Sr, Ca, Mg][P, V]$_2O_6$: $U^{6+}$; formula (A11) is [Ba, Sr, Ca, Mg]$_3$[B, Al, Ga, In][P, V]$O_7$: $U^{6+}$; and formula (A12) is [Ba, Sr, Ca, Mg]$_{10}$[P, V]$_6O_{25}$: $U^{6+}$, wherein, A is Li, Na, K, Rb, Cs, or a combination thereof. In some embodiments, the green-emitting $U^{6+}$-doped phosphor is selected from formula (A5) [Ba, Sr, Ca, Mg]$_4$[B, Al, Ga, In][P, V]$O_8$: $U^{6+}$ and formula (A6) [Ba, Sr, Ca, Mg]$_6$[B, Al, Ga, In]$_5$[P, V]$_5O_{26}$: $U^{6+}$. In certain embodiments, the green-emitting $U^{6+}$-doped phosphate-vanadate phosphor is formula (A5) [Ba, Sr, Ca, Mg]$_4$[B, Al, Ga, In][P, V]$O_8$: $U^{6+}$. Examples include, but are not limited to, $Sr_4AlPO_8$: $U^{6+}$, $Ba_4AlPO_8$: $U^{6+}$, $Ca_4AlPO_8$: $U^{6+}$, $SrBa_3AlPO_8$: $U^{6+}$, $Sr_2Ba_2AlPO_8$: $U^{6+}$, or $Sr_3BaAlPO_8$: $U^{6+}$. In certain embodiments, the green-emitting $U^{6+}$-doped $U^{6+}$-doped phosphate-vanadate phosphor is formula (A6) [Ba, Sr, Ca, Mg]$_6$[B, Al, Ga, In]$_5$[P, V]$_5O_{26}$: $U^{6+}$. Examples include, but are not limited to, $Ba_6Al_5P_5O_{26}$: $U^{6+}$, $Ba_6Ga_5P_5O_{26}$: $U^{6+}$, $Ba_6In_5P_5O_{26}$: $U^{6+}$, $Ba_6Al_5V_5O_{26}$: $U^{6+}$, $Ba_6Ga_5V_5O_{26}$: $U^{6+}$, or $Ba_6In_5V_5O_{26}$: $U^{6+}$. Other non-limiting examples include $SrBPO_5$: $U^{6+}$, $BaBP_5$: $U^{6+}$, $MgAlPO_5$: $U^{6+}$, $Ca_2V_2O_7$: $U^{6+}$, $Ba_2V_2O_7$: $U^{6+}$, $CaMgV_2O_7$: $U^{6+}$, $SrMgV_2O_7$: $U^{6+}$, $Sr_4P_2O_9$: $U^{6+}$, $Ca_4P_2O_9$: $U^{6+}$, $Ba_3P_4O_{13}$: $U^{6+}$, $Sr_3P_4O_{13}$: $U^{6+}$, $Ca_{10}P_6O_{25}$: $U^{6+}$, $Sr_{10}P_6O_{25}$: $U^{6+}$, $Mg_3P_2O_8$: $U^{6+}$, $Ca_3V_2O_8$: $U^{6+}$, $Ba_3V_2O_8$: $U^{6+}$, $BaMg_2V_2O_8$: $U^{6+}$, $Cs_2CaP_2O_7$: $U^{6+}$, $Cs_2SrP_2O_7$: $U^{6+}$, $Cs_2CaV_2O_7$: $U^{6+}$, $Cs_2SrV_2O_7$: $U^{6+}$, $Li_2BaP_2O_7$: $U^{6+}$, $NaCaPO_4$: $U^{6+}$, $LiSrPO_4$: $U^{6+}$, $NaSrPO_4$: $U^{6+}$, $KSrPO_4$: $U^{6+}$, $KBaVO_4$: $U^{6+}$, $KSrVO_4$: $U^{6+}$, $KCaVO_4$: $U^{6+}$, $BaP_2O_6$: $U^{6+}$, $CaV_2O_6$: $U^{6+}$, $Ba_3BPO_7$: $U^{6+}$ or $Sr_3BPO_7$: $U^{6+}$.

In some embodiments, the green-emitting $U^{6+}$-doped phosphor is a $U^{6+}$-doped halide phosphor selected from the group consisting of compositions of formulas (B1)-(B3) and a combination thereof. Formula (B1) is [Ba, Sr, Ca, Mg]$X_2$: $U^{6+}$; formula (B2) is A[Ba, Sr, Ca, Mg]$X_3$: $U^{6+}$; and formula (B3) is [Ba, Sr, Ca, Mg]$_2X_4$: $U^{6+}$, wherein, A is Li, Na, K, Rb, Cs, or a combination thereof and X is F, Cl, Br or a combination thereof. Examples include, but are not limited to, $CaF_2$: $U^{6+}$, $BaF_2$: $U^{6+}$, BaFCl: $U^{6+}$, BaFBr: $U^{6+}$, $LiBaF_3$: $U^{6+}$, or $BaMgF_4$: $U^{6+}$. In some embodiments, the green-emitting $U^{6+}$-doped phosphor is $U^{6+}$-doped oxyhalide phosphor selected from the group consisting of compositions of formulas (C1)-(C5) and a combination thereof. Formula (C1) is [Ba, Sr, Ca, Mg]$_2$[B, Al, Ga, In]$O_3$X: $U^{6+}$; formula (C2) is [Ba, Sr, Ca, Mg]$_2$[P, V]$O_4$X: $U^{6+}$; formula (C3) is $Ba_{5-n}$[Sr, Ca, Mg]$_n$[$P_{1-m}$, $V_m$]$_3O_{12}$X: $U^{6+}$; wherein 0≤n≤5, 0≤m≤1, and n≠0 when m=0 and X=F; formula (C4) is [Ba, Sr, Ca, Mg]$_5$[B, Al, Ga, In]$_3O_9$X: $U^{6+}$; and formula (C5) is [Ba, Sr, Ca, Mg]$_3$[Si, Ge]$O_4$X: $U^{6+}$, wherein, X is F, Cl, Br or a combination thereof. Examples include, but are not limited to, $Ca_2BO_3Cl$: $U^{6+}$, $Ca_2PO_4Cl$: $U^{6+}$, $Ca_5(PO_4)_3Cl$: $U^{6+}$, $Ba_5V_3O_{12}Cl$: $U^{6+}$, $Sr_5(BO_3)_3Cl$: $U^{6+}$, or $Sr_3GeO_4F$: $U^{6+}$. In some embodiments, the green-emitting $U^{6+}$-doped phosphor is a $U^{6+}$-doped silicate-germanate phosphor selected from the group consisting of compositions of formulas (D1)-(D11) and a combination thereof. Formula (D1) is [Ba, Sr, Ca, Mg]$_2$[Si, Ge]$O_4$: $U^{6+}$; formula (D2) is [Ba, Sr, Ca, Mg]$_3$[Si, Ge]$O_5$: $U^{6+}$; formula (D3) is [Ba, Sr, Ca, Mg]$_3$[Si, Ge]$_2O_7$: $U^{6+}$; formula (D4) is [Ba, Sr, Ca, Mg][Si, Ge]$O_3$: $U^{6+}$; formula (D5) is [Ba, Sr, Ca, Mg][B, Al, Ga, In]$_2$[Si, Ge]$_2O_8$: $U^{6+}$; formula (D6) is [Ba, Sr, Ca, Mg]$_2$[B, Al, Ga, In]$_2$[Si, Ge]$O_7$: $U^{6+}$; formula (D7) is [Ba, Sr, Ca, Mg]$_3$[B, Al, Ga, In]$_6$[Si, Ge]$_2O_{16}$: $U^{6+}$; formula (D8) is [Ba, Sr, Ca, Mg]$_3$[B, Al, Ga, In]$_2$[Si, Ge]$O_8$: $U^{6+}$; formula (D9) is [Ba, Sr, Ca, Mg]$_{11}$[B, Al, Ga, In]$_2$[Si, Ge]$_4O_{22}$: $U^{6+}$; formula (D10) is [Ba, Sr, Ca, Mg]$_3$[B, Al, Ga, In]$_{10}$[Si, Ge]$O_{20}$: $U^{6+}$; and formula (D11) is [Ba, Sr, Ca, Mg]$_{6.5}$[B, Al, Ga, In]$_{11}$[Si, Ge]$_5O_{33}$: $U^{6+}$. Examples include, but are not limited to, $Ca_2SiO_4$: $U^{6+}$, $Mg_2SiO_4$: $U^{6+}$, $Ca_2GeO_4$: $U^{6+}$, $Sr_2GeO_4$: $U^{6+}$, $Sr_3SiO_5$: $U^{6+}$, $Ca_3SiO_5$: $U^{6+}$, $Ca_3Si_2O_7$: $U^{6+}$, $MgSiO_3$: $U^{6+}$, $BaGeO_3$: $U^{6+}$, $BaAl_2Si_2O_8$: $U^{6+}$, $SrAl_2Si_2O_8$: $U^{6+}$, $CaAl_2Si_2O_8$: $U^{6+}$, $BaGa_2Si_2O_8$: $U^{6+}$, $CaAl_2SiO_7$: $U^{6+}$, $Ba_3B_6Si_2O_{16}$: $U^{6+}$, $Ca_{11}B_2Si_4O_{22}$: $U^{6+}$, $Sr_3Al_{10}SiO_{20}$: $U^{6+}$, or $Ba_{6.5}Al_{11}Si_5O_{33}$: $U^{6+}$. In some embodiments, the green-emitting $U^{6+}$-doped phosphor is $U^{6+}$-doped alkali earth phosphor selected from the group consisting of compositions of formulas (E1)-(E11) and a combination thereof. Formula (E1) is [Ba, Sr, Ca, Mg][B, Al, Ga, In]$_4O_7$: $U^{6+}$; formula (E2) is [Ba, Sr, Ca, Mg]$_3$[B, Al, Ga, In]$_2O_6$: $U^{6+}$; formula (E3) is [Ba, Sr, Ca, Mg][B, Al, Ga, In]$_6O_{10}$: $U^{6+}$; formula (E4) is [Ba, Sr, Ca, Mg][B, Al, Ga, In]$_2O_4$: $U^{6+}$; formula (E5) is [Ba, Sr, Ca, Mg]$_4$[B, Al, Ga, In]$_2O_7$: $U^{6+}$; formula (E6) is [Ba, Sr, Ca, Mg]$_{12}$[B, Al, Ga, In]$_{14}O_{33}$: $U^{6+}$; formula (E7) is A[Ba, Sr, Ca, Mg][B, Al, Ga, In]$O_3$: $U^{6+}$; formula (E8) is [Ba, Sr, Ca, Mg]O: $U^{6+}$; formula (E9) is [Ba, Sr, Ca, Mg]$_2$[B, Al, Ga, In, Sc]$_2O_5$: $U^{6+}$; formula (E10) is A[Ba, Sr, Ca, Mg]$_2$[B, Al, Ga, In]$_5O_{10}$: $U^{6+}$; and formula (E11) is A[Ba, Sr, Ca, Mg]$_4$[B, Al, Ga, In]$_3O_9$: $U^{6+}$; wherein, A is Li, Na, K, Rb, Cs, or a combination thereof. Examples include, but are not limited to, $CaAl_2B_2O_7$: $U^{6+}$, $SrAl_2B_2O_7$: $U^{6+}$, $BaAl_2B_2O_7$: $U^{6+}$, $CaB_4O_7$: $U^{6+}$, $SrB_4O_7$: $U^{6+}$, $SrAl_3BO_7$: $U^{6+}$, $CaAlB_3O_7$: $U^{6+}$, $Ca_3B_2O_6$: $U^{6+}$, $Sr_3B_2O_6$: $U^{6+}$, $Ba_3B_2O_6$: $U^{6+}$, $Sr_3Al_2O_6$: $U^{6+}$, $Ca_3Al_2O_6$: $U^{6+}$, $Ba_2SrAl_2O_6$: $U^{6+}$, $BaSr_2Al_2O_6$: $U^{6+}$, $Ba_2SrB_2O_6$: $U^{6+}$, $BaSr_2B_2O_6$: $U^{6+}$, $Ca_3In_2O_6$: $U^{6+}$, $Sr_3In_2O_6$: $U^{6+}$, $SrB_6O_{10}$: $U^{6+}$, $SrAl_2O_4$: $U^{6+}$, $SrAlBO_4$: $U^{6+}$, $Sr_4Al_2O_7$: $U^{6+}$, $Ca_4Al_2O_7$: $U^{6+}$, $Sr_{10}Ga_6Sc_4O_{25}$: $U^{6+}$, $Ca_{12}Al_{14}O_{33}$: $U^{6+}$, $LiSrBO_3$: $U^{6+}$, $LiCaBO_3$: $U^{6+}$, SrO: $U^{6+}$, $LiBa_2B_5O_{10}$: $U^{6+}$, or $LiSr_4B_3O_9$: $U^{6+}$.

In some embodiments, the device specifically for a backlight apparatus, includes a green-emitting $U^{6+}$-doped phosphor selected from the group consisting of $Sr_3B_2O_6$: $U^{6+}$, $Ca_3B_2O_6$: $U^{6+}$, $Ca_{10}P_6O_{25}$: $U^{6+}$, $Sr_{10}P_6O_{25}$: $U^{6+}$, $Sr_4AlPO_8$: $U^{6+}$, $Ba_4AlPO_8$: $U^{6+}$, $Sr_2SiO_4$: $U^{6+}$, $Ca_2SiO_4$: $U^{6+}$, $Sr_3Al_2O_6$: $U^{6+}$, $Ca_3Al_2O_6$: $U^{6+}$, $Ca_{12}Al_{14}O_{33}$: $U^{6+}$, $Ca_2Al_2SiO_7$: $U^{6+}$, $Ca_2BO_3Cl$: $U^{6+}$, $Ca_2PO_4Cl$: $U^{6+}$, $Ca_5(PO_4)_3Cl$: $U^{6+}$, $Sr_5(BO_3)_3Cl$: $U^{6+}$, $Ca_2GeO_4$: $U^{6+}$, $Sr_2GeO_4$: $U^{6+}$, $Ca_3V_2O_8$: $U^{6+}$, $NaCaPO_4$: $U^{6+}$, $Ca_3In_2O_6$: $U^{6+}$, $LiSrBO_3$: $U^{6+}$, $LiCaBO_3$: $U^{6+}$, $Sr_3Ga_2O_6$: $U^{6+}$ and $LiSr_4B_3O_9$: $U^{6+}$.

Devices of the present disclosure may be used as lighting and backlight apparatuses for general illumination and display applications. Examples include chromatic lamps, plasma screens, xenon excitation lamps, UV excitation marking systems, automotive headlamps, home and theatre projectors, laser pumped devices, point sensors, liquid crystal display (LCD) backlight units, televisions, computer monitors, mobile phones, smartphone, tablet computers and other handheld devices that have a display including an LED source as described herein. The list of these applications is meant to be merely exemplary and not exhaustive.

FIG. 1 show a device 10, according to one embodiment of the present disclosure. The device 10 includes a LED light source 12 and a phosphor material 14 including a green-emitting $U^{6+}$-doped phosphor as described above in the present disclosure. The LED light source 12 may comprise a UV or blue emitting LED. In some embodiments, the LED light source 12 produces blue light in a wavelength range from about 440 nm to about 460 nm. In the device 10, the phosphor material 14 including the green-emitting $U^{6+}$-doped phosphor as described herein, is optically coupled to the LED light source 12. Optically coupled means that radiation from the LED light source 12 is able to excite the phosphor material 14, and the phosphor material 14 is able to emit light in response to the excitation by the radiation. The phosphor material 14 may be disposed on a part of the LED light source 12 or located remotely at a distance from the LED light source 12.

The general discussion of the example LED light source discussed herein is directed toward an inorganic LED based light source. However, as used herein, the term is meant to encompass all LED light sources such as semiconductor laser diodes (LD), organic light emitting diodes (OLED) or a hybrid of LED and LD. Further, it should be understood that the LED light source may be replaced, supplemented or augmented by another radiation source unless otherwise noted and that any reference to semiconductor, semiconductor LED, or LED chip is merely representative of any appropriate radiation source, including, but not limited to, LDs and OLEDs.

In some embodiments, the phosphor material 14 further includes a red emitting phosphor of formula I: $A_xMF_y$:$Mn^{4+}$, where A is Li, Na, K, Rb, Cs, or a combination thereof; M is Si, Ge, Sn, Ti, Zr, Al, Ga, In, Sc, Hf, Y, La, Nb, Ta, Bi, Gd, or a combination thereof; x is an absolute value of a charge of the $MF_y$ ion; and y is 5, 6 or 7. In some embodiments, formula I may be $A_2[MF_6]$:$Mn^{4+}$, where M is Si, Ge, Sn, Ti, Zr, or a combination thereof. The red emitting phosphor of formula is optically coupled to the LED light source. The phosphors of formula I are described in U.S. Pat. Nos. 7,497,973, and 8,906,724, and related patents assigned to the General Electric Company.

Examples of the red emitting phosphors of formula I include $K_2[SiF_6]:Mn^{4+}$, $K_2[TiF_6]:Mn^{4+}$, $K_2[SnF_6]:Mn^{4+}$, $Cs_2[TiF_6]:Mn^{4+}$, $Rb_2[TiF_6]:Mn^{4+}$, $Cs_2[SiF_6]:Mn^{4+}$, $Rb_2[SiF_6]:Mn^{4+}$, $Na_2[TiF_6]:Mn^{4+}$, $Na_2[ZrF_6]:Mn^{4+}$, $K_3[ZrF_7]:Mn^{4+}$, $K_3[BiF_7]:Mn^{4+}$, $K_3[YF_7]:Mn^{4+}$, $K_3[LaF_7]:Mn^{4+}$, $K_3[GdF_7]:Mn^{4+}$, $K_3[NbF_7]:Mn^{4+}$ or $K_3[TaF_7]:Mn^{4+}$. In certain embodiments, the phosphor of formula I is $K_2SiFe:Mn^{4+}$.

The phosphor material 14 may be present in any form such as powder, glass, composite e.g., phosphor-polymer composite or phosphor-glass composite. Further, the phosphor material 14 may be used as a layer, sheet, strip, dispersed particulates, or a combination thereof. In some embodiments, the phosphor material 14 includes the green-emitting $U^{6+}$-doped phosphor in glass form. In some of these embodiments, the device 10 may include the phosphor material 14 in form of a phosphor wheel (not shown in figures). The phosphor wheel may include the green-emitting $U^{6+}$-doped phosphor in glass form. For example, the phosphor wheel may include a $U^{6+}$-doped phosphate-vanadate phosphor such as $SrBPO_5: U^{6+}$ in glass form. A phosphor wheel and related devices are described in a previously filed patent application Serial No. PCT/US17/31654.

In some embodiments, the device 10 may be a backlight unit for display applications. In these embodiments, the phosphor material 14 including the green-emitting $U^{6+}$-doped phosphor, may be present in form of a sheet or strip that is mounted or disposed on a surface of the LED light source 12. A backlight unit and related devices are described in a previously filed patent application Ser. No. 15/370,762.

Figure 2:
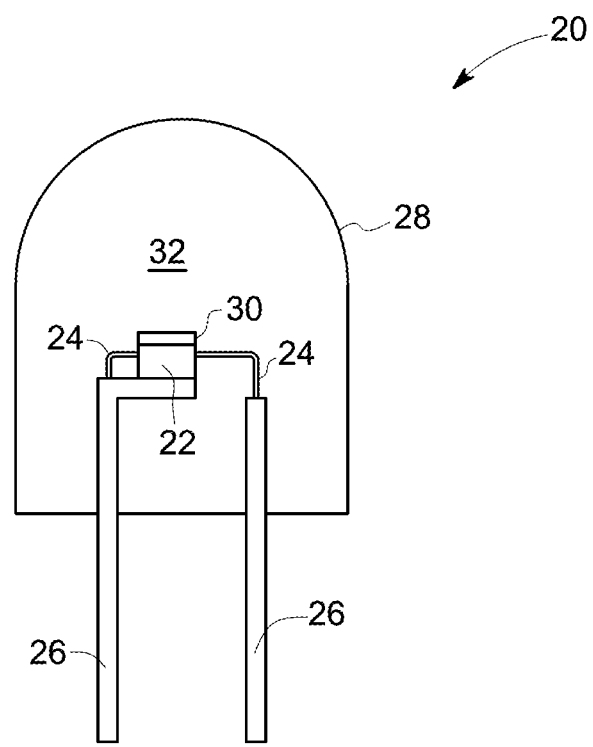
FIG. 2 is a schematic cross-sectional view of a lighting apparatus, in accordance with one embodiment of the disclosure.

FIG. 2 illustrates a lighting apparatus or lamp 20, in accordance with some embodiments. The lighting apparatus 20 includes an LED chip 22, and leads 24 electrically attached to the LED chip 22. The leads 24 may comprise thin wires supported by a thicker lead frame(s) 26 or the leads 24 may comprise self supported electrodes and the lead frame may be omitted. The leads 24 provide current to LED chip 22 and thus cause it to emit radiation.

A layer 30 of a phosphor material including the green-emitting $U^{6+}$-doped phosphor is disposed on a surface 21 of the LED chip 22. The phosphor layer 30 may be disposed by any appropriate method, for example using a slurry prepared by mixing silicone and the phosphor material. In one such method, a silicone slurry in which the phosphor material particles are randomly suspended is placed around the LED chip 12. This method is merely exemplary of possible positions of the phosphor layer 30 and LED chip 22. The phosphor layer 30 may be coated over or directly on the light emitting surface of the LED chip 22 by coating and drying the slurry over the LED chip 22. The light emitted by the LED chip 22 mixes with the light emitted by the phosphor material to produce desired emission.

With continued reference to FIG. 2, the LED chip 22 may be encapsulated within an envelope 28. The envelope 28 may be formed of, for example glass or plastic. The LED chip 22 may be enclosed by an encapsulant material 32. The encapsulant material 32 may be a low temperature glass, or a polymer or resin known in the art, for example, an epoxy, silicone, epoxy-silicone, acrylate or a combination thereof. In an alternative embodiment, the lighting apparatus 20 may only include the encapsulant material 32 without the envelope 28. Both the envelope 28 and the encapsulant material 32 should be transparent to allow light to be transmitted through those elements.

Figure 3:
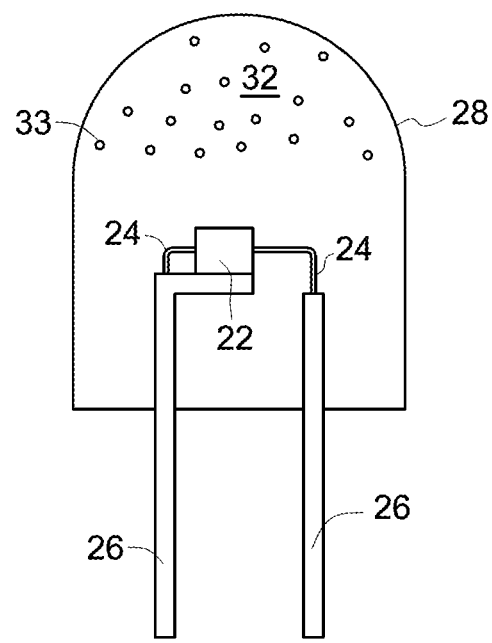
FIG. 3 is a schematic cross-sectional view of a lighting apparatus, in accordance with another embodiment of the disclosure.

In some embodiments as illustrated in FIG. 3, a phosphor material 33 green-emitting $U^{6+}$-doped phosphor is interspersed within the encapsulant material 32, instead of being formed directly on the LED chip 22, as shown in FIG. 2. The phosphor material 33 may be interspersed within a portion of the encapsulant material 32 or throughout the entire volume of the encapsulant material 32. Blue light emitted by the LED chip 22 mixes with the light emitted by phosphor material 33, and the mixed light transmits out from the lighting apparatus 20.

Figure 4:
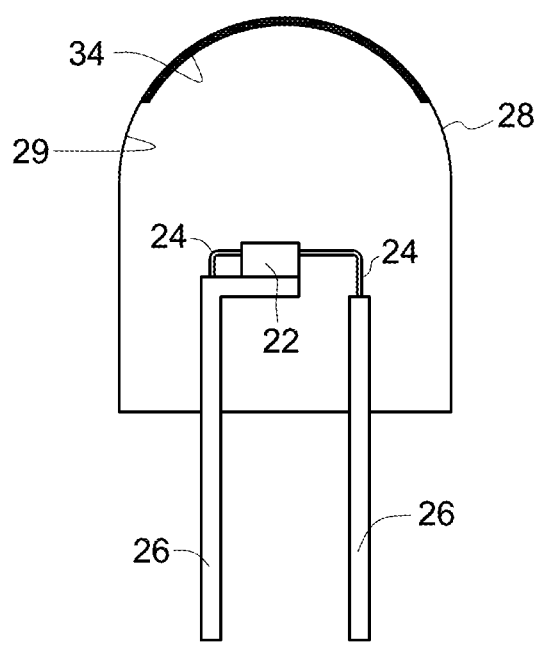
FIG. 4 is a cutaway side perspective view of a lighting apparatus, in accordance with one embodiment of the disclosure.

In yet another embodiment, a layer 34 of the phosphor material including the green-emitting $U^{6+}$-doped phosphor, is coated onto a surface of the envelope 28, instead of being formed over the LED chip 22, as illustrated in FIG. 4. As shown, the phosphor layer 34 is coated on an inside surface 29 of the envelope 28, although the phosphor layer 34 may be coated on an outside surface of the envelope 28, if desired. The phosphor layer 34 may be coated on the entire surface of the envelope 28 or only a top portion of the inside surface 29 of the envelope 28. The UV/blue light emitted by the LED chip 22 mixes with the light emitted by the phosphor layer 34, and the mixed light transmits out. Of course, the phosphor material may be located in any two or all three locations (as shown in FIGS. 2-4) or in any other suitable location, such as separately from the envelope 28 or integrated into the LED chip 22.

In any of the above structures, the lighting apparatus 20 (FIGS. 2-4) may also include a plurality of scattering particles (not shown), which are embedded in the encapsulant material 32. The scattering particles may comprise, for example, alumina, silica, zirconia, or titania. The scattering particles effectively scatter the directional light emitted from the LED chip 22, preferably with a negligible amount of absorption.

Figure 5:
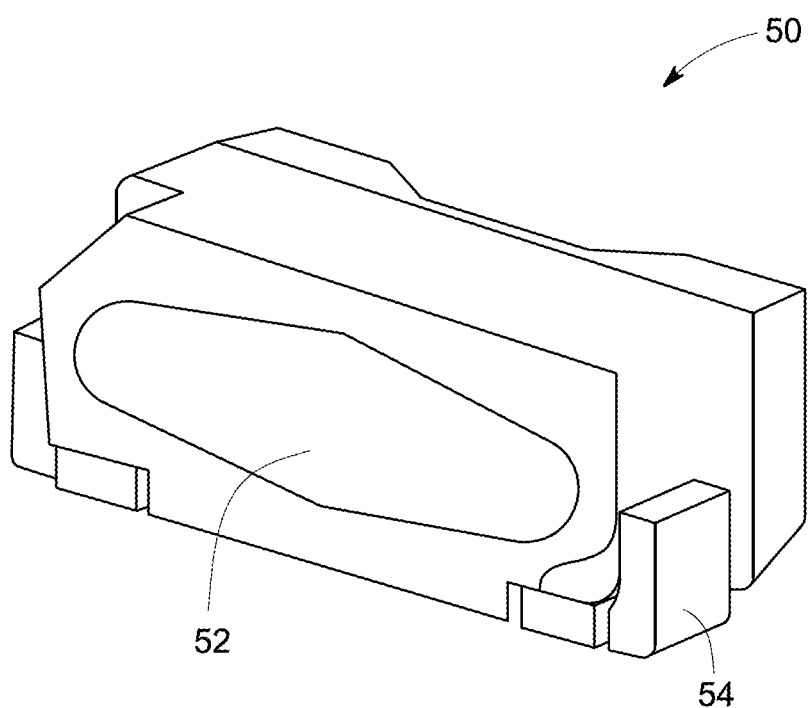
FIG. 5 is a schematic perspective view of a surface-mounted device (SMD), in accordance with one embodiment of the disclosure.

Some embodiments include a surface mounted device (SMD) type light emitting diode 50, e.g. as illustrated in FIG. 5, for backlight applications. This SMD is a "side-emitting type" and has a light-emitting window 52 on a protruding portion of a light guiding member 54. An SMD package may comprise an LED chip as defined above, and a phosphor material including the green-emitting $U^{6+}$-doped phosphor as described herein.

In addition to the green-emitting $U^{6+}$-doped phosphor and, optionally, the red-emitting $Mn^{4+}$ doped phosphor of formula I, the phosphor material may further include one or more other luminescent materials. Additional luminescent materials such as blue, yellow, red, orange, or other color phosphors may be used in the phosphor material to customize the white color of the resulting light and produce specific spectral power distributions.

Suitable additional phosphors for use in the phosphor material include, but are not limited to:

$((Sr_{1-z} (Ca, Ba, Mg, Zn)_z)_{1-(x+w)}(Li, Na, K, Rb)_w Ce_x)_3 (Al_{1-y}Si_y)O_{4+y+3(x-w)}F_{1-y-3(x-w)}$, $0 \le x \le 1.10$, $0 \le y \le 0.5$, $0 \le 0 \le z \le 0.5$, $0 \le w \le x$; $(Ca, Ce)_3 Sc_2 S_3 O_{12}(CaSiG)$; $(Sr,Ca,Ba)_3 Al_{1-x}Si_x O_{4+x}F_{1-x}:Ce^{3+}$ (SASOF)); $(Ba,Sr,Ca)_5(PO_4)_3(Cl,F,Br,OH):Eu^{2+},Mn^{2+}$; $(Ba,Sr,Ca)BPO_5:Eu^{2+},Mn^{2+}$; $(Sr,Ca)_{10}(PO_4)_6*vB_2O_3:Eu^{2+}$ (wherein $0<v\le 1$); $Sr_2Si_3O_8*2SrCl_2:Eu^{2+}$; $(Ca,Sr,Ba)_3MgSi_2O_8:Eu^{2+},Mn^{2+}$; $BaAl_8O_{13}:Eu^{2+}$; $2SrO*0.84P_2O_5*0.16B_2O_3:Eu^{2+}$; $(Ba,Sr,Ca)MgAl_{10}O_{17}:Eu^{2+},Mn^{2+}$; $(Ba,Sr,Ca)Al_2O_4:Eu^{2+}$; $(Y,Gd,Lu,Sc,La)BO_3:Ce^{3+},Tb^{3+}$; $ZnS:Cu^+,Cl^-$; $ZnS:Cu^+,Al^{3+}$; $ZnS:Ag^+,Cl^-$; $ZnS:Ag^+,Al^{3+}$; $(Ba,Sr,Ca)_2Si_{1-n}O_{4-2n}:Eu^{2+}$ (wherein $0 \le n \le 0.2$); $(Ba,Sr,Ca)_2(Mg,Zn)Si_2O_7:Eu^{2+}$; $(Sr,Ca,Ba)(Al,Ga,In)_2S_4:Eu^{2+}$; $(Y,Gd,Tb,La,Sm,Pr,Lu)_3(Al,Ga)_{5-a}O_{12-3/2a}:Ce^{3+}$ (wherein $0 \le a \le 0.5$); $(Ca,Sr)_8(Mg,Zn)(SiO_4)_4Cl_2:Eu^{2+},Mn^{2+}$; $Na_2Gd_2B_2O_7:Ce^{3+},Tb^{3+}$; $(Sr,Ca,Ba,Mg,Zn)_2 P_2O_7:Eu^{2+},Mn^{2+}$; $(Gd,Y,Lu,La)_2O_3:Eu^{3+},Bi^{3+}$; $(Gd,Y,Lu,La)_2O_2S:Eu^{3+},Bi^{3+}$; $(Gd,Y,Lu,La)VO_4:Eu^{3+},Bi^{3+}$; $(Ca,$ Sr)S:$Eu^{2+}$,$Ce^{3+}$; $SrY_2S_4$:$Eu^{2+}$; $CaLa_2S_4$:$Ce^{3+}$; (Ba,Sr,Ca)$MgP_2O_7$:$Eu^{2+}$,$Mn^{2+}$; $(Y,Lu)_2WO_6$:$Eu^{3+}$,$Mo^{6+}$; $(Ba,Sr,Ca)_b$$Si_gN_m$:$Eu^{2+}$ (wherein 2b+4g=3m); $Ca_3(SiO_4)Cl_2$:$Eu^{2+}$; (Lu,Sc,Y,Tb)$_{2-u-v}$$Ce_v$$Ca_{1+u}$$Li_w$$Mg_{2-w}$$P_w$$(Si,Ge)_{3-w}$$O_{12-u/2}$ (where −0.5≤u≤1, 0<v≤0.1, and 0≤w≤0.2); $(Y,Lu,Gd)_{2-m}$(Y,Lu,Gd)$Ca_m$$Si_4N_{6+m}$$C_{1-m}$:$Ce^{3+}$, (wherein 0≤m≤0.5); (Lu,Ca,Li,Mg,Y), alpha-SiAlON doped with $Eu^{2+}$ and/or $Ce^{3+}$; $Sr(LiAl_3N_4)$:$Eu^{2+}$, $(Ca,Sr,Ba)SiO_2N_2$:$Eu^{2+}$,$Ce^{3+}$; beta-SiAlON:$Eu^{2+}$, $3.5MgO*0.5MgF_2*GeO_2$:M $n^{4+}$; $Ca_{1-c-f}Ce_cEu_f$$Al_{1+c}Si_{1-c}N_3$, (where 0≤c≤0.2, 0≤f≤0.2); $Ca_{1-h-r}Ce_hEu_r$$Al_{1-h}(Mg,Zn)_hSiN_3$, (where 0≤h≤0.2, 0≤r≤0.2); $Ca_{1≤2s-t}Ce_s$$(Li,Na)_sEu_tAlSiN_3$, (where 0≤s≤0.2, 0≤t≤0.2, s+t>0); (Sr,Ca)AlSi $N_3$: $Eu^{2+}$,$Ce^{3+}$, and $Li_2CaSiO_4$:$Eu^{2+}$.

The ratio of each of the individual phosphors in the phosphor material may vary depending on the characteristics of the desired light output. The relative proportions of the individual phosphors in the various phosphor materials may be adjusted such that when their emissions are blended and employed in a device, for example a lighting apparatus, there is produced visible light of predetermined x and y values on the CIE chromaticity diagram.

Other additional luminescent materials suitable for use in the phosphor material may include electroluminescent polymers such as polyfluorenes, preferably poly(9,9-dioctyl fluorene) and copolymers thereof, such as poly(9,9'-dioctyl-fluorene-co-bis-N,N'-(4-butylphenyl)diphenylamine) (F8-TFB); poly(vinylcarbazole) and polyphenylenevinylene and their derivatives. In addition, the light emitting layer may include a blue, yellow, orange, green or red phosphorescent dye or metal complex, a quantum dot material, or a combination thereof. Materials suitable for use as the phosphorescent dye include, but are not limited to, tris(1-phenylisoquinoline) iridium (III) (red dye), tris(2-phenylpyridine) iridium (green dye) and Iridium (III) bis(2-(4,6-difluorephenyOpyridinato-N,C2) (blue dye). Commercially available fluorescent and phosphorescent metal complexes from ADS (American Dyes Source, Inc.) may also be used. ADS green dyes include ADS060GE, ADS061GE, ADS063GE, and ADS066GE, ADS078GE, and ADS090GE. ADS blue dyes include ADS064BE, ADS065BE, and ADS070BE. ADS red dyes include ADS067RE, ADS068RE, ADS069RE, ADS075RE, ADS076RE, ADS067RE, and ADS077RE. Exemplary quantum dot materials are based on CdSe, ZnS or InP, including, but not limited to, core/shell luminescent nanocrystals such as CdSe/ZnS, InP/ZnS, PbSe/PbS, CdSe/CdS, CdTe/CdS or CdTe/ZnS. Other examples of the quantum dot materials include perovskite quantum dots such as $CsPbX_3$, where X is Cl, Br, I or a combination thereof.

By use of the embodiments described in the present disclosure, particularly the phosphor materials described herein, devices can be provided producing white light for display applications for example LCD backlight units, having high color gamut and high luminosity. Alternately, by use of the embodiments described in the present disclosure, particularly the phosphor materials described herein, devices can be provided producing white light for general illumination having high luminosity and high CRI values for a wide range of color temperatures of interest (2500 K to 10000 K).

EXAMPLES

Example 1: Preparation of $U^{6+}$-doped $SrBPO_5$

Figure 6:
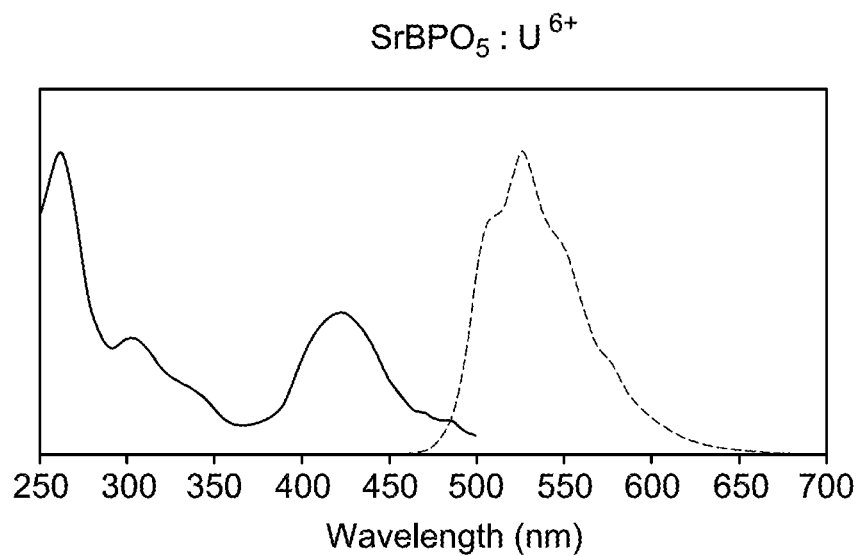
FIG. 6 shows an excitation spectrum and an emission spectrum of a green emitting $U^{6+}$-doped phosphor of formula A1.

A 3-gram sample of 1% $U^{6+}$-doped $SrBPO_5$ was synthesized using 2.0789 g of $SrCO_3$, 0.0384 g of $UO_2$, and 1.5048 g of $BPO_4$. The sample was ball milled for 2 hrs in a Nalgene bottle using yttria stabilized zirconia (YSZ) media. The powder was then transferred to an alumina crucible and fired at 900 degrees Celsius (° C.) in air for 5 hrs. After firing, the powder was again blended for 2 hrs and fired at 1000° C. in air for 5 hrs. FIG. 6 shows excitation spectrum (solid line graph) and emission spectrum (dotted line graph) of $U^{6+}$-doped $SrBPO_5$.

Example 2: Preparation of $U^{6+}$-doped $BaBPO_5$

Figure 7:
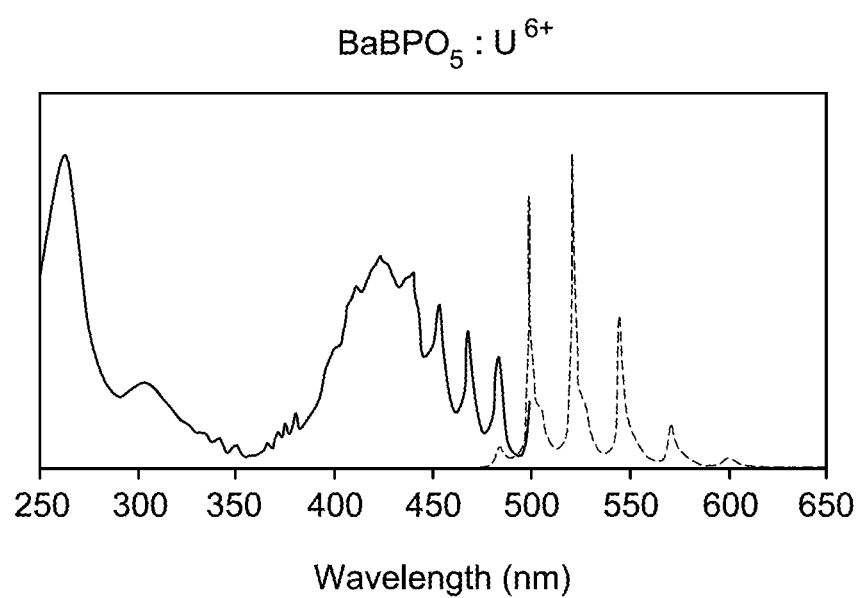
FIG. 7 shows an excitation spectrum and an emission spectrum of a green emitting $U^{6+}$-doped phosphor of formula A1.

A 3-gram sample of 1% $U^{6+}$-doped $BaBPO_5$ was synthesized using 2.2533 g of $SrCO_3$, 0.0311 g of $UO_2$, and 1.2201 g of $BPO_4$. The sample was ball milled for 2 hrs in a Nalgene bottle using YSZ media. The powder was then transferred to an alumina crucible and fired at 900° C. in air for 5 hrs. After firing, the powder was again blended for 2 hrs and fired at 900° C. in air for 5 hrs. FIG. 7 shows excitation spectrum (solid line graph) and emission spectrum (dotted line graph) of $U^{6+}$-doped $BaBPO_5$.

Figure 8:
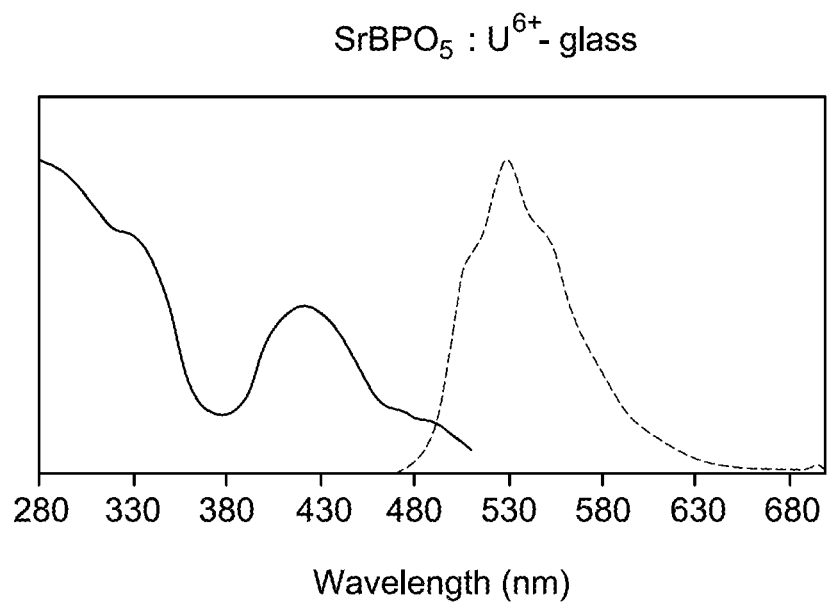
FIG. 8 shows an excitation spectrum and an emission spectrum of a green emitting $U^{6+}$-doped phosphor of formula A1 in glass form.
Figure 9:
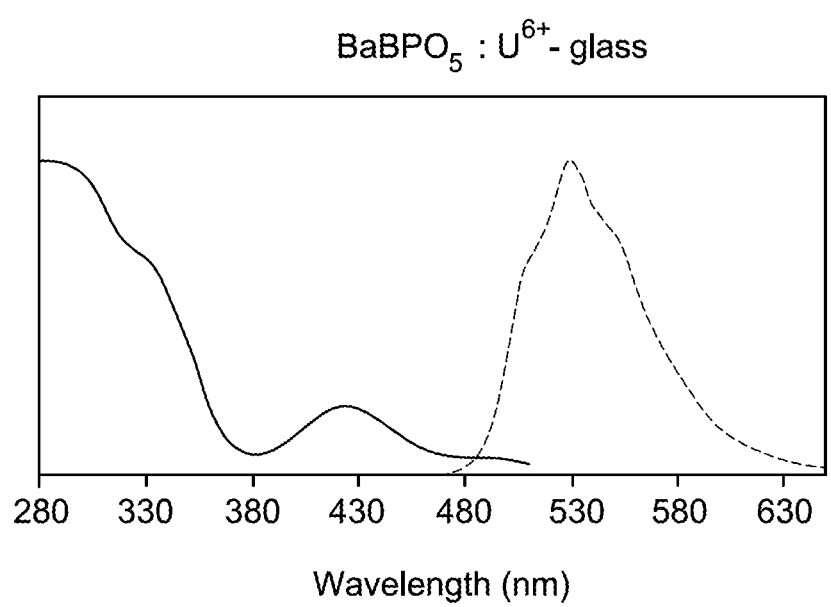
FIG. 9 shows an excitation spectrum and an emission spectrum of a green emitting $U^{6+}$-doped phosphor of formula A1 in glass form.

Example 3: Preparation of $U^{6+}$-doped $SrBPO_5$ and $U^{6+}$-doped $BaBPO_5$ as a Glass Both $SrBPO_5$ and $BaBPO_5$ can form luminescent glasses with $U^{6+}$-doping by taking the above mixtures or the as synthesized powders and firing them at 1200° C. in air until melted. These materials readily form glasses and can just be slow cooled. FIG. 8 shows excitation spectrum (solid line graph) and emission spectrum (dotted line graph) of $U^{6+}$-doped $SrBPO_5$ glass. FIG. 9 shows excitation spectrum (solid line graph) and emission spectrum (dotted line graph) of $U^{6+}$-doped $BaBPO_5$ glass.

Example 4: Preparation of $U^{6+}$-doped $MgAlPO_5$

Figure 10:
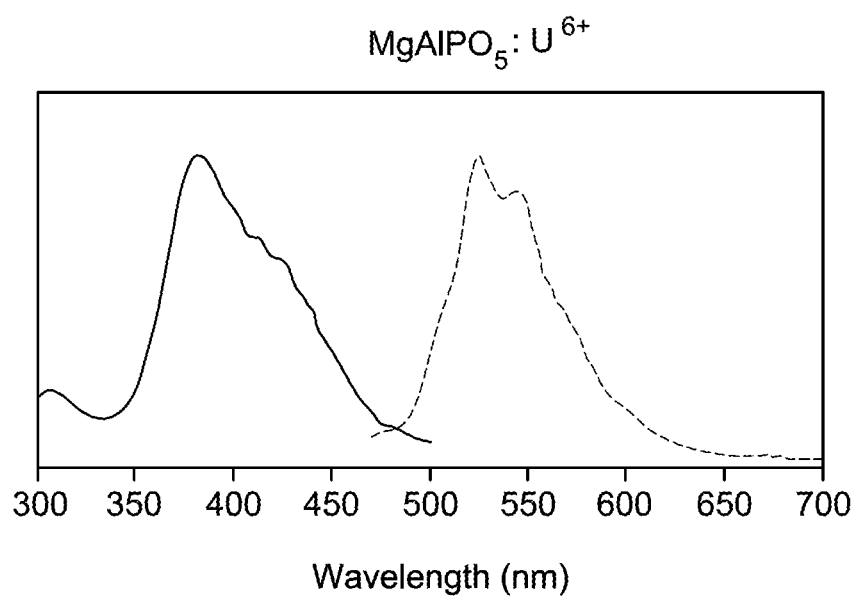
FIG. 10 shows an excitation spectrum and an emission spectrum of a green emitting $U^{6+}$-doped phosphor of formula A1.

A 3-gram sample of 1% $U^{6+}$-doped $MgAlPO_5$ was synthesized using 0.7281 g of MgO, 0.0493 g of $UO_2$, and 2.2254 g of $AlPO_4$. The sample was ball milled for 2 hrs in a Nalgene bottle using YSZ media. The powder was then transferred to an alumina crucible and fired at 1200° C. in air for 5 hrs. After firing the powder was again blended for 2 hrs and fired at 1300° C. in air for 5 hrs. FIG. 10 shows excitation spectrum (solid line graph) and emission spectrum (dotted line graph) of $U^{6+}$-doped $MgAlPO_5$.

Example 5: Preparation of $U^{6+}$-doped $Li_2BaP_2O_7$

Figure 11:
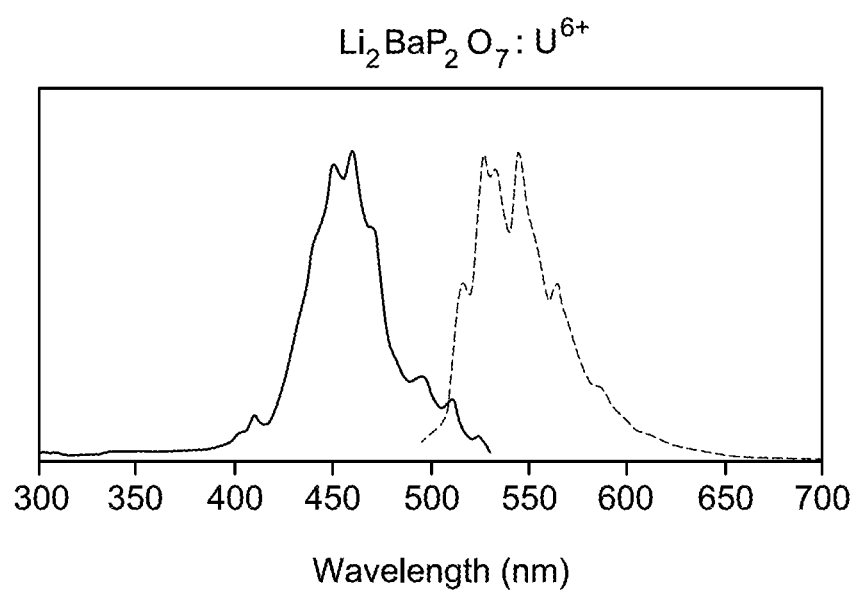
FIG. 11 shows an excitation spectrum and an emission spectrum of a green emitting $U^{6+}$-doped phosphor of formula A8.

A 3-gram sample of 1% $U^{6+}$-doped $Li_2BaP_2O_7$ was synthesized using 0.7100 g of $Li_3PO_4$, 0.0248 g of $UO_2$, 2.1245 g of $BaHPO_4$ and 0.4251 g of DAP. The sample was ball milled for 2 hrs in a Nalgene bottle using YSZ media. The powder was then transferred to an alumina crucible and fired at 500° C. in air for 5 hrs. After firing the powder was again blended for 2 hrs and fired at 600° C. in air for 5 hrs with ball milling in between firing. FIG. 11 shows excitation spectrum (solid line graph) and emission spectrum (dotted line graph) of $U^{6+}$-doped $Li_2BaP_2O_7$.

Example 6: Preparation of $U^{6+}$-doped $Ca_2V_2O_7$

Figure 12:
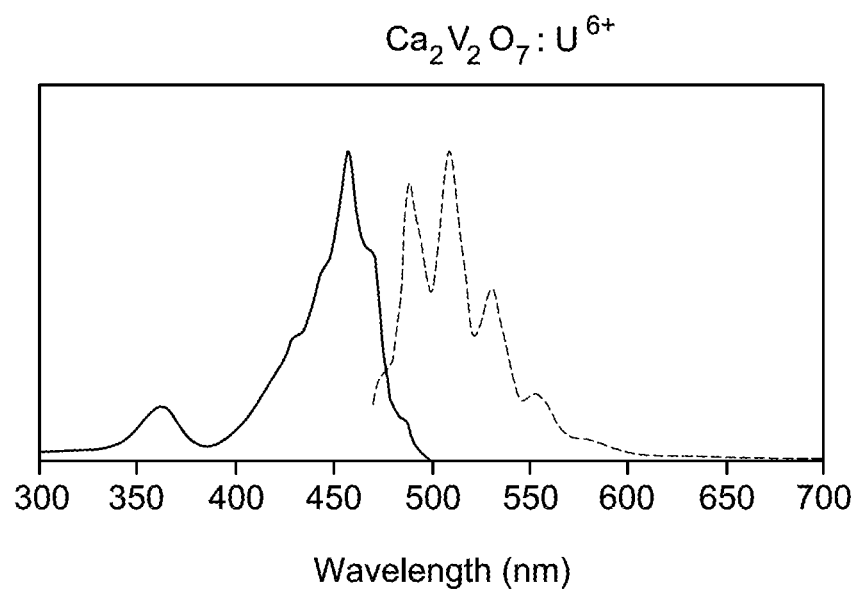
FIG. 12 shows an excitation spectrum and an emission spectrum of a green emitting $U^{6+}$-doped phosphor of formula A2.

A 3-gram sample of 1% $U^{6+}$-doped $Ca_2V_2O_7$ was synthesized using 1.9951 g of $CaCO_3$, 0.0549 g of $UO_2$, and 2.3554 g of $NH_4VO_3$. The sample was ball milled for 2 hrs in a Nalgene bottle using YSZ media. The powder was then transferred to an alumina crucible and fired at 500° C. in air for 5 hrs. Then fired at 600° C. and finally 700° C., for 5 hrs each, with 2 hrs mill times in between firings. FIG. 12 shows excitation spectrum (solid line graph) and emission spectrum (dotted line graph) of $U^{6+}$-doped $Ca_2V_2O_7$.

Example 7: Preparation of $U^{6+}$-doped $Ba_2V_2O_7$

Figure 13:
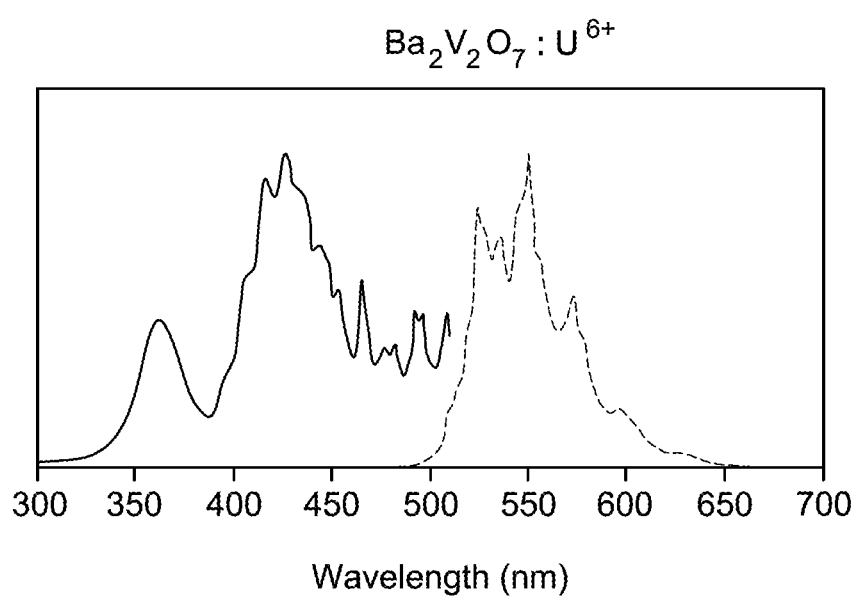
FIG. 13 shows an excitation spectrum and an emission spectrum of a green emitting $U^{6+}$-doped phosphor of formula A2.

A 3-gram sample of 1% $U^{6+}$-doped $Ba_2V_2O_7$ was synthesized using 2.3897 g of $BaCO_3$, 0.0330 g of $UO_2$, and 1.4308 g of $NH_4VO_3$. The sample was ball milled for 2 hrs in a Nalgene bottle using YSZ media. The powder was then transferred to an alumina crucible and fired at 300° C. in air for 5 hrs. Then fired at 600° C. and finally 900° C., for 5 hrs each, with 2 hrs mill times in between firings. FIG. 13 shows excitation spectrum (solid line graph) and emission spectrum (dotted line graph) of $U^{6+}$-doped $Ba_2V_2O_7$.

Example 8: Preparation of $U^{6+}$-doped $CaMgV_2O_7$

Figure 14:
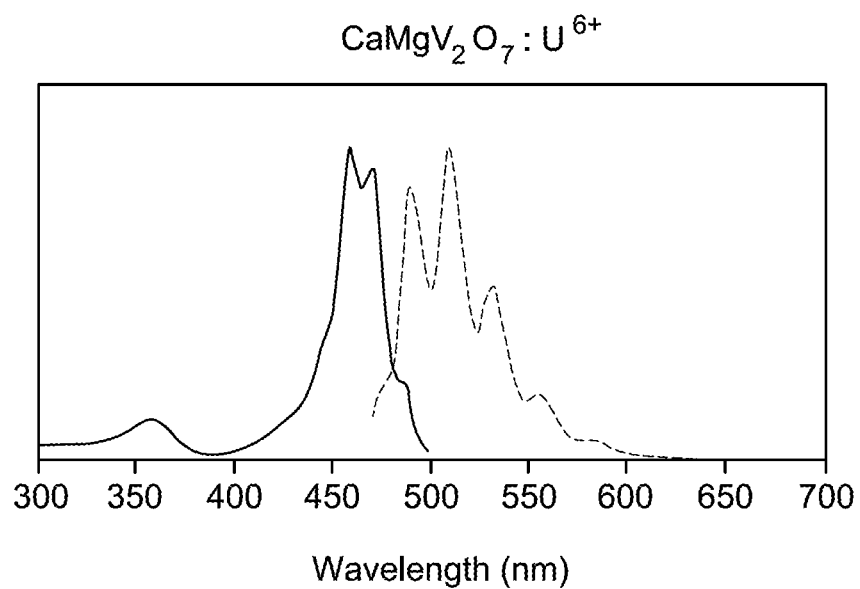
FIG. 14 shows an excitation spectrum and an emission spectrum of a green emitting $U^{6+}$-doped phosphor of formula A2.

A 3-gram sample of 1% $U^{6+}$-doped $CaMgV_2O_7$ was synthesized using 1.0608 g of $CaCO_3$, 0.0289 g of $UO_2$, 0.4314 g of MgO, and 2.5045 g of $NH_4VO_3$. The sample was ball milled for 2 hrs in a Nalgene bottle using YSZ media. The powder was then transferred to an alumina crucible and fired at 500° C. in air for 5 hrs. Then fired at 700° C. and finally 750° C., for 5 hrs each, with 2 hrs mill times in between firings. FIG. 14 shows excitation spectrum (solid line graph) and emission spectrum (dotted line graph) of $U^{6+}$-doped $CaMgV_2O_7$.

Example 9: Preparation of $U^{6+}$-doped $SrMgV_2O_7$

Figure 15:
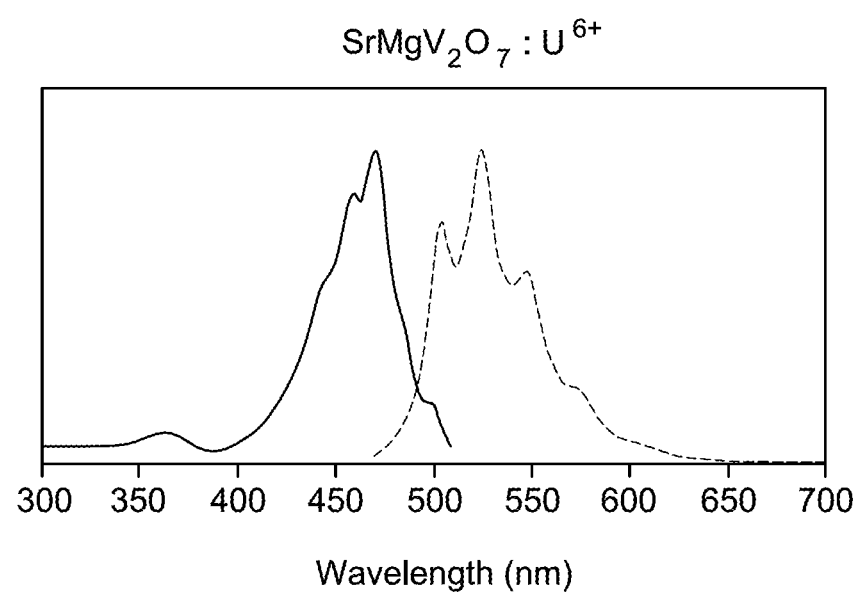
FIG. 15 shows an excitation spectrum and an emission spectrum of a green emitting $U^{6+}$-doped phosphor of formula A2.

A 3-gram sample of 1% $U^{6+}$-doped $SrMgV_2O_7$ was synthesized using 1.3396 g of $SrCO_3$, 0.0248 g of $UO_2$, 0.3694 g of MgO, and 2.1994 g of $NH_4VO_3$. The sample was ball milled for 2 hrs in a Nalgene bottle using YSZ media. The powder was then transferred to an alumina crucible and fired at 500° C. in air for 5 hrs. Then fired at 700° C. for 5 hrs, with 2 hrs mill times in between firings. FIG. 15 shows excitation spectrum (solid line graph) and emission spectrum (dotted line graph) of $U^{6+}$-doped $SrMgV_2O_7$.

Example 10: Preparation of $U^{6+}$-doped $CaF_2$

Figure 16:
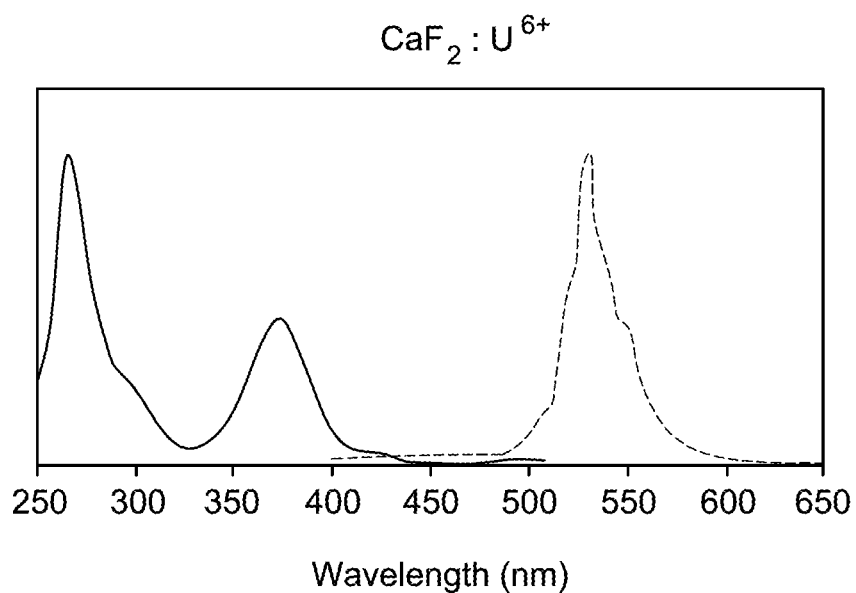
FIG. 16 shows an excitation spectrum and an emission spectrum of a green emitting $U^{6+}$-doped phosphor of formula B1.

A 3-gram sample of 1% $U^{6+}$-doped $CaF_2$ was synthesized using 2.8964 g of $CaF_2$, 0.1012 g of $UO_2$. The sample was ball milled for 2 hrs in a Nalgene bottle using YSZ media. The powder was then transferred to an alumina crucible and fired at 800° C. in air for 5 hrs. FIG. 16 shows excitation spectrum (solid line graph) and emission spectrum (dotted line graph) of $U^{6+}$-doped $CaF_2$.

Example 11: Preparation of $U^{6+}$-doped $BaF_2$

Figure 17:
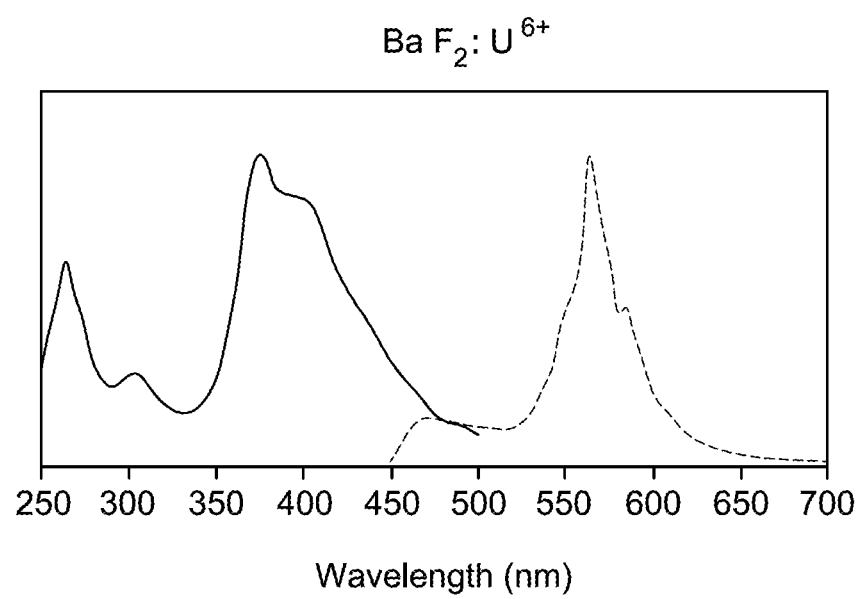
FIG. 17 shows an excitation spectrum and an emission spectrum of a green emitting $U^{6+}$-doped phosphor of formula B1.

A 3-gram sample of 1% $U^{6+}$-doped $BaF_2$ was synthesized using 2.9531 g of $BaF_2$, 0.0459 g of $UO_2$. The sample was ball milled for 2 hrs in a Nalgene bottle using YSZ media. The powder was then transferred to an alumina crucible and fired at 800° C. in air for 5 hrs. After firing the powder was again blended for 2 hrs and fired at 810° C. in air for 5 hrs. FIG. 17 shows excitation spectrum (solid line graph) and emission spectrum (dotted line graph) of $U^{6+}$-doped $BaF_2$.

Example 12: Preparation of $U^{6+}$-doped BaFCl

Figure 18:
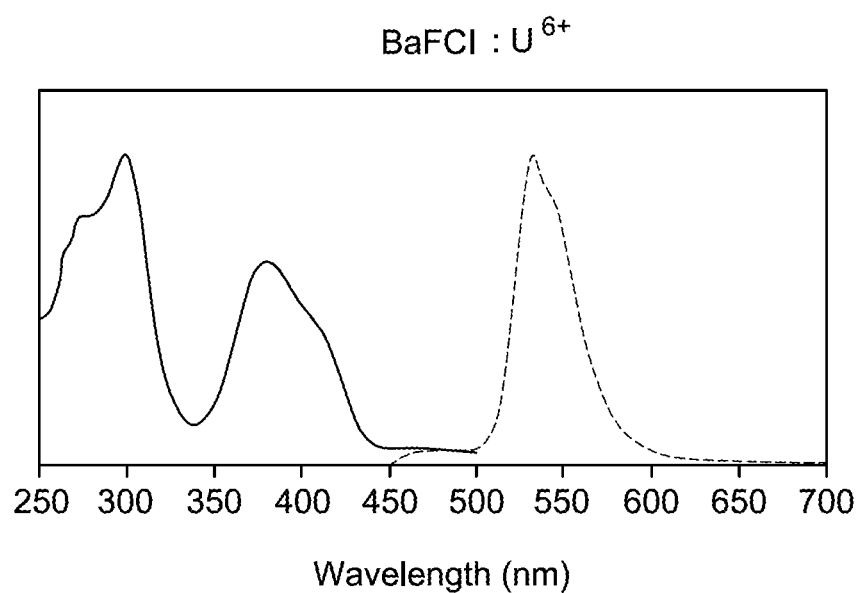
FIG. 18 shows an excitation spectrum and an emission spectrum of a green emitting $U^{6+}$-doped phosphor of formula B1.

A 3-gram sample of 1% $U^{6+}$-doped BaFCl was synthesized using 1.3647 g of $BaF_2$, 0.0420 g of $UO_2$, 0.8759 g of $NH_4Cl$, 1.5048 g of $BaCO_3$. The sample was ball milled for 2 hrs in a Nalgene bottle using YSZ media. The powder was then transferred to an alumina crucible and fired at 800° C. in air for 5 hrs. After firing the powder was again blended for 2 hrs and fired at 810° C. in air for 5 hrs. FIG. 18 shows excitation spectrum (solid line graph) and emission spectrum (dotted line graph) of $U^{6+}$-doped BaFCl.

Example 13: Preparation of $U^{6+}$-doped BaFBr

Figure 19:
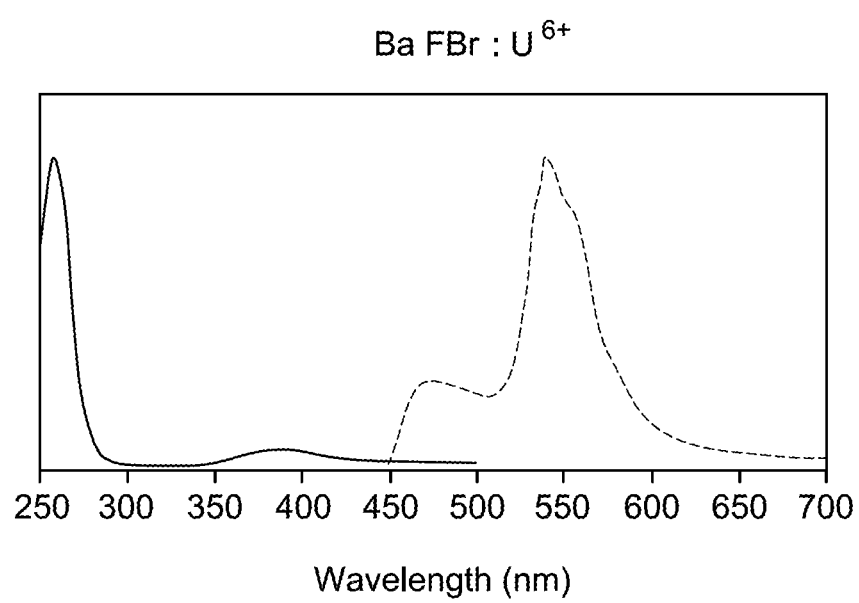
FIG. 19 shows an excitation spectrum and an emission spectrum of a green emitting $U^{6+}$-doped phosphor of formula B1.

A 3-gram sample of 1% $U^{6+}$-doped BaFBr was synthesized using 1.1086 g of $BaF_2$, 0.0341 g of $UO_2$, 1.3004 g of $NH_4Br$, 1.2228 g of $BaCO_3$. The sample was ball milled for 2 hrs in a Nalgene bottle using YSZ media. The powder was then transferred to an alumina crucible and fired at 800° C. in air for 5 hrs. After firing the powder was again blended for 2 hrs and fired at 810° C. in air for 5 hrs. FIG. 19 shows excitation spectrum (solid line graph) and emission spectrum (dotted line graph) of $U^{6+}$-doped BaFBr.

Example 14: Preparation of $U^{6+}$-doped $CaAl_2B_2O_7$

Figure 20:
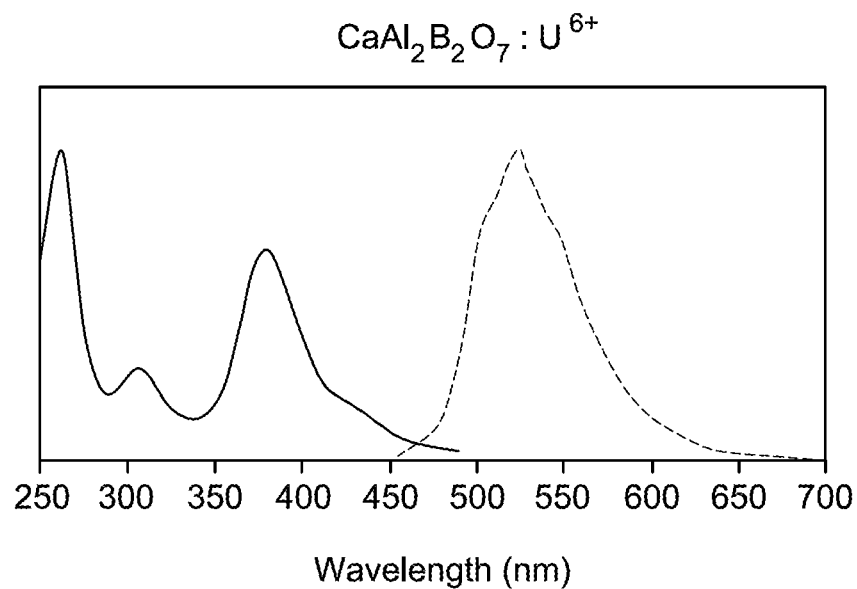
FIG. 20 shows an excitation spectrum and an emission spectrum of a green emitting $U^{6+}$-doped phosphor of formula E1.

A 3-gram sample of 1% $U^{6+}$-doped $CaAl_2B_2O_7$ was synthesized using 1.2945 g of $CaCO_3$, 0.0353 g of $UO_2$, 1.3320 g of $Al_2O_3$, 0.9095 g of $B_2O_3$. The sample was ball milled for 2 hrs in a Nalgene bottle using YSZ media. The powder was then transferred to an alumina crucible and fired at 600° C. in air for 5 hrs. After firing the powder was again blended for 2 hrs and fired at 800° C. in air for 5 hrs. FIG. 20 shows excitation spectrum (solid line graph) and emission spectrum (dotted line graph) of $U^{6+}$-doped $CaAl_2B_2O_7$.

Example 15: Preparation of $U^{6+}$-doped $SrAl_2B_2O_7$

Figure 21:
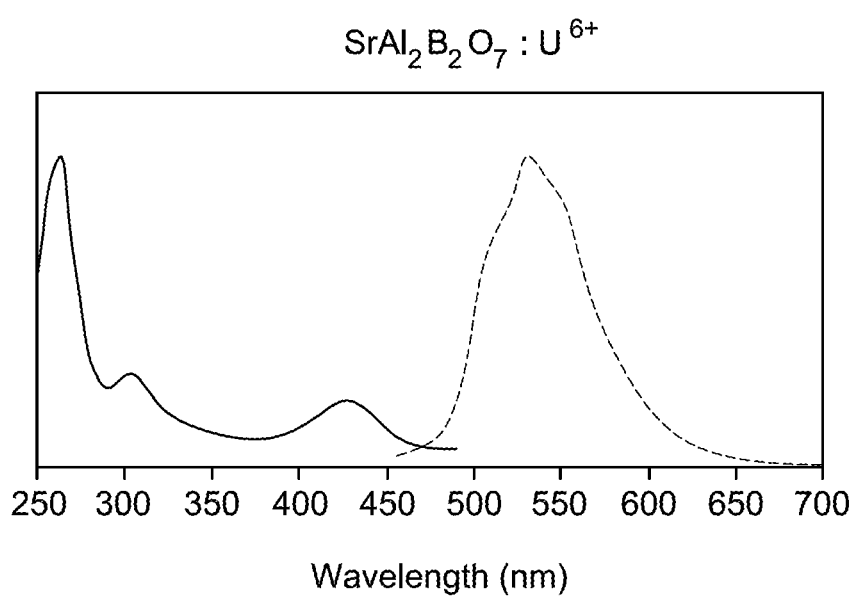
FIG. 21 shows an excitation spectrum and an emission spectrum of a green emitting $U^{6+}$-doped phosphor of formula E1.

A 3-gram sample of 1% $U^{6+}$-doped $SrAl_2B_2O_7$ was synthesized using 1.5846 g of $SrCO_3$, 0.0293 g of $UO_2$, 1.1054 g of $Al_2O_3$, 0.7548 g of $B_2O_3$. The sample was ball milled for 2 hrs in a Nalgene bottle using YSZ media. The powder was then transferred to an alumina crucible and fired at 600° C. in air for 5 hrs. After firing the powder was again blended for 2 hrs and fired at 800° C. in air for 5 hrs. FIG. 21 shows excitation spectrum (solid line graph) and emission spectrum (dotted line graph) of $U^{6+}$-doped $SrAl_2B_2O_7$.

Example 16: Preparation of $U^{6+}$-doped $BaAl_2B_2O_7$

Figure 22:
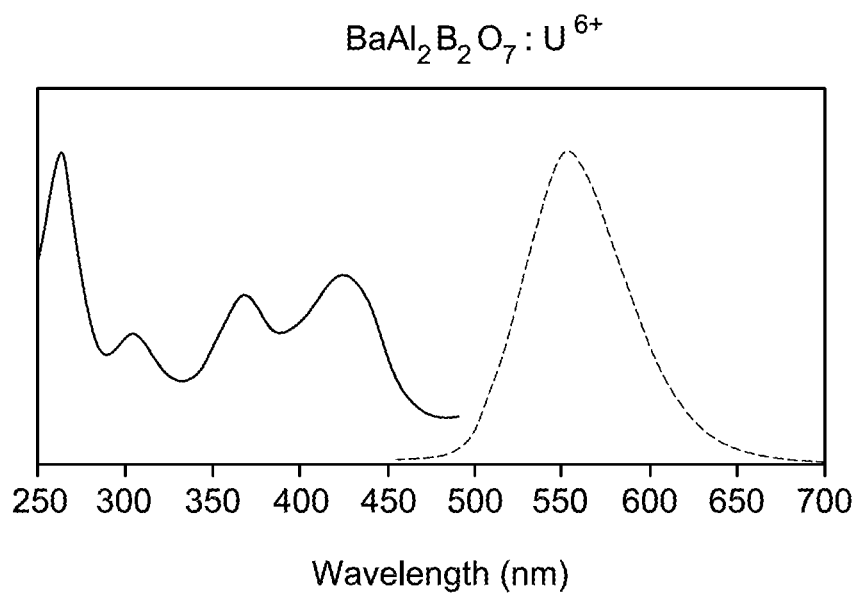
FIG. 22 shows an excitation spectrum and an emission spectrum of a green emitting $U^{6+}$-doped phosphor of formula E1.

A 3-gram sample of 1% $U^{6+}$-doped $BaAl_2B_2O_7$ was synthesized using 1.7984 g of $BaCO_3$, 0.0249 g of $UO_2$, 0.9385 g of $Al_2O_3$, 0.6408 g of $B_2O_3$. The sample was ball milled for 2 hrs in a Nalgene bottle using YSZ media. The powder was then transferred to an alumina crucible and fired at 600° C. in air for 5 hrs. After firing the powder was again blended for 2 hrs and fired at 800° C. in air for 5 hrs. FIG. 22 shows excitation spectrum (solid line graph) and emission spectrum (dotted line graph) of $U^{6+}$-doped $BaAl_2B_2O_7$.

Example 17: Preparation of $U^{6+}$-doped $CaB_4O_7$

Figure 23:
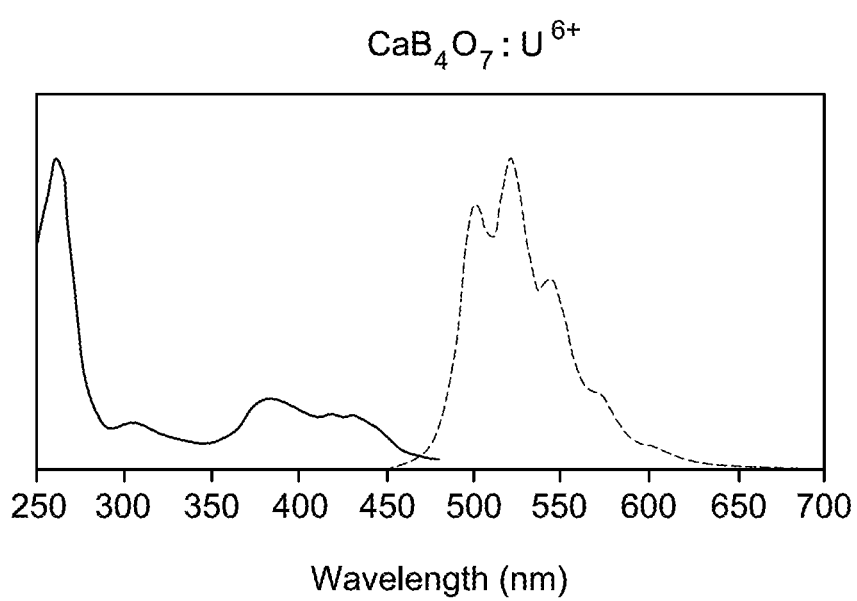
FIG. 23 shows an excitation spectrum and an emission spectrum of a green emitting $U^{6+}$-doped phosphor of formula E1.

A 3-gram sample of 1% $U^{6+}$-doped $CaB_4O_7$ was synthesized using 1.0567 g of $CaCO_3$, 0.0411 g of $UO_2$, 2.1172 g of $B_2O_3$. The sample was ball milled for 2 hrs in a Nalgene bottle using YSZ media. The powder was then transferred to an alumina crucible and fired at 300° C. in air for 5 hrs. After firing the powder was again blended for 2 hrs and fired at 500° C. in air for 5 hrs. Then blended for a third time for 2 hrs and fired at 600° C. for 5 hrs in air. FIG. 23 shows excitation spectrum (solid line graph) and emission spectrum (dotted line graph) of $U^{6+}$-doped $CaB_4O_7$.

Example 18: Preparation of $U^{6+}$-doped $SrB_4O_7$

Figure 24:
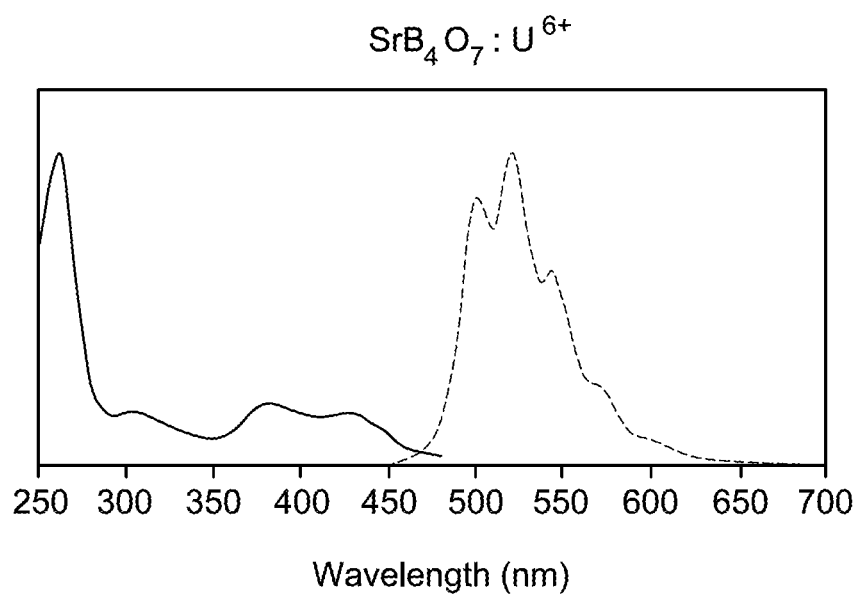
FIG. 24 shows an excitation spectrum and an emission spectrum of a green emitting $U^{6+}$-doped phosphor of formula E1.

A 3-gram sample of 1% $U^{6+}$-doped $SrB_4O_7$ was synthesized using 1.7943 g of $SrCO_3$, 0.0332 g of $UO_2$, 1.7094 g of $B_2O_3$. The sample was ball milled for 2 hrs in a Nalgene bottle using YSZ media. The powder was then transferred to an alumina crucible and fired at 300° C. in air for 5 hrs. After firing the powder was again blended for 2 hrs and fired at 500° C. in air for 5 hrs. Then blended for a third time for 2 hrs and fired at 600° C. for 5 hrs in air. FIG. 24 shows excitation spectrum (solid line graph) and emission spectrum (dotted line graph) of $U^{6+}$-doped $SrB_4O_7$.

Example 19: Preparation of $U^{6+}$-doped $SrAl_3BO_7$

Figure 25:
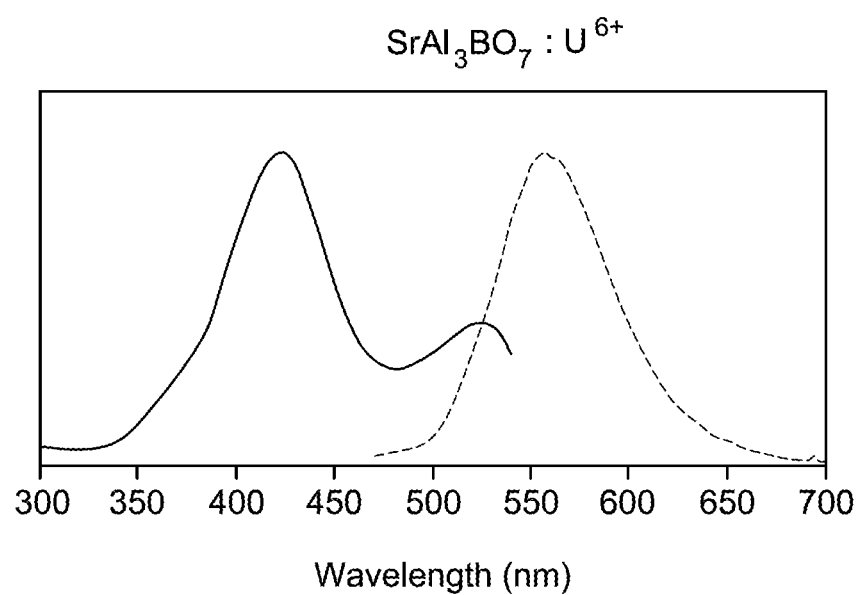
FIG. 25 shows an excitation spectrum and an emission spectrum of a green emitting $U^{6+}$-doped phosphor of formula E1.

A 3-gram sample of 1% $U^{6+}$-doped $SrAl_3BO_7$ was synthesized using 1.4771 g of $SrCO_3$, 0.0276 g of $UO_2$, 1.5606 g of $Al_2O_3$, 0.3566 g of $B_2O_3$. The sample was ball milled for 2 hrs in a Nalgene bottle using YSZ media. The powder was then transferred to an alumina crucible and fired at 300° C. in air for 5 hrs. Then fired at 500° C., 800° C. and finally 1000° C., for 5 hrs each, with 2 hrs mill times in between firings. FIG. 25 shows excitation spectrum (solid line graph) and emission spectrum (dotted line graph) of $U^{6+}$-doped $SrAl_3BO_7$.

Example 20: Preparation of $U^{6+}$-doped $CaAlB_3O_7$

Figure 26:
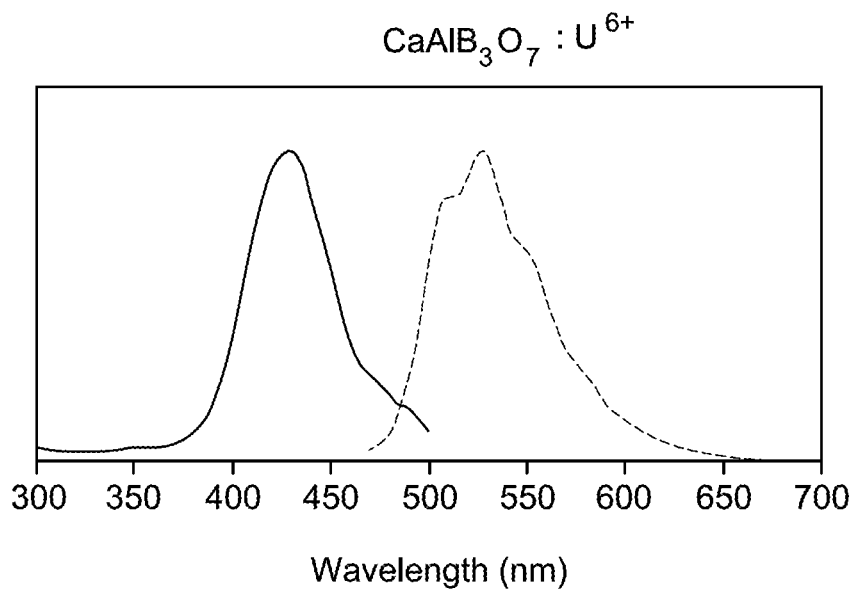
FIG. 26 shows an excitation spectrum and an emission spectrum of a green emitting $U^{6+}$-doped phosphor of formula E1.

A 3-gram sample of 1% $U^{6+}$-doped $CaAlB_3O_7$ was synthesized using 1.3926 g of $CaCO_3$, 0.0379 g of $UO_2$, 0.7165 g of $Al_2O_3$, 1.4676 g of $B_2O_3$. The sample was ball milled for 2 hrs in a Nalgene bottle using YSZ media. The powder was then transferred to an alumina crucible and fired at 300° C. in air for 5 hrs. Then fired at 500° C. and finally 800° C., for 5 hrs each, with 2 hrs mill times in between firings. FIG. 26 shows excitation spectrum (solid line graph) and emission spectrum (dotted line graph) of $U^{6+}$-doped $CaAlB_3O_7$.

Example 21: Preparation of $U^{6+}$-doped $Ca_3B_2O_6$

Figure 27:
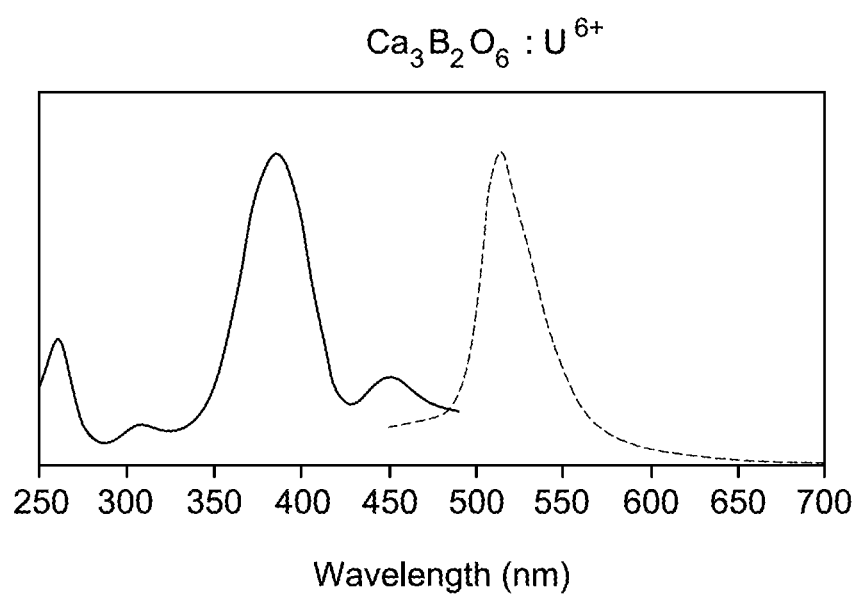
FIG. 27 shows an excitation spectrum and an emission spectrum of a green emitting $U^{6+}$-doped phosphor of formula E2.

A 3-gram sample of 1% $U^{6+}$-doped $Ca_3B_2O_6$ was synthesized using 3.6581 g of $CaCO_3$, 0.0999 g of $UO_2$, and 0.8567 g of $B_2O_3$. The sample was ball milled for 2 hrs in a Nalgene bottle using YSZ media. The powder was then transferred to an alumina crucible and fired at 1100° C. in air for 5 hrs. After firing the powder was again blended for 2 hrs and fired at 1200° C. in air for 5 hrs. FIG. 27 shows excitation spectrum (solid line graph) and emission spectrum (dotted line graph) of $U^{6+}$-doped $Ca_3B_2O_6$.

Example 22: Preparation of $U^{6+}$-doped $Sr_3B_2O_6$

Figure 28:
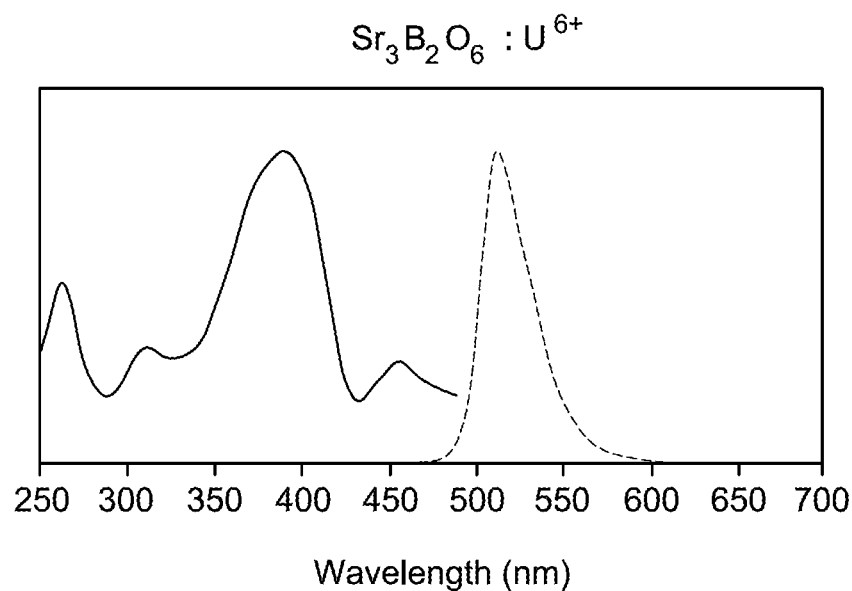
FIG. 28 shows an excitation spectrum and an emission spectrum of a green emitting $U^{6+}$-doped phosphor of formula E2.

A 3-gram sample of 1% $U^{6+}$-doped $Sr_3B_2O_6$ was synthesized using 3.4167 g of $SrCO_3$, 0.0631 g of $UO_2$, and 0.5425 g of $B_2O_3$. The sample was ball milled for 2 hrs in a Nalgene bottle using YSZ media. The powder was then transferred to an alumina crucible and fired at 1100° C. in air for 5 hrs. After firing the powder was again blended for 2 hrs and fired at 1100° C. in air for 5 hrs. FIG. 28 shows excitation spectrum (solid line graph) and emission spectrum (dotted line graph) of $U^{6+}$-doped $Sr_3B_2O_6$.

Example 23: Preparation of $U^{6+}$-doped $Ba_3B_2O_6$

Figure 29:
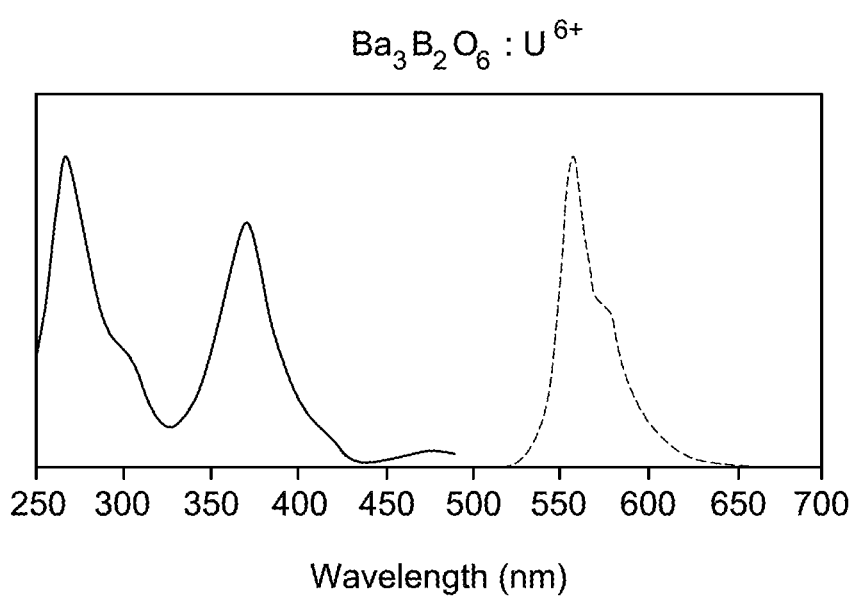
FIG. 29 shows an excitation spectrum and an emission spectrum of a green emitting $U^{6+}$-doped phosphor of formula E2.

A 3-gram sample of 1% $U^{6+}$-doped $Ba_3B_2O_6$ was synthesized using 3.3013 g of $BaCO_3$, 0.0456 g of $UO_2$, and 0.3921 g of $B_2O_3$. The sample was ball milled for 2 hrs in a Nalgene bottle using YSZ media. The powder was then transferred to an alumina crucible and fired at 1100° C. in air for 5 hrs. After firing the powder was again blended for 2 hrs and fired at 1100° C. in air for 5 hrs. FIG. 29 shows excitation spectrum (solid line graph) and emission spectrum (dotted line graph) of $U^{6+}$-doped $Ba_3B_2O_6$.

Example 24: Preparation of $U^{6+}$-doped $Sr_3Al_2O_6$

Figure 30:
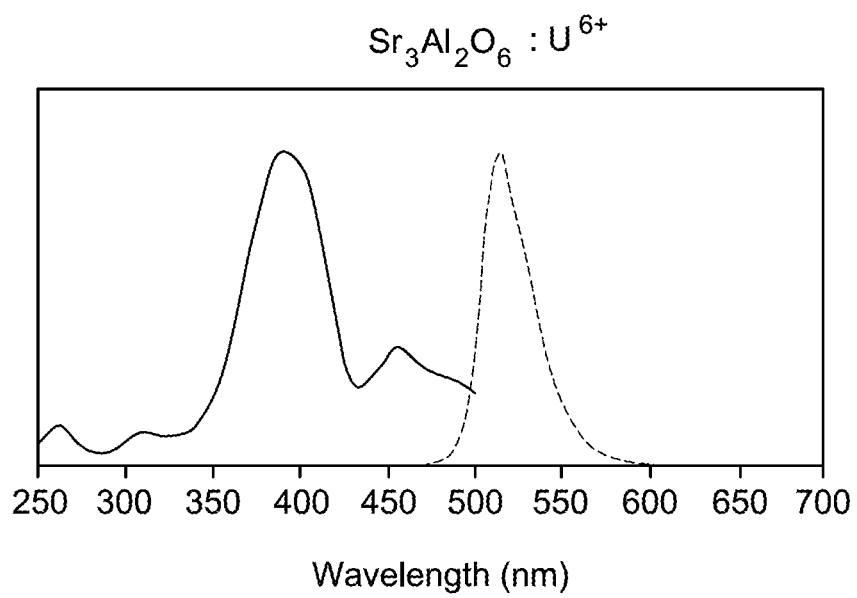
FIG. 30 shows an excitation spectrum and an emission spectrum of a green emitting $U^{6+}$-doped phosphor of formula E2.

A 3-gram sample of 1% $U^{6+}$-doped $Sr_3Al_2O_6$ was synthesized using 3.1519 g of $SrCO_3$, 0.0582 g of $UO_2$, and 0.7329 g of $Al_2O_3$. The sample was ball milled for 2 hrs in a Nalgene bottle using YSZ media. The powder was then transferred to an alumina crucible and fired at 1100° C. in air for 5 hrs. After firing the powder was again blended for 2 hrs and fired at 1100° C. in air for 5 hrs. FIG. 30 shows excitation spectrum (solid line graph) and emission spectrum (dotted line graph) of $U^{6+}$-doped $Sr_3Al_2O_6$.

Example 25: Preparation of $U^{6+}$-doped $Ca_3Al_2O_6$

Figure 31:
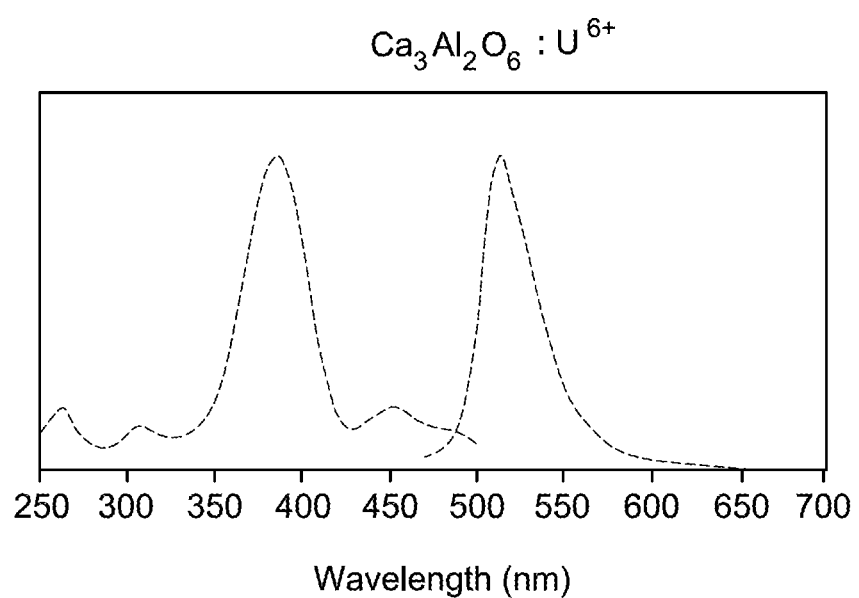
FIG. 31 shows an excitation spectrum and an emission spectrum of a green emitting $U^{6+}$-doped phosphor of formula E2.

A 3-gram sample of 1% $U^{6+}$-doped $Ca_3Al_2O_6$ was synthesized using 3.4283 g of $CaCO_3$, 0.0934 g of $UO_2$, and 1.1759 g of $Al_2O_3$. The sample was ball milled for 2 hrs in a Nalgene bottle using YSZ media. The powder was then transferred to an alumina crucible and fired at 1100° C. in air for 5 hrs. After firing the powder was again blended for 2 hrs and fired at 1200° C. in air for 5 hrs. FIG. 31 shows excitation spectrum (solid line graph) and emission spectrum (dotted line graph) of $U^{6+}$-doped $Ca_3Al_2O_6$.

Example 26: Preparation of $U^{6+}$-doped $Ba_2SrAl_2O_6$

Figure 32:
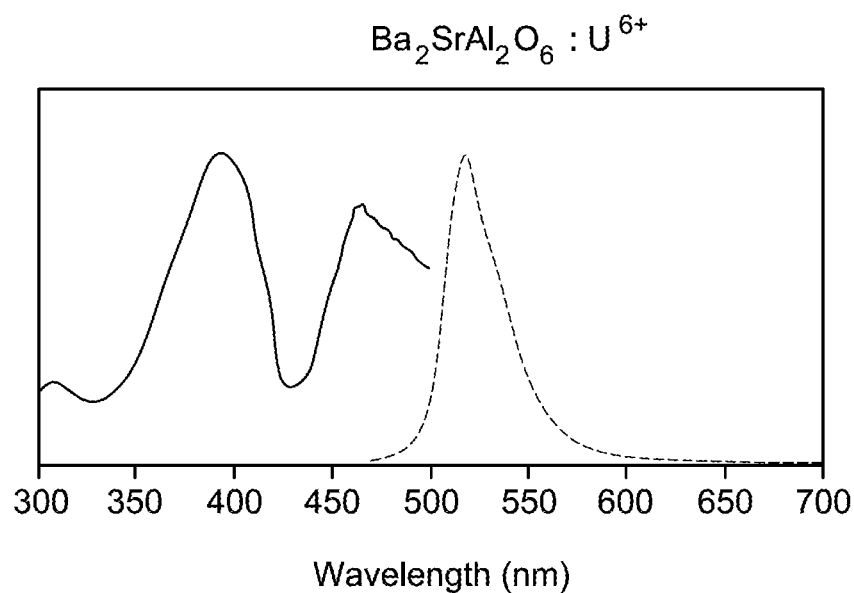
FIG. 32 shows an excitation spectrum and an emission spectrum of a green emitting $U^{6+}$-doped phosphor of formula E2.

A 3-gram sample of 1% $U^{6+}$-doped $Ba_2SrAl_2O_6$ was synthesized using 2.2687 g of $BaCO_3$, 0.8485 g of $SrCO_3$, 0.0470 g of $UO_2$, and 0.5920 g of $Al_2O_3$. The sample was ball milled for 2 hrs in a Nalgene bottle using YSZ media. The powder was then transferred to an alumina crucible and fired at 1100° C. in air for 5 hrs. After firing the powder was again blended for 2 hrs and fired at 1100° C. in air for 5 hrs. FIG. 32 shows excitation spectrum (solid line graph) and emission spectrum (dotted line graph) of $U^{6+}$-doped $Ba_2SrAl_2O_6$.

Example 27: Preparation of $U^{6+}$-doped $BaSr_2Al_2O_6$

Figure 33:
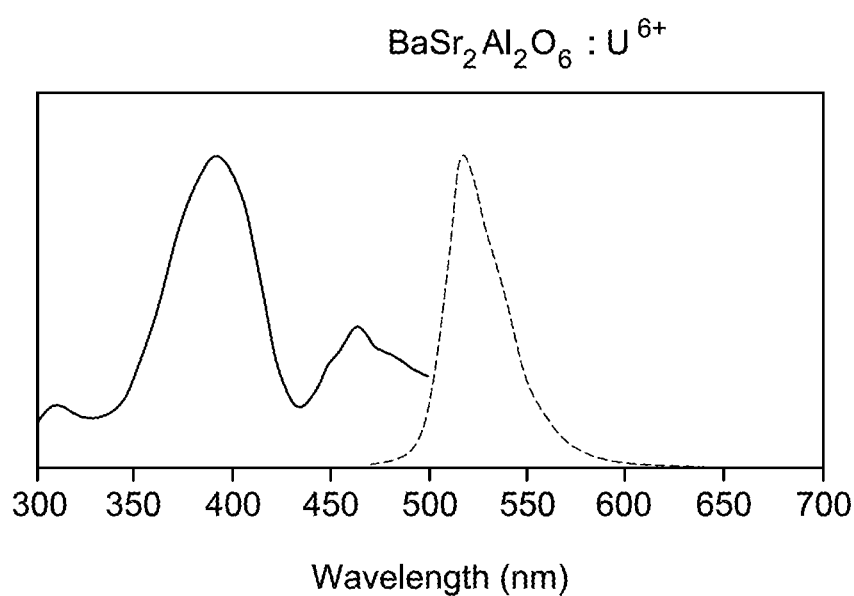
FIG. 33 shows an excitation spectrum and an emission spectrum of a green emitting $U^{6+}$-doped phosphor of formula E2.
Figure 34:
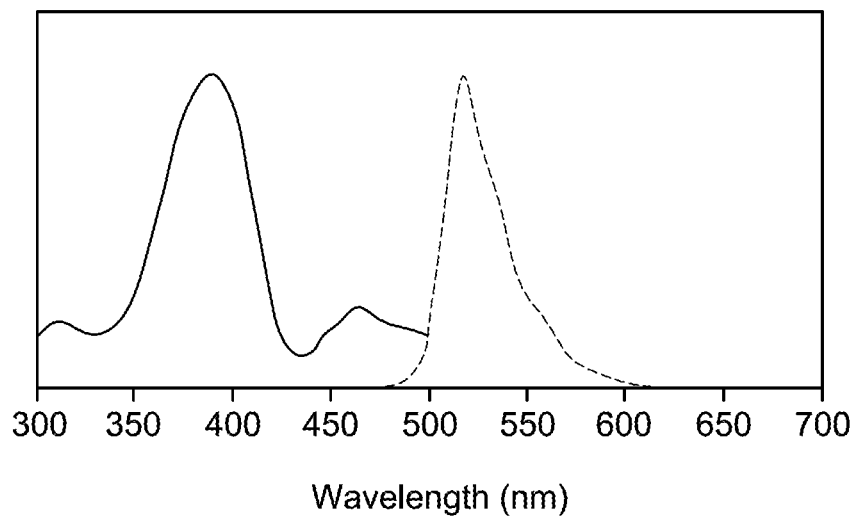
FIG. 34 shows an excitation spectrum and an emission spectrum of a green emitting $U^{6+}$-doped phosphor of formula E2.

A 3-gram sample of 1% $U^{6+}$-doped $BaSr_2Al_2O_6$ was synthesized using 1.2537 g of $BaCO_3$, 1.8758 g of $SrCO_3$, 0.0520 g of $UO_2$, and 0.6543 g of $Al_2O_3$. The sample was ball milled for 2 hrs in a Nalgene bottle using YSZ media. The powder was then transferred to an alumina crucible and fired at 1100° C. in air for 5 hrs. After firing the powder was again blended for 2 hrs and fired at 1100° C. in air for 5 hrs. FIG. 33 shows excitation spectrum (solid line graph) and emission spectrum (dotted line graph) of $U^{6+}$-doped $BaSr_2Al_2O_6$.

Example 28: Preparation of $U^{6+}$-doped $Ba_2SrB_2O_6$

A 3-gram sample of 1% $U^{6+}$-doped $Ba_2SrB_2O_6$ was synthesized using 2.4201 g of $BaCO_3$, 0.9052 g of $SrCO_3$, 0.0502 g of $UO_2$, and 0.4312 g of $B_2O_3$. The sample was ball milled for 2 hrs in a Nalgene bottle using YSZ media. The powder was then transferred to an alumina crucible and fired at 1100° C. in air for 5 hrs. After firing the powder was again blended for 2 hrs and fired at 1100° C. in air for 5 hrs. FIG.

34 shows excitation spectrum (solid line graph) and emission spectrum (dotted line graph) of $U^{6+}$-doped $Ba_2SrB_2O_6$.

Example 29: Preparation of $U^{6+}$-doped $BaSr_2B_2O_6$

Figure 35:
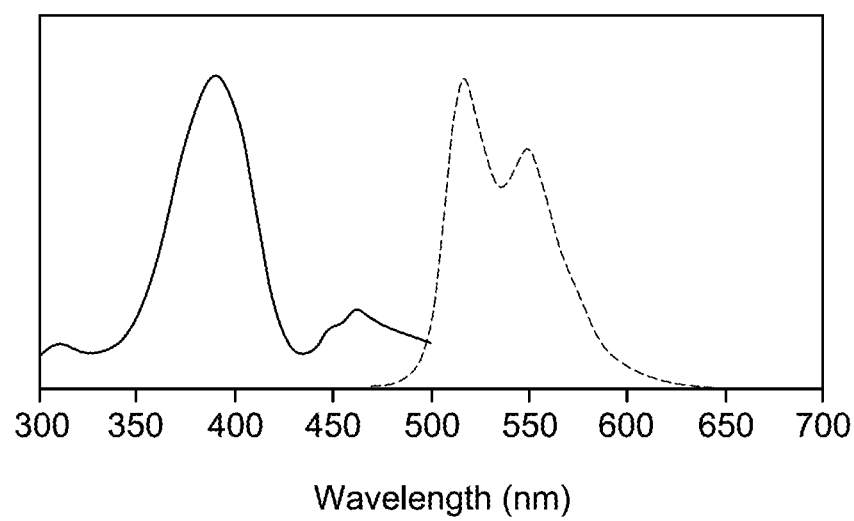
FIG. 35 shows an excitation spectrum and an emission spectrum of a green emitting $U^{6+}$-doped phosphor of formula E2.

A 3-gram sample of 1% $U^{6+}$-doped $BaSr_2B_2O_6$ was synthesized using 1.3469 g of $BaCO_3$, 2.0152 g of $SrCO_3$, 0.0558 g of $UO_2$, and 0.4800 g of $B_2O_3$. The sample was ball milled for 2 hrs in a Nalgene bottle using YSZ media. The powder was then transferred to an alumina crucible and fired at 1100° C. in air for 5 hrs. After firing the powder was again blended for 2 hrs and fired at 1100° C. in air for 5 hrs. FIG. 35 shows excitation spectrum (solid line graph) and emission spectrum (dotted line graph) of $U^{6+}$-doped $BaSr_2B_2O_6$.

Example 30: Preparation of $U^{6+}$-doped $Ca_3In_2O_6$

Figure 36:
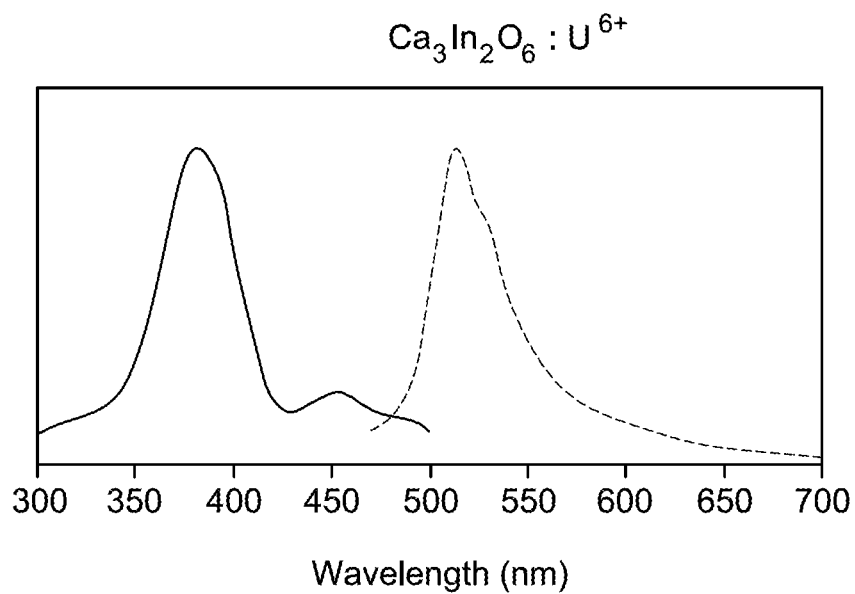
FIG. 36 shows an excitation spectrum and an emission spectrum of a green emitting $U^{6+}$-doped phosphor of formula E2.

A 3-gram sample of 1% $U^{6+}$-doped $Ca_3In_2O_6$ was synthesized using 1.9738 g of $CaCO_3$, 0.0538 g of $UO_2$, and 1.8435 g of $In_2O_3$. The sample was ball milled for 2 hrs in a Nalgene bottle using YSZ media. The powder was then transferred to an alumina crucible and fired at 1100° C. in air for 5 hrs. After firing the powder was again blended for 2 hrs and fired at 1100° C. in air for 5 hrs. FIG. 36 shows excitation spectrum (solid line graph) and emission spectrum (dotted line graph) of $U^{6+}$-doped $Ca_3In_2O_6$.

Example 31: Preparation of $U^{6+}$-doped $Sr_3In_2O_6$

Figure 37:
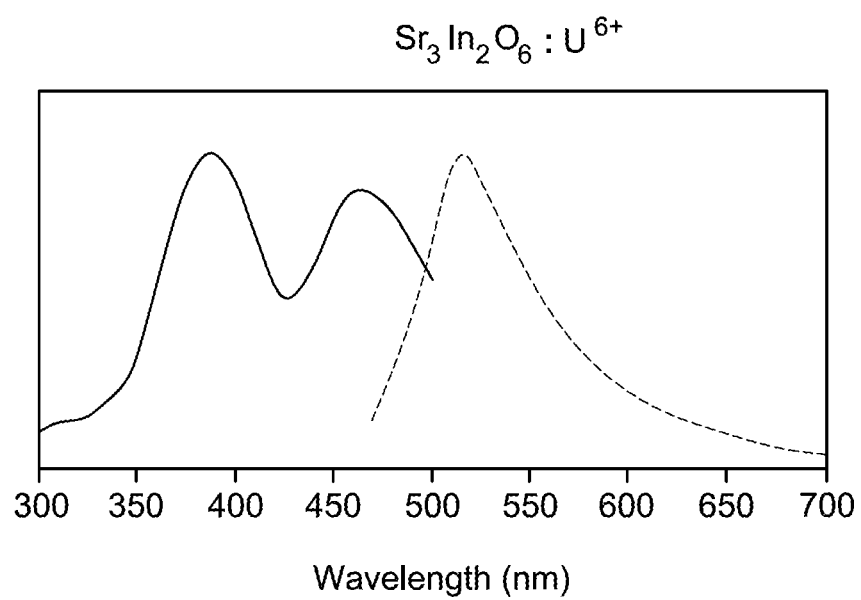
FIG. 37 shows an excitation spectrum and an emission spectrum of a green emitting $U^{6+}$-doped phosphor of formula E2.

A 3-gram sample of 1% $U^{6+}$-doped $Sr_3In_2O_6$ was synthesized using 2.2182 g of $SrCO_3$, 0.0410 g of $UO_2$, and 1.4046 g of $In_2O_3$. The sample was ball milled for 2 hrs in a Nalgene bottle using YSZ media. The powder was then transferred to an alumina crucible and fired at 1100° C. in air for 5 hrs. After firing the powder was again blended for 2 hrs and fired at 1100° C. in air for 5 hrs. FIG. 37 shows excitation spectrum (solid line graph) and emission spectrum (dotted line graph) of $U^{6+}$-doped $Sr_3In_2O_6$.

Example 32: Preparation of $U^{6+}$-doped $SrB_6O_{10}$

Figure 38:
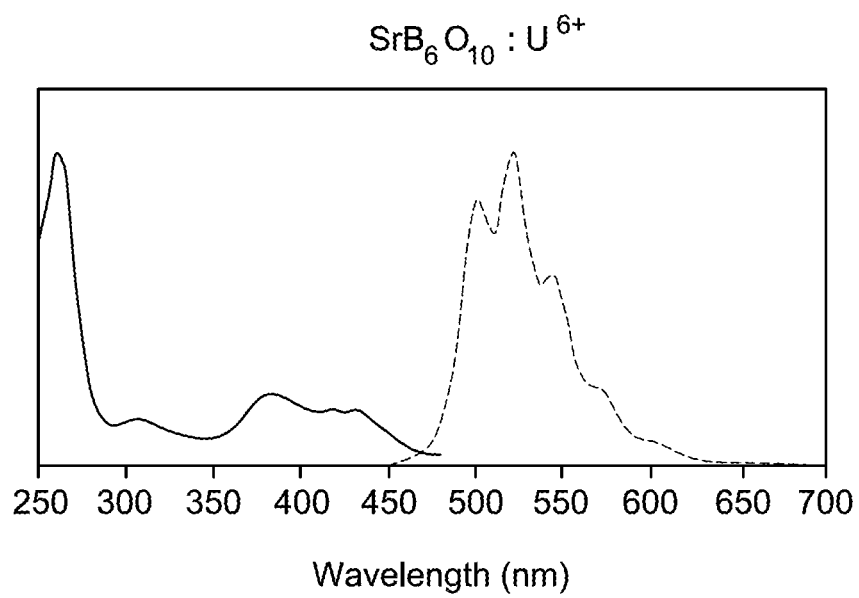
FIG. 38 shows an excitation spectrum and an emission spectrum of a green emitting $U^{6+}$-doped phosphor of formula E3.

A 3-gram sample of 1% $U^{6+}$-doped $SrB_6O_{10}$ was synthesized using 1.3964 g of $SrCO_3$, 0.0258 g of $UO_2$, and 1.9956 g of $B_2O_3$. The sample was ball milled for 2 hrs in a Nalgene bottle using YSZ media. The powder was then transferred to an alumina crucible and fired at 300° C. in air for 5 hrs. After firing the powder was again blended for 2 hrs and fired at 500° C. in air for 5 hrs. Then blended for a third time for 2 hrs and fired at 600° C. for 5 hrs in air. FIG. 38 shows excitation spectrum (solid line graph) and emission spectrum (dotted line graph) of $U^{6+}$-doped $SrB_6O_{10}$.

Example 33: Preparation of $U^{6+}$-doped $Sr_4P_2O_9$

Figure 39:
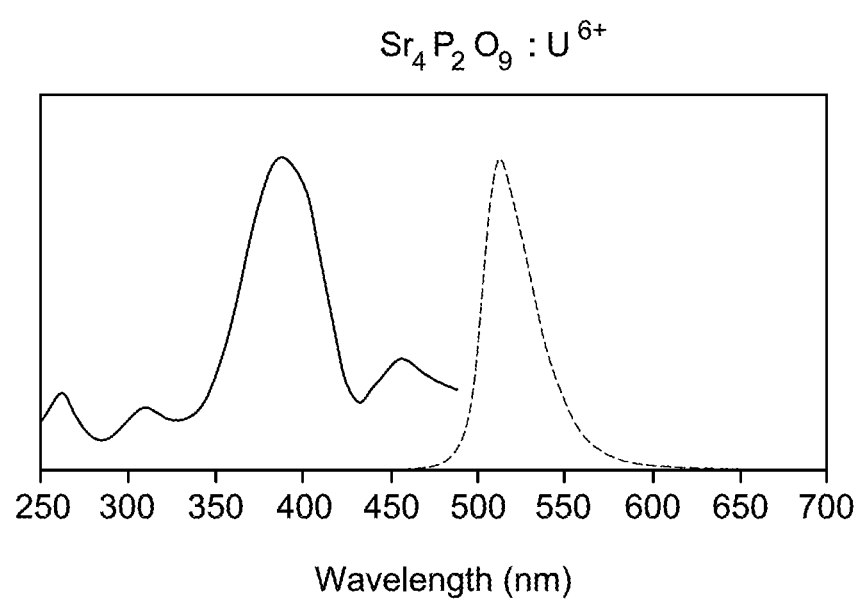
FIG. 39 shows an excitation spectrum and an emission spectrum of a green emitting $U^{6+}$-doped phosphor of formula A3.

A 3-gram sample of 1% $U^{6+}$-doped $Sr_4P_2O_9$ was synthesized using 1.9586 g of $SrHPO_4$, 0.0576 g of $UO_2$, and 1.5434 g of $SrCO_3$. The sample was ball milled for 2 hrs in a Nalgene bottle using YSZ media. The powder was then transferred to an alumina crucible and fired at 1100° C. in air for 5 hrs. After firing the powder was again blended for 2 hrs and fired at 1100° C. in air for 5 hrs. FIG. 39 shows excitation spectrum (solid line graph) and emission spectrum (dotted line graph) of $U^{6+}$-doped $Sr_4P_2O_9$.

Example 34: Preparation of $U^{6+}$-doped $Ca_4P_2O_9$

Figure 40:
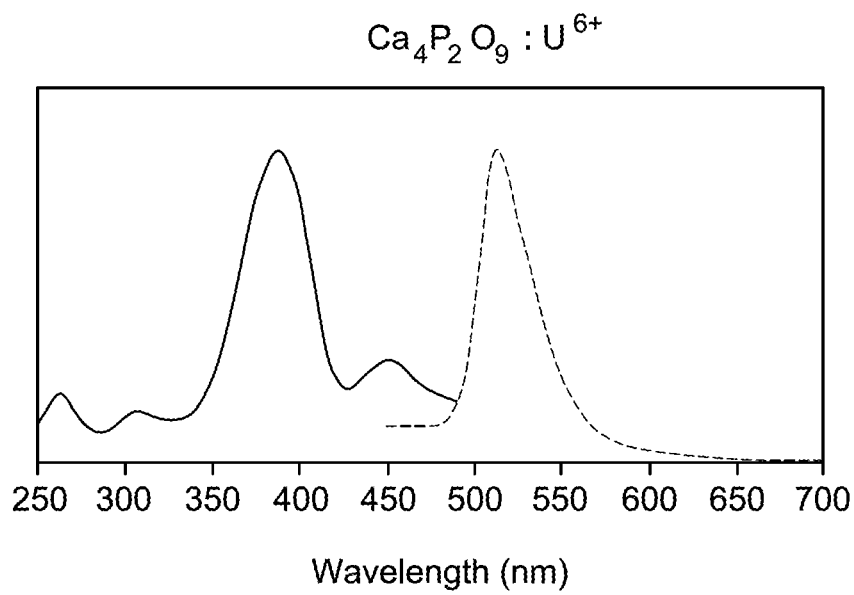
FIG. 40 shows an excitation spectrum and an emission spectrum of a green emitting $U^{6+}$-doped phosphor of formula A3.

A 3-gram sample of 1% $U^{6+}$-doped $Ca_4P_2O_9$ was synthesized using 2.1818 g of $CaHPO_4$, 0.0866 g of $UO_2$, and 1.5729 g of $CaCO_3$. The sample was ball milled for 2 hrs in a Nalgene bottle using YSZ media. The powder was then transferred to an alumina crucible and fired at 1100° C. in air for 5 hrs. After firing the powder was again blended for 2 hrs and fired at 1200° C. in air for 5 hrs. FIG. 40 shows excitation spectrum (solid line graph) and emission spectrum (dotted line graph) of $U^{6+}$-doped $Ca_4P_2O_9$.

Example 35: Preparation of $U^{6+}$-doped $Ba_3P_4O_{13}$

Figure 41:
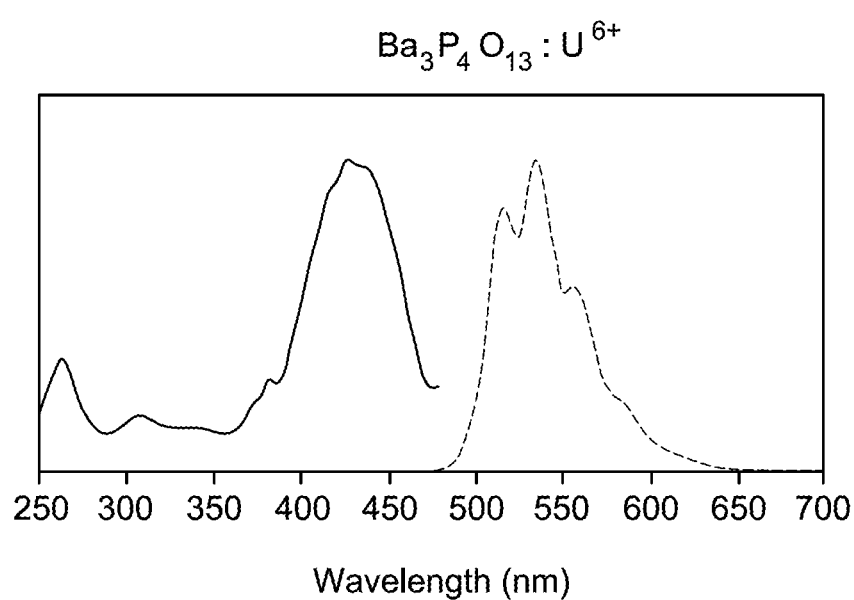
FIG. 41 shows an excitation spectrum and an emission spectrum of a green emitting $U^{6+}$-doped phosphor of formula A4.

A 3-gram sample of 1% $U^{6+}$-doped $Ba_3P_4O_{13}$ was synthesized using 2.7832 g of $BaHPO_4$, 0.0325 g of $UO_2$, and 0.5463 g of DAP. The sample was ball milled for 2 hrs in a Nalgene bottle using YSZ media. The powder was then transferred to an alumina crucible and fired at 150° C. in air for 5 hrs. Then fired at 300° C., 500° C., 700° C. and finally 800° C., for 5 hrs each, with 2 hrs mill times in between firings. FIG. 41 shows excitation spectrum (solid line graph) and emission spectrum (dotted line graph) of $U^{6+}$-doped $Ba_3P_4O_{13}$.

Example 36: Preparation of $U^{6+}$-doped $Sr_3P_4O_{13}$

Figure 42:
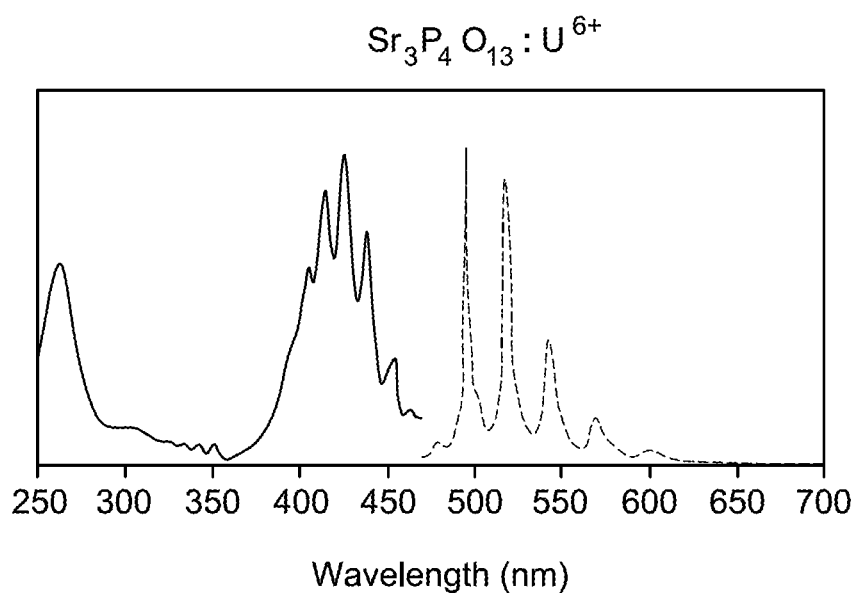
FIG. 42 shows an excitation spectrum and an emission spectrum of a green emitting $U^{6+}$-doped phosphor of formula A4.

A 3-gram sample of 1% $U^{6+}$-doped $Sr_3P_4O_{13}$ was synthesized using 2.7298 g of $SrHPO_4$, 0.0406 g of $UO_2$, and 0.6809 g of DAP. The sample was ball milled for 2 hrs in a Nalgene bottle using YSZ media. The powder was then transferred to an alumina crucible and fired at 150° C. in air for 5 hrs. Then fired at 300° C., 500° C., 700° C. and finally 875° C., for 5 hrs each, with 2 hrs mill times in between firings. FIG. 42 shows excitation spectrum (solid line graph) and emission spectrum (dotted line graph) of $U^{6+}$-doped $Sr_3P_4O_{13}$.

Example 37: Preparation of $U^{6+}$-doped $LiBaF_3$

Figure 43:
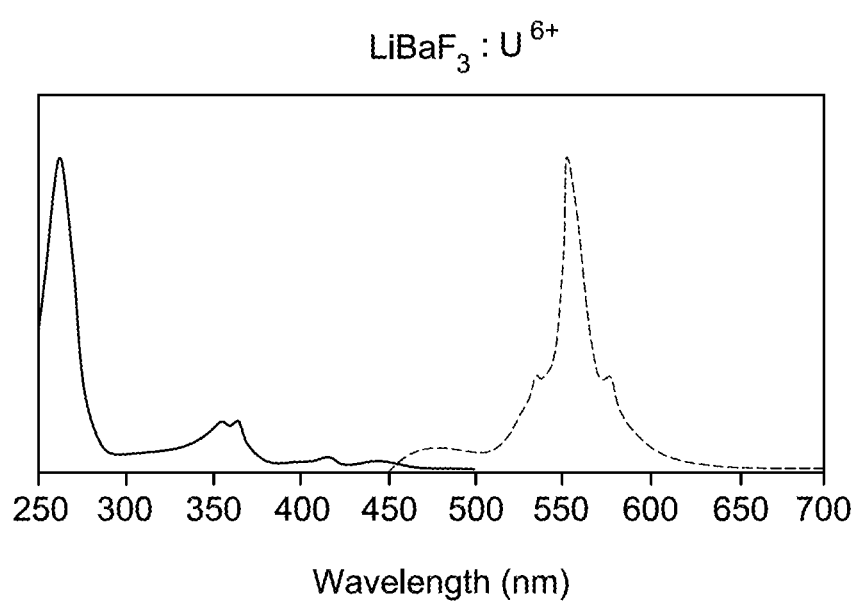
FIG. 43 shows an excitation spectrum and an emission spectrum of a green emitting $U^{6+}$-doped phosphor of formula B2.

A 3-gram sample of 1% $U^{6+}$-doped $LiBaF_3$ was synthesized using 2.5744 g of $BaF_2$, 0.0400 g of $UO_2$ and 0.3847 g of LiF. The sample was ball milled for 2 hrs in a Nalgene bottle using YSZ media. The powder was then transferred to an alumina crucible and fired at 800° C. in air for 5 hrs. After firing the powder was again blended for 2 hrs and fired at 810° C. in air for 5 hrs. FIG. 43 shows excitation spectrum (solid line graph) and emission spectrum (dotted line graph) of $U^{6+}$-doped $LiBaF_3$.

Example 38: Preparation of $U^{6+}$-doped $BaMgF_4$

Figure 44:
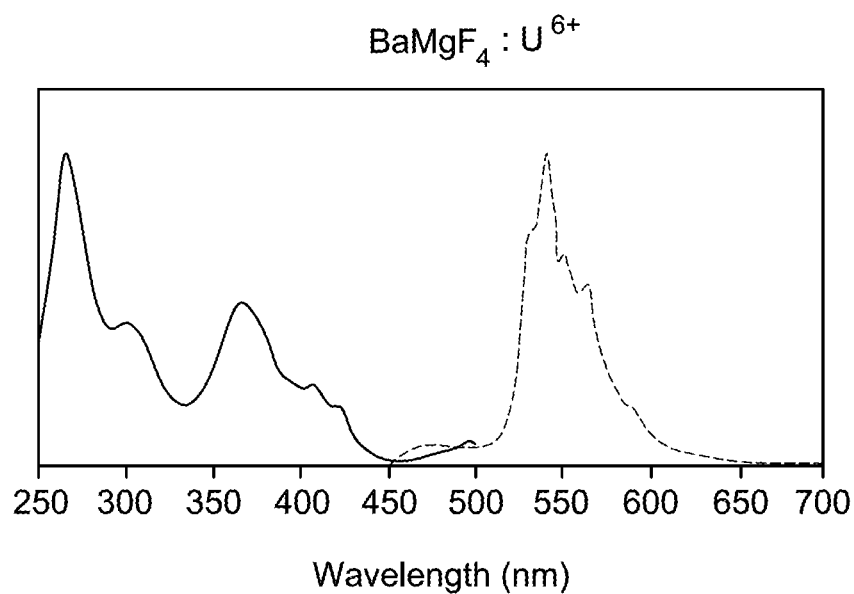
FIG. 44 shows an excitation spectrum and an emission spectrum of a green emitting $U^{6+}$-doped phosphor of formula B3.

A 3-gram sample of 1% $U^{6+}$-doped $BaMgF_4$ was synthesized using 2.1821 g of $BaF_2$, 0.0439 g of $UO_2$ and 0.7832 g of $MgF_2$. The sample was ball milled for 2 hrs in a Nalgene bottle using YSZ media. The powder was then transferred to an alumina crucible and fired at 800° C. in air for 5 hrs. After firing the powder was again blended for 2 hrs and fired at 810° C. in air for 5 hrs. FIG. 44 shows excitation spectrum (solid line graph) and emission spectrum (dotted line graph) of $U^{6+}$-doped $BaMgF_4$.

Example 39: Preparation of $U^{6+}$-doped $Sr_4AlPO_8$

Figure 45:
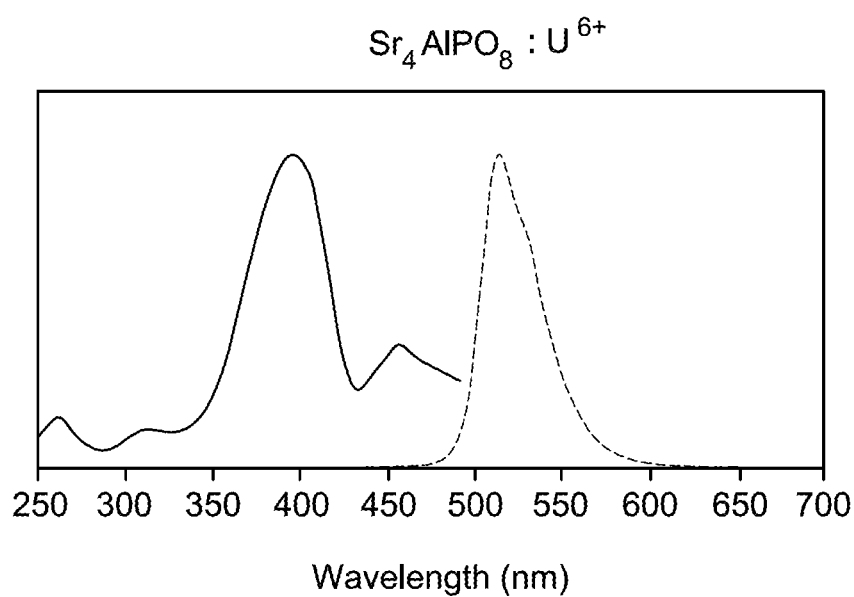
FIG. 45 shows an excitation spectrum and an emission spectrum of a green emitting $U^{6+}$-doped phosphor of formula A5.

A 3-gram sample of 1% $U^{6+}$-doped $Sr_4AlPO_8$ was synthesized using 3.2332 g of $SrCO_3$, 0.0597 g of $UO_2$, and 0.6744 g of $AlPO_4$. The sample was ball milled for 2 hrs in a Nalgene bottle using YSZ media. The powder was then transferred to an alumina crucible and fired at 1100° C. in air for 5 hrs. After firing the powder was again blended for 2 hrs and fired at 1200° C. in air for 5 hrs. FIG. 45 shows excitation spectrum (solid line graph) and emission spectrum (dotted line graph) of $U^{6+}$-doped $Sr_4AlPO_8$.

Example 40: Preparation of $U^{6+}$-doped $Ba_4AlPO_8$

Figure 46:
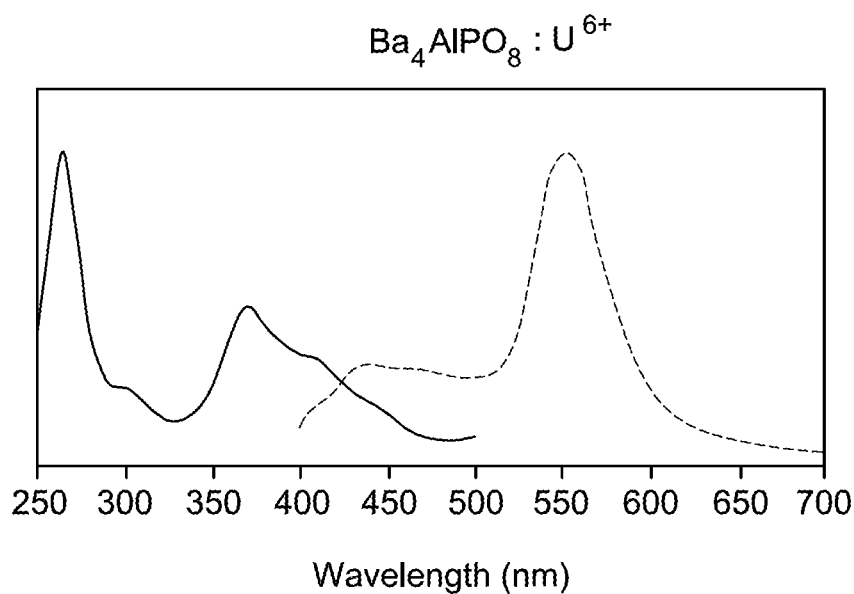
FIG. 46 shows an excitation spectrum and an emission spectrum of a green emitting $U^{6+}$-doped phosphor of formula A5.

A 3-gram sample of 1% $U^{6+}$-doped $Ba_4AlPO_8$ was synthesized using 3.1713 g of $BaCO_3$, 0.0438 g of $UO_2$, and 0.4949 g of $AlPO_4$. The sample was ball milled for 2 hrs in a Nalgene bottle using YSZ media. The powder was then transferred to an alumina crucible and fired at 1100° C. in air for 5 hrs. After firing the powder was again blended for 2 hrs and fired at 1200° C. in air for 5 hrs. FIG. 46 shows excitation spectrum (solid line graph) and emission spectrum (dotted line graph) of $U^{6+}$-doped $Ba_4AlPO_8$.

Example 41: Preparation of $U^{6+}$-doped $Ca_4AlPO_8$

Figure 47:
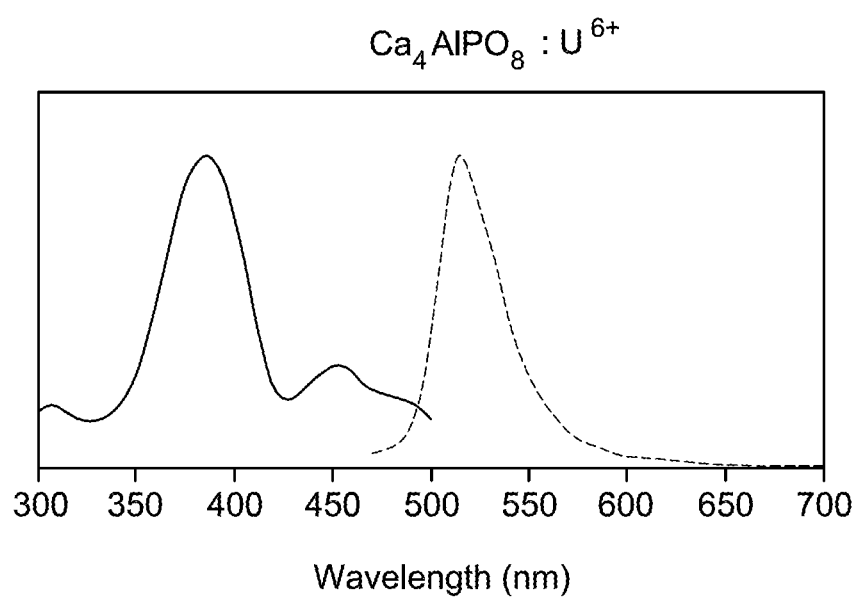
FIG. 47 shows an excitation spectrum and an emission spectrum of a green emitting $U^{6+}$-doped phosphor of formula A5.

A 3-gram sample of 1% $U^{6+}$-doped $Ca_4AlPO_8$ was synthesized using 3.3572 g of $CaCO_3$, 0.0915 g of $UO_2$, and 1.0329 g of $AlPO_4$. The sample was ball milled for 2 hrs in a Nalgene bottle using YSZ media. The powder was then transferred to an alumina crucible and fired at 1200° C. in air for 5 hrs. After firing the powder was again blended for 2 hrs and fired at 1300° C. in air for 5 hrs. FIG. 47 shows excitation spectrum (solid line graph) and emission spectrum (dotted line graph) of $U^{6+}$-doped $Ca_4AlPO_8$.

Example 42: Preparation of $U^{6+}$-doped $Ba_3SrAlPO_8$

Figure 48:
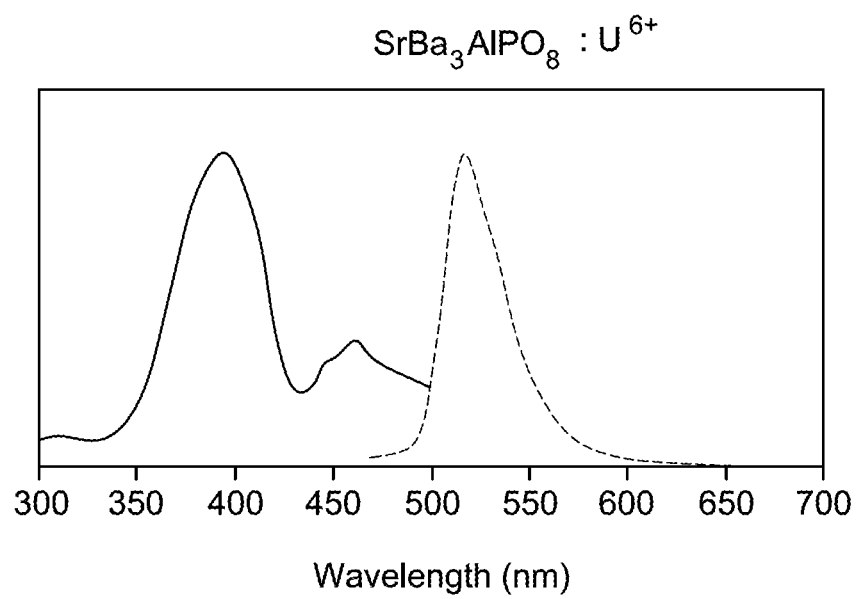
FIG. 48 shows an excitation spectrum and an emission spectrum of a green emitting $U^{6+}$-doped phosphor of formula A5.

A 3-gram sample of 1% $U^{6+}$-doped $Ba_3SrAlPO_8$ was synthesized using 2.5481 g of $BaCO_3$, 0.6354 g of $SrCO_3$, 0.0470 g of $UO_2$, and 0.5302 g of $AlPO_4$. The sample was ball milled for 2 hrs in a Nalgene bottle using YSZ media. The powder was then transferred to an alumina crucible and fired at 1100° C. in air for 5 hrs. After firing the powder was again blended for 2 hrs and fired at 1200° C. in air for 5 hrs. FIG. 48 shows excitation spectrum (solid line graph) and emission spectrum (dotted line graph) of $U^{6+}$-doped $Ba_3SrAlPO_8$.

Example 43: Preparation of $U^{6+}$-doped $Ba_2Sr_2AlPO_8$

Figure 49:
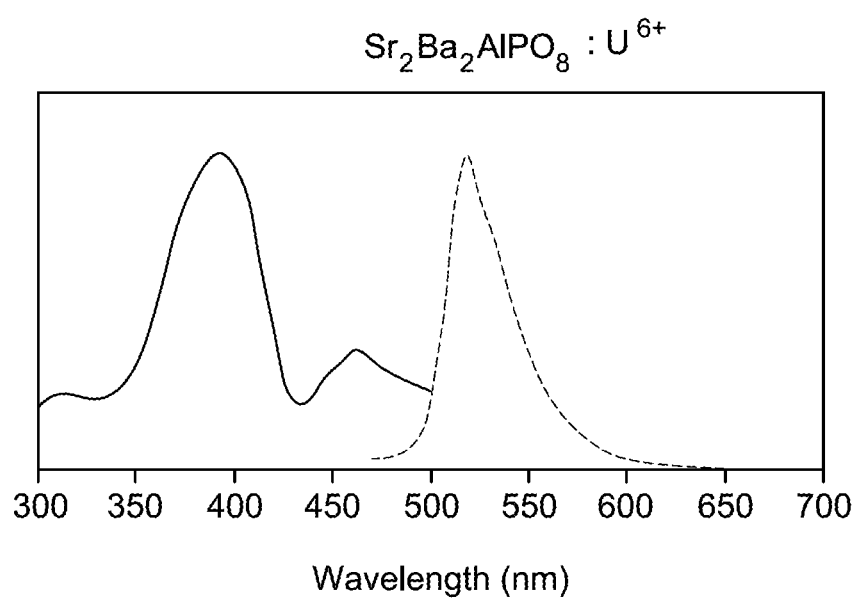
FIG. 49 shows an excitation spectrum and an emission spectrum of a green emitting $U^{6+}$-doped phosphor of formula A5.

A 3-gram sample of 1% $U^{6+}$-doped $Ba_2Sr_2AlPO_8$ was synthesized using 1.8292 g of $BaCO_3$, 1.3683 g of $SrCO_3$, 0.0506 g of $UO_2$, and 0.5709 g of $AlPO_4$. The sample was ball milled for 2 hrs in a Nalgene bottle using YSZ media. The powder was then transferred to an alumina crucible and fired at 1100° C. in air for 5 hrs. After firing the powder was again blended for 2 hrs and fired at 1200° C. in air for 5 hrs. FIG. 49 shows excitation spectrum (solid line graph) and emission spectrum (dotted line graph) of $U^{6+}$-doped $Ba_2Sr_2AlPO_8$.

Example 44: Preparation of $U^{6+}$-doped $BaSr_3AlPO_8$

Figure 50:
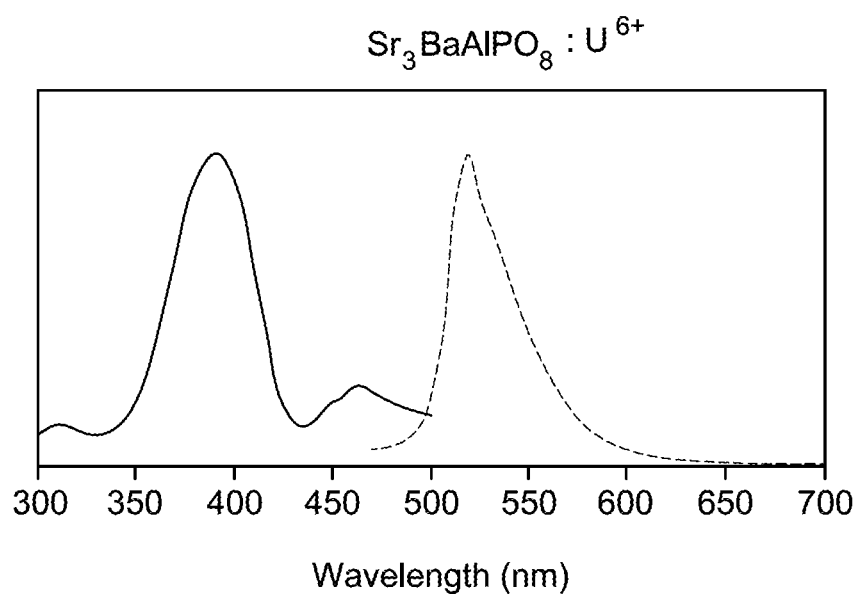
FIG. 50 shows an excitation spectrum and an emission spectrum of a green emitting $U^{6+}$-doped phosphor of formula A5.

A 3-gram sample of 1% $U^{6+}$-doped $BaSr_3AlPO_8$ was synthesized using 0.9907 g of $BaCO_3$, 2.2232 g of $SrCO_3$, 0.0548 g of $UO_2$, and 0.6183 g of $AlPO_4$. The sample was ball milled for 2 hrs in a Nalgene bottle using YSZ media. The powder was then transferred to an alumina crucible and fired at 1100° C. in air for 5 hrs. After firing the powder was again blended for 2 hrs and fired at 1200° C. in air for 5 hrs. FIG. 50 shows excitation spectrum (solid line graph) and emission spectrum (dotted line graph) of $U^{6+}$-doped $BaSr_3AlPO_8$.

Example 45: Preparation of $U^{6+}$-doped $Ba_6Al_5P_5O_{26}$

Figure 51:
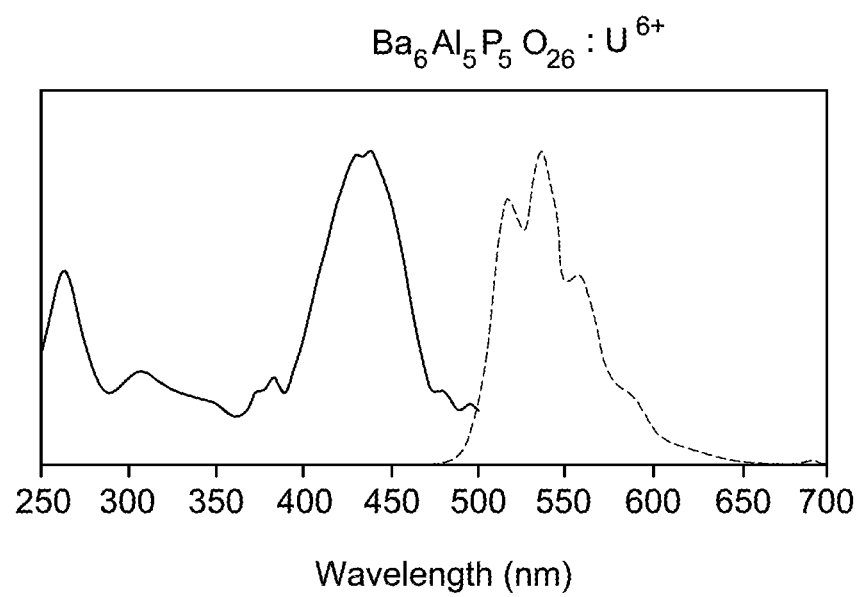
FIG. 51 shows an excitation spectrum and an emission spectrum of a green emitting $U^{6+}$-doped phosphor of formula A6.

A 3-gram sample of 1% $U^{6+}$-doped $Ba_6Al_5P_5O_{26}$ was synthesized using 2.2899 g of $BaCO_3$, 0.0316 g of $UO_2$, and 1.1911 g of $AlPO_4$. The sample was ball milled for 2 hrs in a Nalgene bottle using YSZ media. The powder was then transferred to an alumina crucible and fired at 1100° C. in air for 5 hrs. After firing the powder was again blended for 2 hrs and fired at 1200° C. in air for 5 hrs. FIG. 51 shows excitation spectrum (solid line graph) and emission spectrum (dotted line graph) of $U^{6+}$-doped $Ba_6Al_5P_5O_{26}$.

Example 46: Preparation of $U^{6+}$-doped $Ba_6Ga_5P_5O_{26}$

Figure 52:
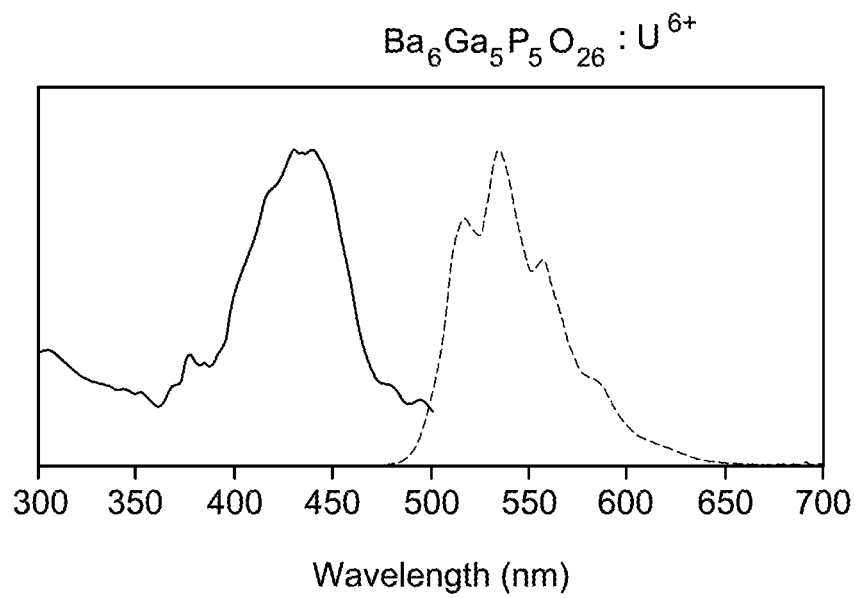
FIG. 52 shows an excitation spectrum and an emission spectrum of a green emitting $U^{6+}$-doped phosphor of formula A6.

A 3-gram sample of 1% $U^{6+}$-doped $Ba_6Ga_5P_5O_{26}$ was synthesized using 2.0102 g of $BaCO_3$, 0.0278 g of $UO_2$, and 0.8035 g of $Ga_2O_3$ and 1.1549 g of DAP. The sample was ball milled for 2 hrs in a Nalgene bottle using YSZ media. The powder was then transferred to an alumina crucible and fired at 300° C. in air for 5 hrs. Then fired at 500° C., 800° C. and finally 1100° C., for 5 hrs each, with 2 hrs mill times in between firings. FIG. 52 shows excitation spectrum (solid line graph) and emission spectrum (dotted line graph) of $U^{6+}$-doped $Ba_6Ga_5P_5O_{26}$.

Example 47: Preparation of $U^{6+}$-doped $Ba_6In_5P_5O_{26}$

Figure 53:
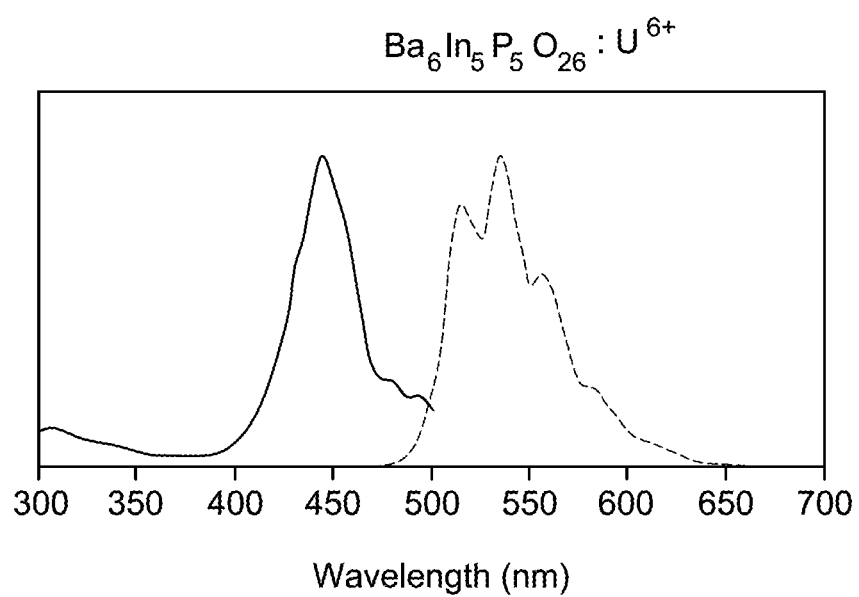
FIG. 53 shows an excitation spectrum and an emission spectrum of a green emitting $U^{6+}$-doped phosphor of formula A6.

A 3-gram sample of 1% $U^{6+}$-doped $Ba_6In_5P_5O_{26}$ was synthesized using 1.7807 g of $BaCO_3$, 0.0246 g of $UO_2$, and 1.0543 g of $In_2O_3$ and 1.0231 g of DAP. The sample was ball milled for 2 hrs in a Nalgene bottle using YSZ media. The powder was then transferred to an alumina crucible and fired at 300° C. in air for 5 hrs. Then fired at 500° C., 800° C. and finally 1100° C., for 5 hrs each, with 2 hrs mill times in between firings. FIG. 53 shows excitation spectrum (solid line graph) and emission spectrum (dotted line graph) of $U^{6+}$-doped $Ba_6In_5P_5O_{26}$.

Example 48: Preparation of $U^{6+}$-doped $Ba_6Al_5V_5O_{26}$

Figure 54:
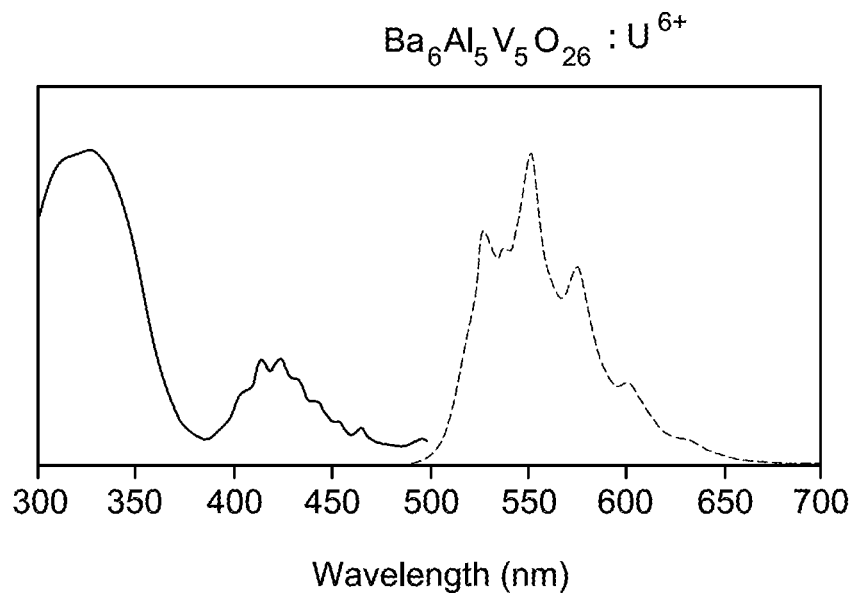
FIG. 54 shows an excitation spectrum and an emission spectrum of a green emitting $U^{6+}$-doped phosphor of formula A6.

A 3-gram sample of 1% $U^{6+}$-doped $Ba_6Al_5V_5O_{26}$ was synthesized using 2.1501 g of $BaCO_3$, 0.0297 g of $UO_2$, 1.0728 g of $NH_4VO_3$ and 0.4625 g of $Al_2O_3$. The sample was ball milled for 2 hrs in a Nalgene bottle using YSZ media. The powder was then transferred to an alumina crucible and fired at 500° C. in air for 5 hrs. Then fired at 900° C. and finally 1000° C., for 5 hrs each, with 2 hrs mill times in between firings. FIG. 54 shows excitation spectrum (solid line graph) and emission spectrum (dotted line graph) of $U^{6+}$-doped $Ba_6Al_5V_5O_{26}$.

Example 49: Preparation of $U^{6+}$-doped $Ba_6Ga_5V_5O_{26}$

Figure 55:
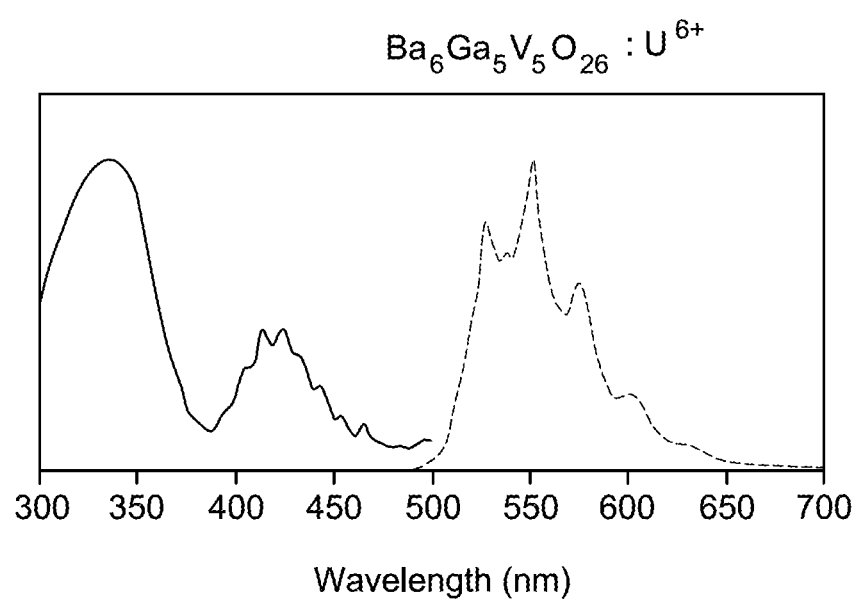
FIG. 55 shows an excitation spectrum and an emission spectrum of a green emitting $U^{6+}$-doped phosphor of formula A6.

A 3-gram sample of 1% $U^{6+}$-doped $Ba_6Ga_5V_5O_{26}$ was synthesized using 1.9017 g of $BaCO_3$, 0.0263 g of $UO_2$, 0.9488 g of $NH_4VO_3$ and 0.7602 g of $Ga_2O_3$. The sample was ball milled for 2 hrs in a Nalgene bottle using YSZ media. The powder was then transferred to an alumina crucible and fired at 500° C. in air for 5 hrs. Then fired at 900° C. and finally 1000° C., for 5 hrs each, with 2 hrs mill times in between firings. FIG. 55 shows excitation spectrum (solid line graph) and emission spectrum (dotted line graph) of $U^{6+}$-doped $Ba_6Ga_5V_5O_{26}$.

Example 50: Preparation of $U^{6+}$-doped $Ba_6In_5V_5O_{26}$

Figure 56:
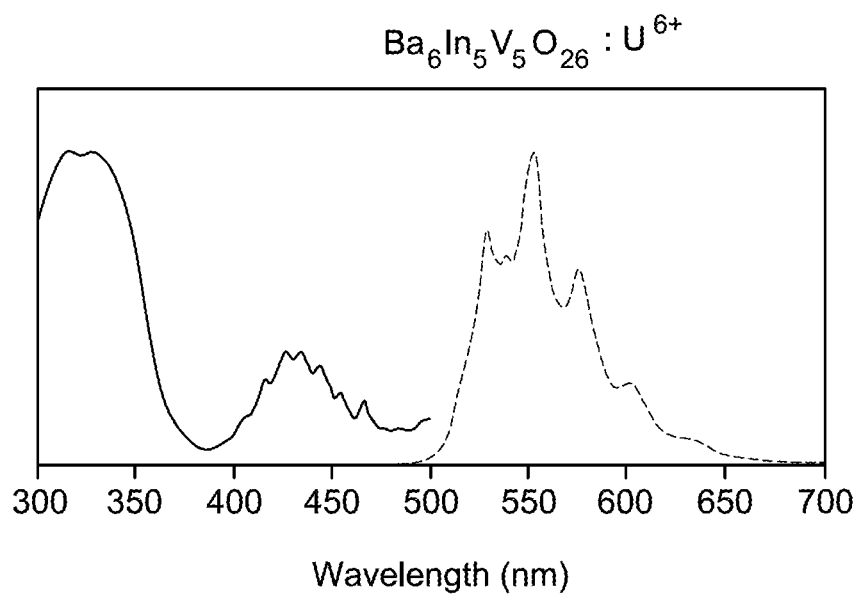
FIG. 56 shows an excitation spectrum and an emission spectrum of a green emitting $U^{6+}$-doped phosphor of formula A6.

A 3-gram sample of 1% $U^{6+}$-doped $Ba_6In_5V_5O_{26}$ was synthesized using 1.6950 g of $BaCO_3$, 0.0234 g of $UO_2$, 0.8457 g of $NH_4VO_3$ and 1.0036 g of $In_2O_3$. The sample was ball milled for 2 hrs in a Nalgene bottle using YSZ media. The powder was then transferred to an alumina crucible and fired at 500° C. in air for 5 hrs. Then fired at 900° C. and finally 1000° C., for 5 hrs each, with 2 hrs mill times in between firings. FIG. 56 shows excitation spectrum (solid line graph) and emission spectrum (dotted line graph) of $U^{6+}$-doped $Ba_6In_5V_5O_{26}$.

Example 51: Preparation of $U^{6+}$-doped $SrAl_2O_4$

Figure 57:
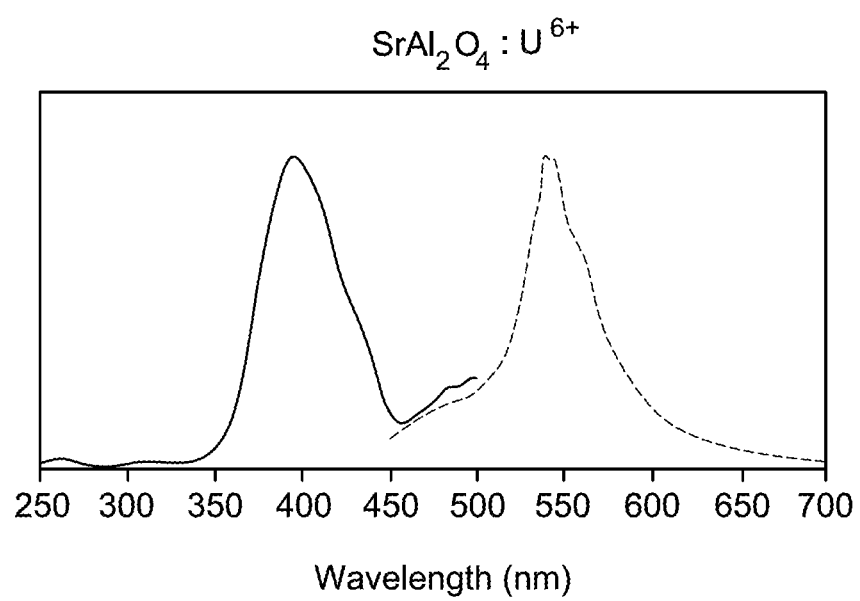
FIG. 57 shows an excitation spectrum and an emission spectrum of a green emitting $U^{6+}$-doped phosphor of formula E4.

A 3-gram sample of 1% $U^{6+}$-doped $SrAl_2O_4$ was synthesized using 2.1140 g of $SrCO_3$, 0.0391 g of $UO_2$, and 1.4748 g of $Al_2O_3$. The sample was ball milled for 2 hrs in a Nalgene bottle using YSZ media. The powder was then transferred to an alumina crucible and fired at 1100° C. in air for 5 hrs. After firing the powder was again blended for 2 hrs and fired at 1200° C. in air for 5 hrs. Then blended for a third time for 2 hrs and fired at 1300° C. for 5 hrs in air. FIG. 57 shows excitation spectrum (solid line graph) and emission spectrum (dotted line graph) of $U^{6+}$-doped $SrAl_2O_4$.

Example 52: Preparation of $U^{6+}$-doped $SrAlBO_4$

Figure 58:
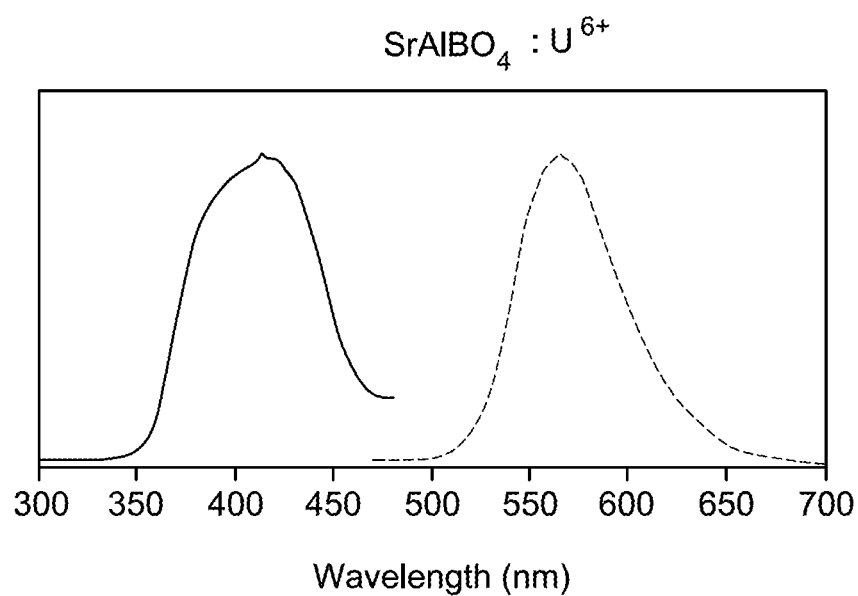
FIG. 58 shows an excitation spectrum and an emission spectrum of a green emitting $U^{6+}$-doped phosphor of formula E4.

A 3-gram sample of 1% $U^{6+}$-doped $SrAlBO_4$ was synthesized using 2.2966 g of $SrCO_3$, 0.0424 g of $UO_2$, 0.5470 g of $B_2O_3$ and 0.8011 g of $Al_2O_3$. The sample was ball milled for 2 hrs in a Nalgene bottle using YSZ media. The powder was then transferred to an alumina crucible and fired at 300 C in air for 5 hrs. Then fired at 500° C., 800° C. and finally 1000° C., for 5 hrs each, with 2 hrs mill times in between firings. FIG. 58 shows excitation spectrum (solid line graph) and emission spectrum (dotted line graph) of $U^{6+}$-doped $SrAlBO_4$.

Example 53: Preparation of $U^{6+}$-doped $Ca_2SiO_4$

Figure 59:
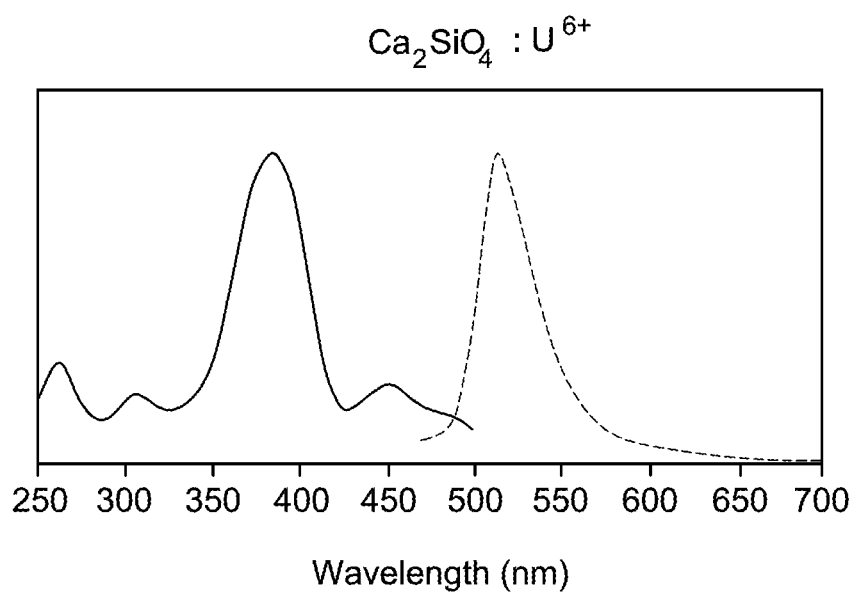
FIG. 59 shows an excitation spectrum and an emission spectrum of a green emitting $U^{6+}$-doped phosphor of formula D1.

A 3-gram sample of 1% $U^{6+}$-doped $Ca_2SiO_4$ was synthesized using 3.3742 g of $CaCO_3$, 0.0920 g of $UO_2$, and 1.0784 g of $SiO_2$. The sample was ball milled for 2 hrs in a Nalgene bottle using YSZ media. The powder was then transferred to an alumina crucible and fired at 1100° C. in air for 5 hrs. After firing the powder was again blended for 2 hrs and fired at 1200° C. in air for 5 hrs. FIG. 59 shows excitation spectrum (solid line graph) and emission spectrum (dotted line graph) of $U^{6+}$-doped $Ca_2SiO_4$.

Example 54: Preparation of $U^{6+}$-doped $Mg_2SiO_4$

Figure 60:
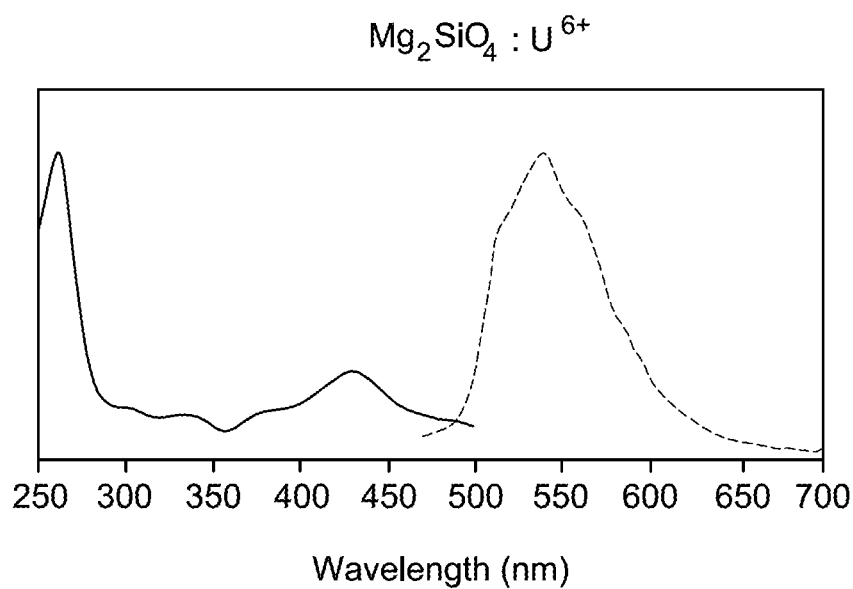
FIG. 60 shows an excitation spectrum and an emission spectrum of a green emitting $U^{6+}$-doped phosphor of formula D1.

A 3-gram sample of 1% $U^{6+}$-doped $Mg_2SiO_4$ was synthesized using 1.6513 g of MgO, 0.1117 g of $UO_2$, and 1.3107 g of $SiO_2$. The sample was ball milled for 2 hrs in a Nalgene bottle using YSZ media. The powder was then transferred to an alumina crucible and fired at 1100° C. in air for 5 hrs. FIG. 60 shows excitation spectrum (solid line graph) and emission spectrum (dotted line graph) of $U^{6+}$-doped $Mg_2SiO_4$.

Example 55: Preparation of $U^{6+}$-doped $Ca_2GeO_4$

Figure 61:
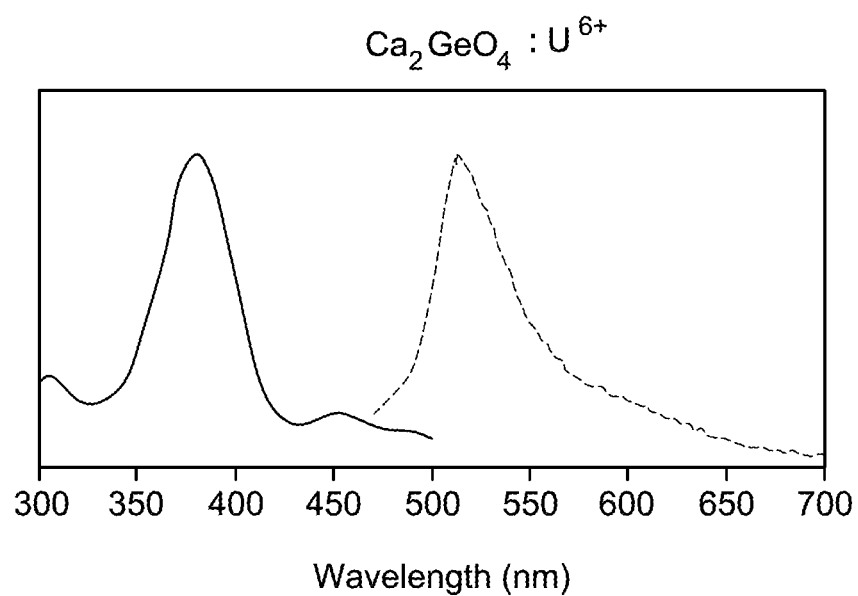
FIG. 61 shows an excitation spectrum and an emission spectrum of a green emitting $U^{6+}$-doped phosphor of formula D1.

A 3-gram sample of 1% $U^{6+}$-doped $Ca_2GeO_4$ was synthesized using 2.6938 g of $CaCO_3$, 0.0734 g of $UO_2$, and 1.4217 g of $GeO_2$. The sample was ball milled for 2 hrs in a Nalgene bottle using YSZ media. The powder was then transferred to an alumina crucible and fired at 1000° C. in air for 5 hrs. After firing the powder was again blended for 2 hrs and fired at 1100° C. in air for 5 hrs. FIG. 61 shows excitation spectrum (solid line graph) and emission spectrum (dotted line graph) of $U^{6+}$-doped $Ca_2GeO_4$.

Example 56: Preparation of $U^{6+}$-doped $Sr_2GeO_4$

Figure 62:
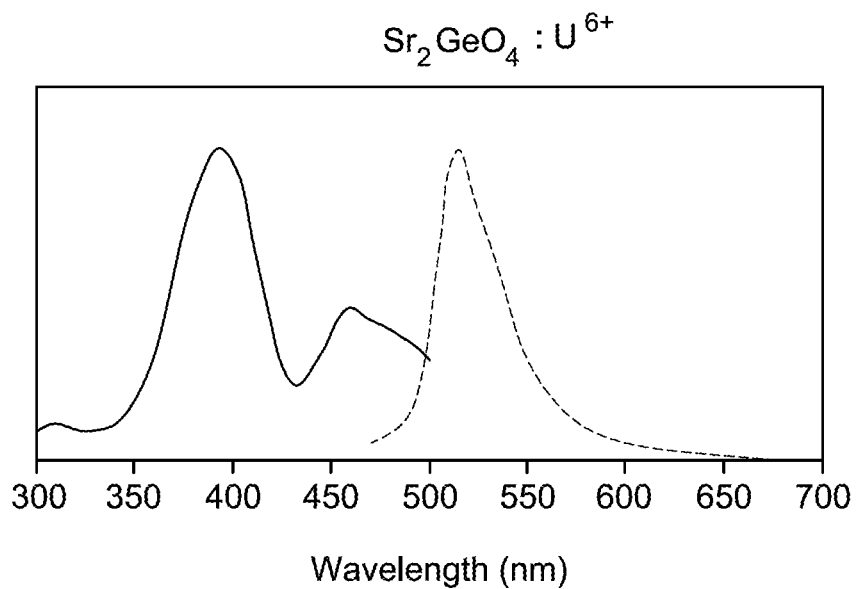
FIG. 62 shows an excitation spectrum and an emission spectrum of a green emitting $U^{6+}$-doped phosphor of formula D1.

A 3-gram sample of 1% $U^{6+}$-doped $Sr_2GeO_4$ was synthesized using 2.7853 g of $SrCO_3$, 0.0515 g of $UO_2$, and 0.9966 g of $GeO_2$. The sample was ball milled for 2 hrs in a Nalgene bottle using YSZ media. The powder was then transferred to an alumina crucible and fired at 1000° C. in air for 5 hrs. After firing the powder was again blended for 2 hrs and fired at 1100° C. in air for 5 hrs. FIG. 62 shows excitation spectrum (solid line graph) and emission spectrum (dotted line graph) of $U^{6+}$-doped $Sr_2GeO_4$.

Example 57: Preparation of $U^{6+}$-doped $Sr_3SiO_5$

Figure 63:
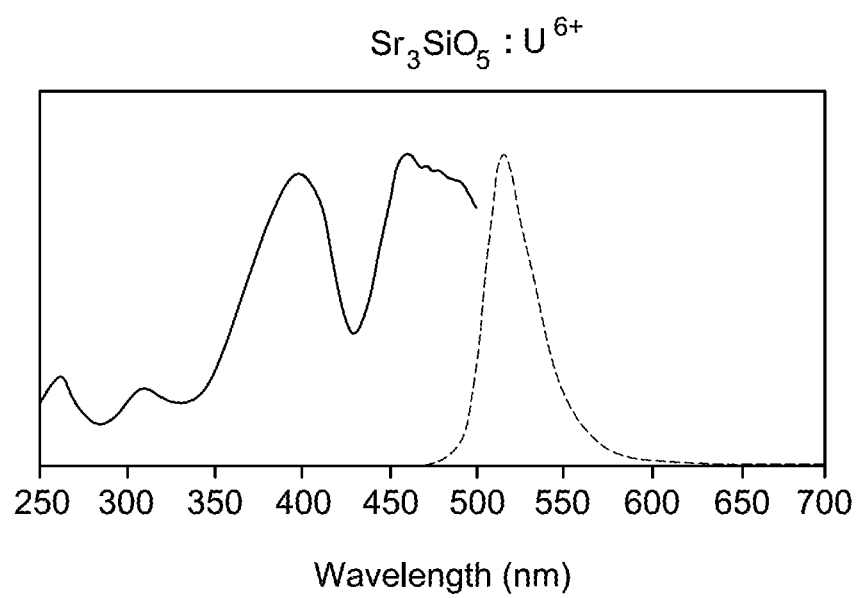
FIG. 63 shows an excitation spectrum and an emission spectrum of a green emitting $U^{6+}$-doped phosphor of formula D2.

A 3-gram sample of 1% $U^{6+}$-doped $Sr_3SiO_5$ was synthesized using 3.5034 g of $SrCO_3$, 0.0647 g of $UO_2$, and 0.5061 g of $SiO_2$. The sample was ball milled for 2 hrs in a Nalgene bottle using YSZ media. The powder was then transferred to an alumina crucible and fired at 1100° C. in air for 5 hrs. After firing the powder was again blended for 2 hrs and fired at 1100° C. in air for 5 hrs. FIG. 63 shows excitation spectrum (solid line graph) and emission spectrum (dotted line graph) of $U^{6+}$-doped $Sr_3SiO_5$.

Example 58: Preparation of $U^{6+}$-doped $Ca_3SiO_5$

Figure 64:
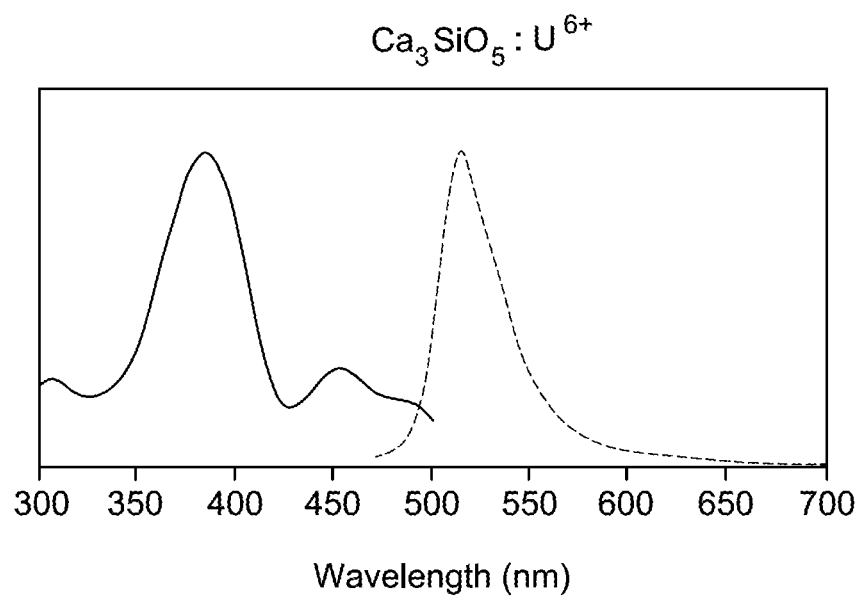
FIG. 64 shows an excitation spectrum and an emission spectrum of a green emitting $U^{6+}$-doped phosphor of formula D2.

A 3-gram sample of 1% $U^{6+}$-doped $Ca_3SiO_5$ was synthesized using 3.8070 g of $CaCO_3$, 0.1037 g of $UO_2$, and 0.8111 g of $SiO_2$. The sample was ball milled for 2 hrs in a Nalgene bottle using YSZ media. The powder was then transferred to an alumina crucible and fired at 1100° C. in air for 5 hrs. After firing the powder was again blended for 2 hrs and fired at 1100° C. in air for 5 hrs. FIG. 64 shows excitation spectrum (solid line graph) and emission spectrum (dotted line graph) of $U^{6+}$-doped $Ca_3SiO_5$.

Example 59: Preparation of $U^{6+}$-doped $Sr_4Al_2O_7$

Figure 65:
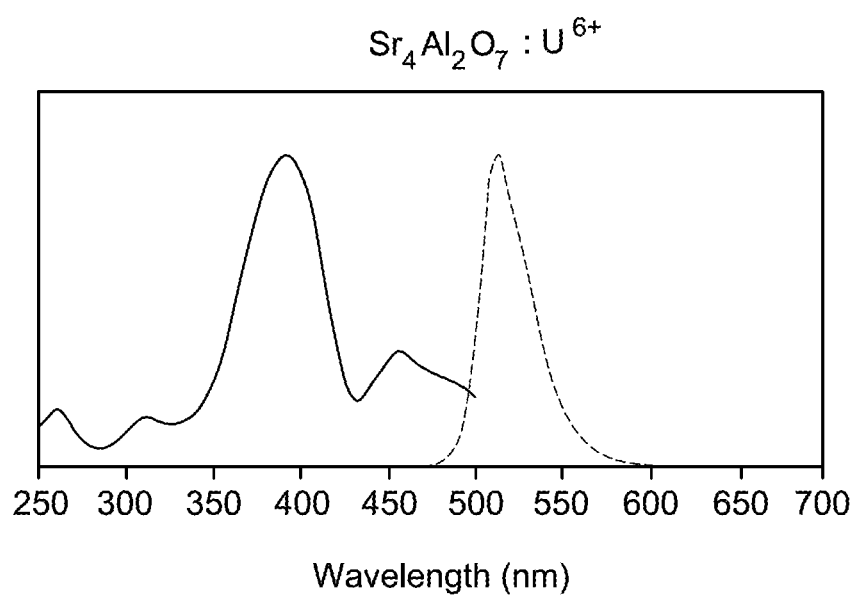
FIG. 65 shows an excitation spectrum and an emission spectrum of a green emitting $U^{6+}$-doped phosphor of formula E5.

A 3-gram sample of 1% $U^{6+}$-doped $Sr_4Al_2O_7$ was synthesized using 3.3569 g of $SrCO_3$, 0.0620 g of $UO_2$, and 0.5855 g of $Al_2O_3$. The sample was ball milled for 2 hrs in a Nalgene bottle using YSZ media. The powder was then transferred to an alumina crucible and fired at 1100° C. in air for 5 hrs. After firing the powder was again blended for 2 hrs and fired at 1100° C. in air for 5 hrs. FIG. 65 shows excitation spectrum (solid line graph) and emission spectrum (dotted line graph) of $U^{6+}$-doped $Sr_4Al_2O_7$.

Example 60: Preparation of $U^{6+}$-doped $Ca_4Al_2O_7$

Figure 66:
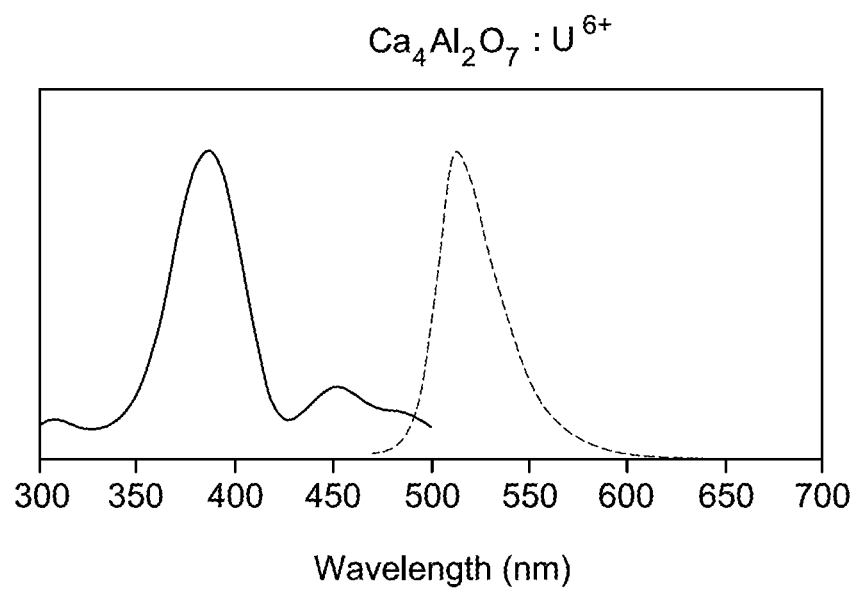
FIG. 66 shows an excitation spectrum and an emission spectrum of a green emitting $U^{6+}$-doped phosphor of formula E5.

A 3-gram sample of 1% $U^{6+}$-doped $Ca_4Al_2O_7$ was synthesized using 3.5581 g of $CaCO_3$, 0.0970 g of $UO_2$, and 0.9153 g of $Al_2O_3$. The sample was ball milled for 2 hrs in a Nalgene bottle using YSZ media. The powder was then transferred to an alumina crucible and fired at 1100° C. in air for 5 hrs. After firing the powder was again blended for 2 hrs and fired at 1100° C. in air for 5 hrs. FIG. 66 shows excitation spectrum (solid line graph) and emission spectrum (dotted line graph) of $U^{6+}$-doped $Ca_4Al_2O_7$.

Example 61: Preparation of $U^{6+}$-doped $Ca_3Si_2O_7$

Figure 67:
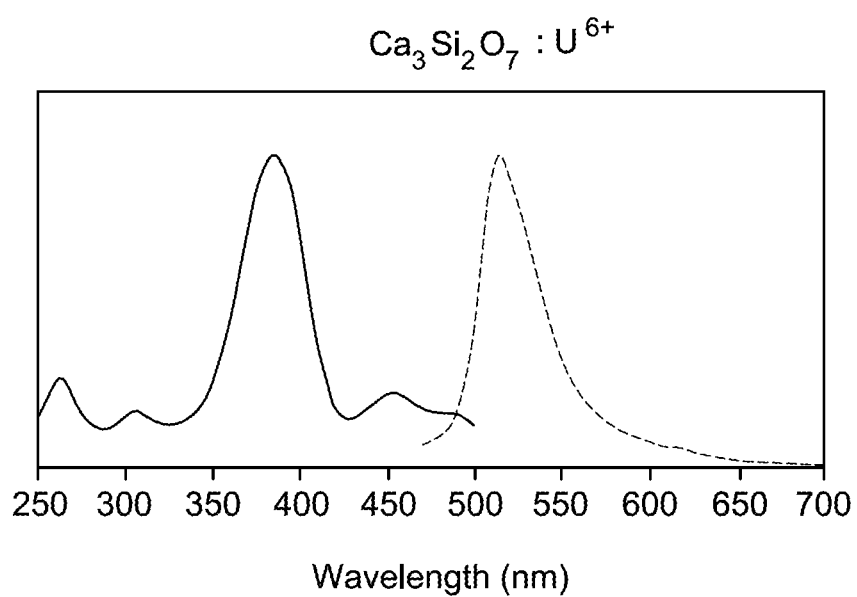
FIG. 67 shows an excitation spectrum and an emission spectrum of a green emitting $U^{6+}$-doped phosphor of formula D3.

A 3-gram sample of 1% $U^{6+}$-doped $Ca_3Si_2O_7$ was synthesized using 3.0298 g of $CaCO_3$, 0.0826 g of $UO_2$, and 1.2911 g of $SiO_2$. The sample was ball milled for 2 hrs in a Nalgene bottle using YSZ media. The powder was then transferred to an alumina crucible and fired at 1100° C. in air for 5 hrs. After firing the powder was again blended for 2 hrs and fired at 1100° C. in air for 5 hrs. FIG. 67 shows excitation spectrum (solid line graph) and emission spectrum (dotted line graph) of $U^{6+}$-doped $Ca_3Si_2O_7$.

Example 62: Preparation of $U^{6+}$-doped $Ca_{12}Al_{14}O_{33}$

Figure 68:
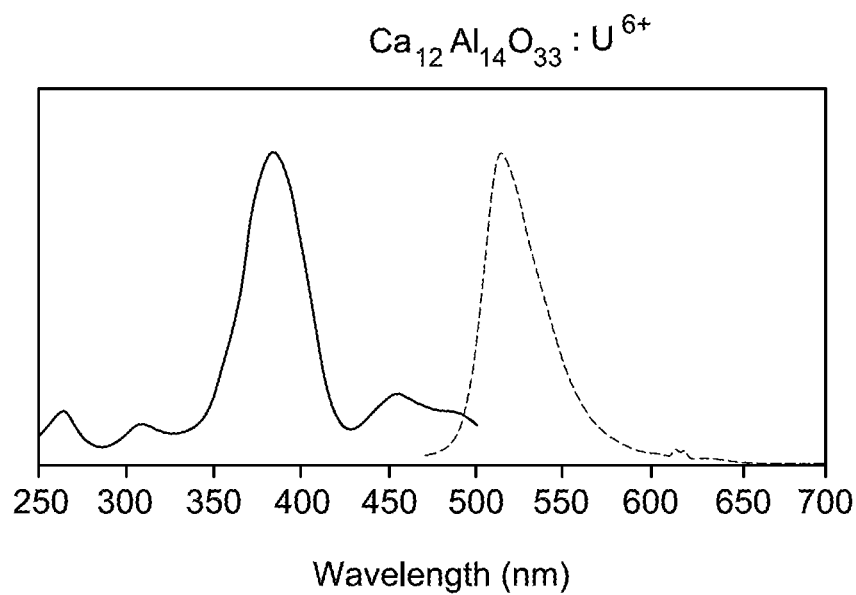
FIG. 68 shows an excitation spectrum and an emission spectrum of a green emitting $U^{6+}$-doped phosphor of formula E6.

A 3-gram sample of 1% $U^{6+}$-doped $Ca_{12}Al_{14}O_{33}$ was synthesized using 2.5292 g of $CaCO_3$, 0.0689 g of $UO_2$, and 1.5181 g of $Al_2O_3$. The sample was ball milled for 2 hrs in a Nalgene bottle using YSZ media. The powder was then transferred to an alumina crucible and fired at 1200° C. in air for 5 hrs. After firing the powder was again blended for 2 hrs and fired at 1300° C. in air for 5 hrs. FIG. 68 shows excitation spectrum (solid line graph) and emission spectrum (dotted line graph) of $U^{6+}$-doped $Ca_{12}Al_{14}O_{33}$.

Example 63: Preparation of $U^{6+}$-doped $MgSiO_3$

Figure 69:
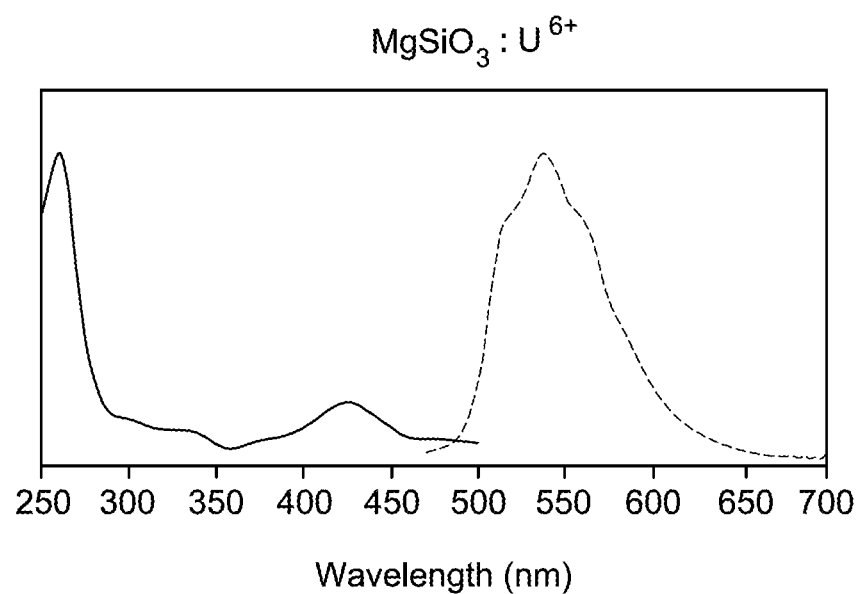
FIG. 69 shows an excitation spectrum and an emission spectrum of a green emitting $U^{6+}$-doped phosphor of formula D4.

A 3-gram sample of 1% $U^{6+}$-doped $MgSiO_3$ was synthesized using 1.1624 g of MgO, 0.0790 g of $UO_2$, and 1.8532 g of $SiO_2$. The sample was ball milled for 2 hrs in a Nalgene bottle using YSZ media. The powder was then transferred to an alumina crucible and fired at 1000° C. in air for 5 hrs. FIG. 69 shows excitation spectrum (solid line graph) and emission spectrum (dotted line graph) of $U^{6+}$-doped $MgSiO_3$.

Example 64: Preparation of $U^{6+}$-doped $BaGeO_3$

Figure 70:
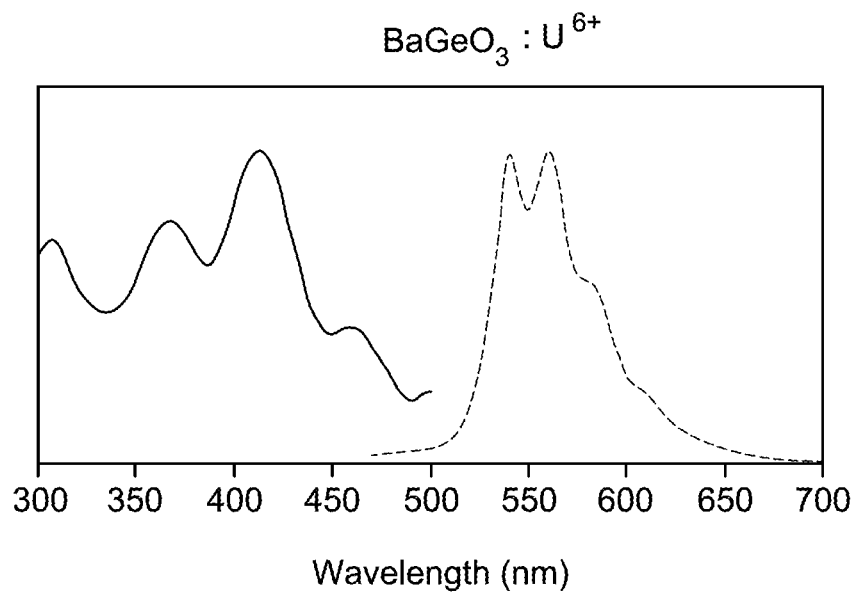
FIG. 70 shows an excitation spectrum and an emission spectrum of a green emitting $U^{6+}$-doped phosphor of formula D4.

A 3-gram sample of 1% $U^{6+}$-doped $BaGeO_3$ was synthesized using 2.2637 g of $BaCO_3$, 0.0313 g of $UO_2$, and 1.2118 g of $GeO_2$. The sample was ball milled for 2 hrs in a Nalgene bottle using YSZ media. The powder was then transferred to an alumina crucible and fired at 1000° C. in air for 5 hrs. After firing the powder was again blended for 2 hrs and fired at 1100° C. in air for 5 hrs. FIG. 70 shows excitation spectrum (solid line graph) and emission spectrum (dotted line graph) of $U^{6+}$-doped $BaGeO_3$.

Example 65: Preparation of $U^{6+}$-doped $Mg_3P_2O_8$

Figure 71:
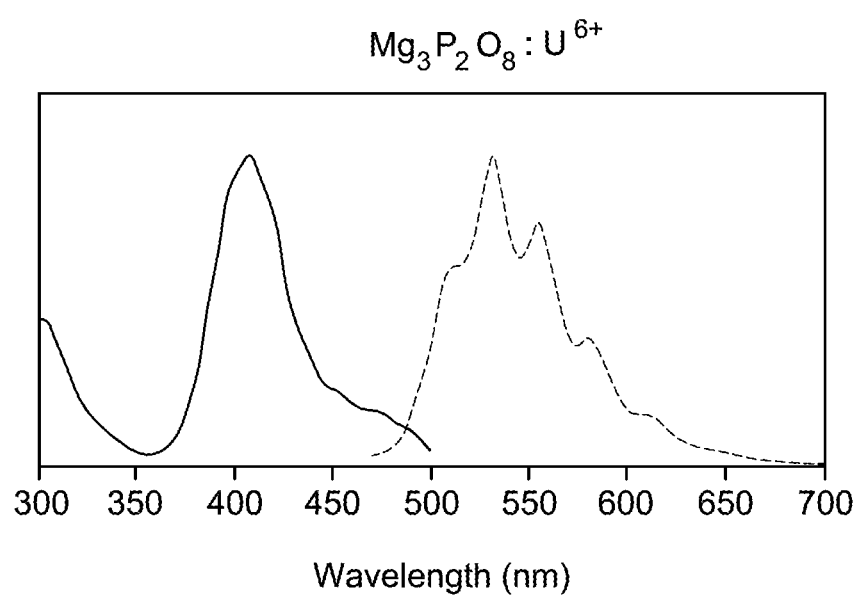
FIG. 71 shows an excitation spectrum and an emission spectrum of a green emitting $U^{6+}$-doped phosphor of formula A7.

A 3-gram sample of 1% $U^{6+}$-doped $Mg_3P_2O_8$ was synthesized using 1.3335 g of MgO, 0.0903 g of $UO_2$, and 3.0902 g of DAP. The sample was ball milled for 2 hrs in a Nalgene bottle using YSZ media. The powder was then transferred to an alumina crucible and fired at 300° C. in air for 5 hrs. Then fired at 500° C., 700° C., 850° C. and finally 1000° C., for 5 hrs each, with 2 hrs mill times in between firings. FIG. 71 shows excitation spectrum (solid line graph) and emission spectrum (dotted line graph) of $U^{6+}$-doped $Mg_3P_2O_8$.

Example 66: Preparation of $U^{6+}$-doped $Ca_3V_2O_8$

Figure 72:
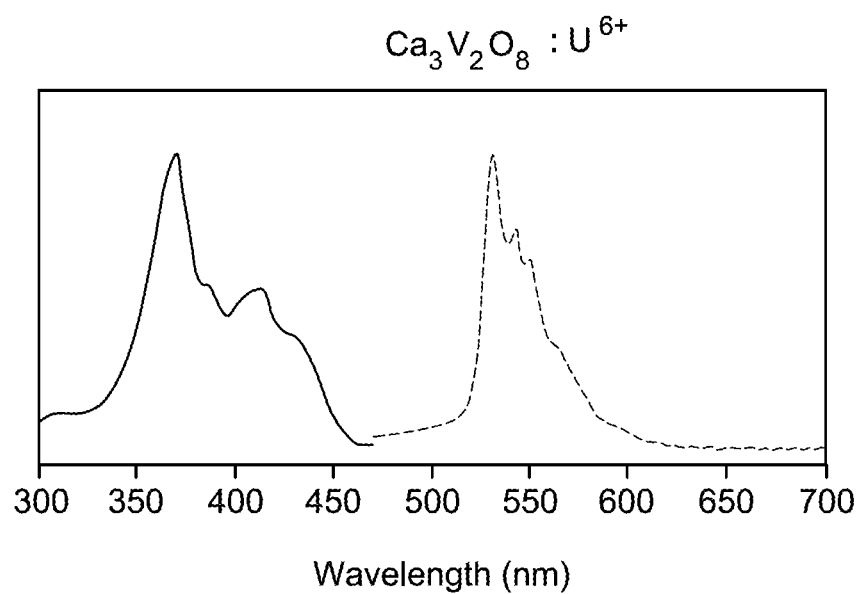
FIG. 72 shows an excitation spectrum and an emission spectrum of a green emitting $U^{6+}$-doped phosphor of formula A7.

A 3-gram sample of 1% $U^{6+}$-doped $Ca_3V_2O_8$ was synthesized using 2.4980 g of $CaCO_3$, 0.0681 g of $UO_2$, and 1.9659 g of $NH_4VO_3$. The sample was ball milled for 2 hrs in a Nalgene bottle using YSZ media. The powder was then transferred to an alumina crucible and fired at 250° C. in air for 5 hrs. Then fired at 600° C., and finally 1000° C., for 5 hrs each, with 2 hrs mill times in between firings. FIG. 72 shows excitation spectrum (solid line graph) and emission spectrum (dotted line graph) of $U^{6+}$-doped $Ca_3V_2O_8$.

Example 67: Preparation of $U^{6+}$-doped $Ba_3V_2O_8$

Figure 73:
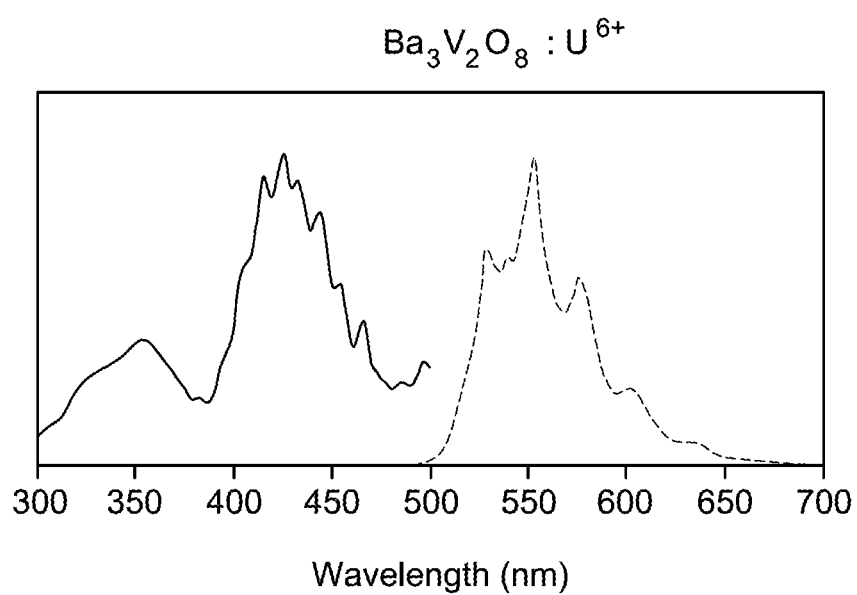
FIG. 73 shows an excitation spectrum and an emission spectrum of a green emitting $U^{6+}$-doped phosphor of formula A7.

A 3-gram sample of 1% $U^{6+}$-doped $Ba_3V_2O_8$ was synthesized using 2.7226 g of $BaCO_3$, 0.0376 g of $UO_2$, and 1.0868 g of $NH_4VO_3$. The sample was ball milled for 2 hrs in a Nalgene bottle using YSZ media. The powder was then transferred to an alumina crucible and fired at 250 C in air for 5 hrs. Then fired at 600° C., and finally 1000° C., for 5 hrs each, with 2 hrs mill times in between firings. FIG. 73 shows excitation spectrum (solid line graph) and emission spectrum (dotted line graph) of $U^{6+}$-doped $Ba_3V_2O_8$.

Example 68: Preparation of $U^{6+}$-doped $BaMg_2V_2O_8$

Figure 74:
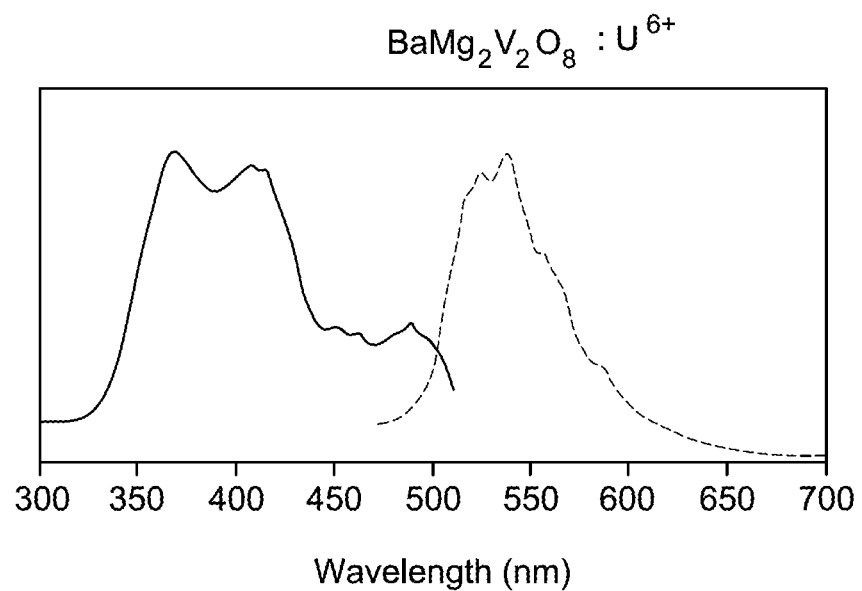
FIG. 74 shows an excitation spectrum and an emission spectrum of a green emitting $U^{6+}$-doped phosphor of formula A7.

A 3-gram sample of 1% $U^{6+}$-doped $BaMg_2V_2O_8$ was synthesized using 1.4062 g of $BaCO_3$, 0.0194 g of $UO_2$, 0.5801 g of MgO, and 1.6839 g of $NH_4VO_3$. The sample was ball milled for 2 hrs in a Nalgene bottle using YSZ media. The powder was then transferred to an alumina crucible and fired at 300° C. in air for 5 hrs. Then fired at 600° C., and finally 900° C., for 5 hrs each, with 2 hrs mill times in between firings. FIG. 74 shows excitation spectrum (solid line graph) and emission spectrum (dotted line graph) of $U^{6+}$-doped $BaMg_2V_2O_8$.

Example 69: Preparation of $U^{6+}$-doped $BaAl_2Si_2O_8$

Figure 75:
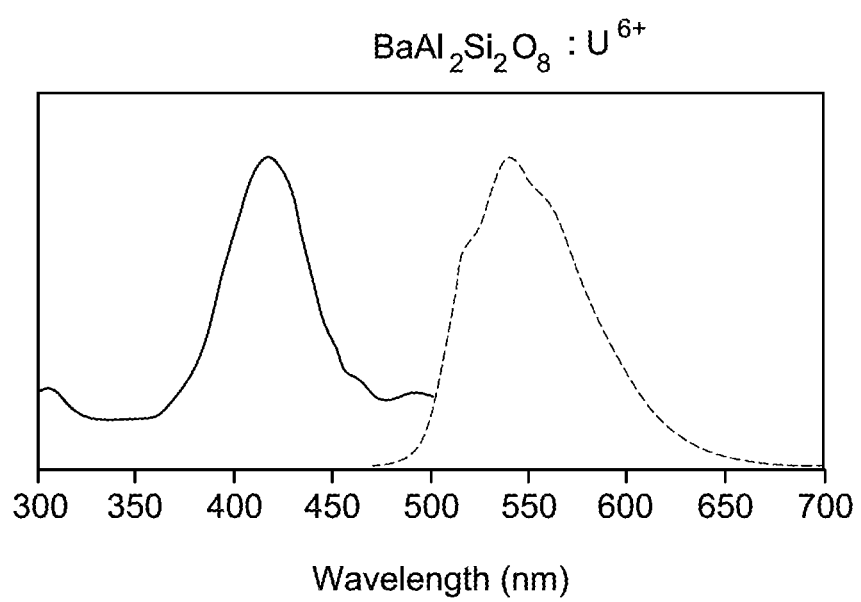
FIG. 75 shows an excitation spectrum and an emission spectrum of a green emitting $U^{6+}$-doped phosphor of formula D5.

A 3-gram sample of 1% $U^{6+}$-doped $BaAl_2Si_2O_8$ was synthesized using 1.5569 g of $BaCO_3$, 0.0215 g of $UO_2$, 0.8125 g of $Al_2O_3$ and 1.0094 g of $SiO_2$. The sample was ball milled for 2 hrs in a Nalgene bottle using YSZ media. The powder was then transferred to an alumina crucible and fired at 1100° C. in air for 5 hrs. After firing the powder was again blended for 2 hrs and fired at 1100° C. in air for 5 hrs. FIG. 75 shows excitation spectrum (solid line graph) and emission spectrum (dotted line graph) of $U^{6+}$-doped $BaAl_2Si_2O_8$.

Example 70: Preparation of $U^{6+}$-doped $SrAl_2Si_2O_8$

Figure 76:
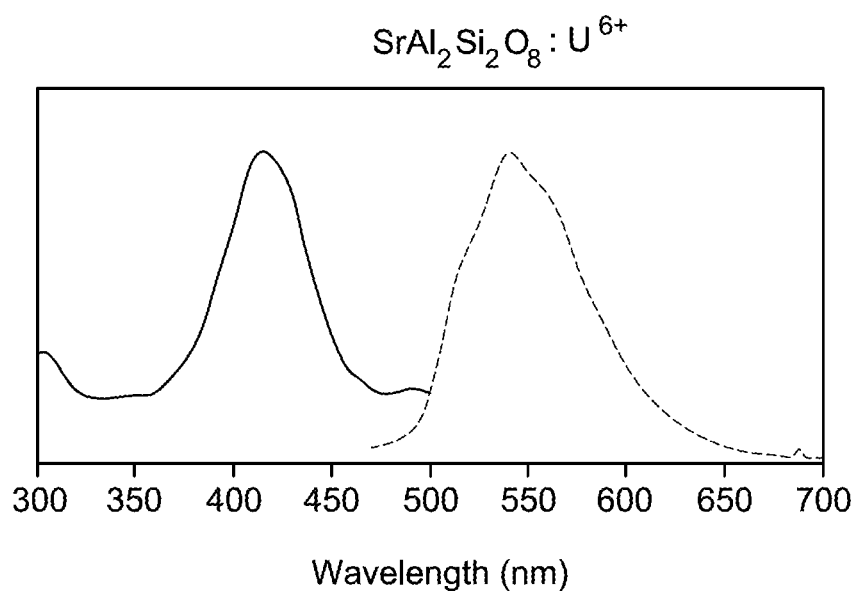
FIG. 76 shows an excitation spectrum and an emission spectrum of a green emitting $U^{6+}$-doped phosphor of formula D5.

A 3-gram sample of 1% $U^{6+}$-doped $SrAl_2Si_2O_8$ was synthesized using 1.3398 g of $SrCO_3$, 0.0248 g of $UO_2$, 0.9347 g of $Al_2O_3$ and 1.1612 g of $SiO_2$. The sample was ball milled for 2 hrs in a Nalgene bottle using YSZ media. The powder was then transferred to an alumina crucible and fired at 1100° C. in air for 5 hrs. After firing the powder was again blended for 2 hrs and fired at 1100° C. in air for 5 hrs. FIG. 76 shows excitation spectrum (solid line graph) and emission spectrum (dotted line graph) of $U^{6+}$-doped $SrAl_2Si_2O_8$.

Example 71: Preparation of $U^{6+}$-doped $CaAl_2Si_2O_8$

Figure 77:
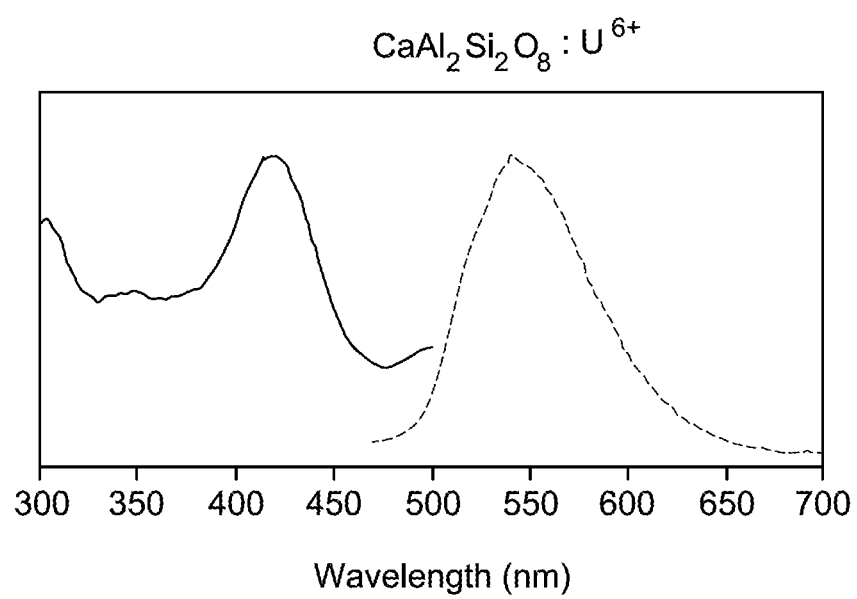
FIG. 77 shows an excitation spectrum and an emission spectrum of a green emitting $U^{6+}$-doped phosphor of formula D5.

A 3-gram sample of 1% $U^{6+}$-doped $CaAl_2Si_2O_8$ was synthesized using 1.0609 g of $CaCO_3$, 0.0289 g of $UO_2$, 1.0917 g of $Al_2O_3$ and 1.3563 g of $SiO_2$. The sample was ball milled for 2 hrs in a Nalgene bottle using YSZ media. The powder was then transferred to an alumina crucible and fired at 1100° C. in air for 5 hrs. After firing the powder was again blended for 2 hrs and fired at 1100° C. in air for 5 hrs. FIG. 77 shows excitation spectrum (solid line graph) and emission spectrum (dotted line graph) of $U^{6+}$-doped $CaAl_2Si_2O_8$.

Example 72: Preparation of $U^{6+}$-doped $BaGa_2Si_2O_8$

Figure 78:
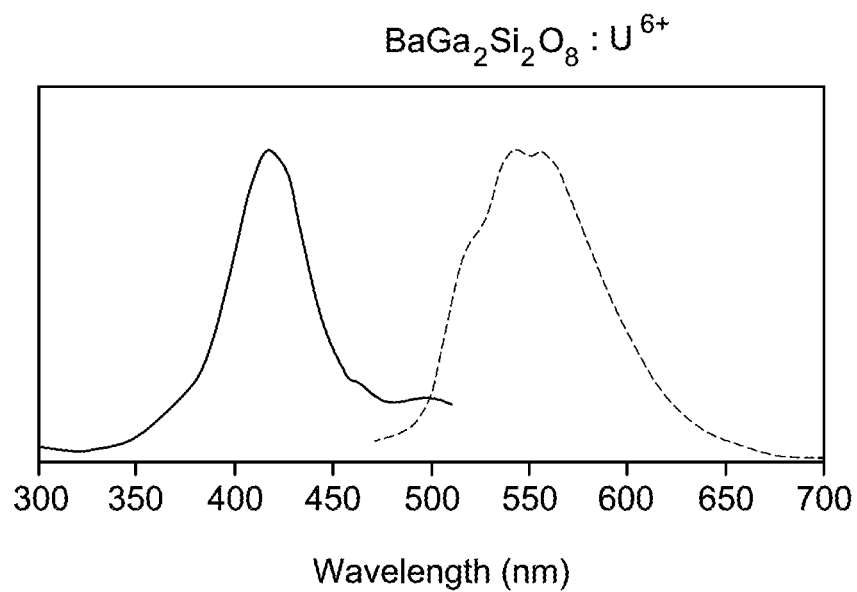
FIG. 78 shows an excitation spectrum and an emission spectrum of a green emitting $U^{6+}$-doped phosphor of formula D5.

A 3-gram sample of 1% $U^{6+}$-doped $BaGa_2Si_2O_8$ was synthesized using 1.2688 g of $BaCO_3$, 0.0175 g of $UO_2$, 1.2173 g of $Ga_2O_3$ and 0.8226 g of $SiO_2$. The sample was ball milled for 2 hrs in a Nalgene bottle using YSZ media. The powder was then transferred to an alumina crucible and fired at 1100° C. in air for 5 hrs. After firing the powder was again blended for 2 hrs and fired at 1100° C. in air for 5 hrs. FIG. 78 shows excitation spectrum (solid line graph) and emission spectrum (dotted line graph) of $U^{6+}$-doped $BaGa_2Si_2O_8$.

Example 73: Preparation of $U^{6+}$-doped $Ca_2Al_2SiO_7$

Figure 79:
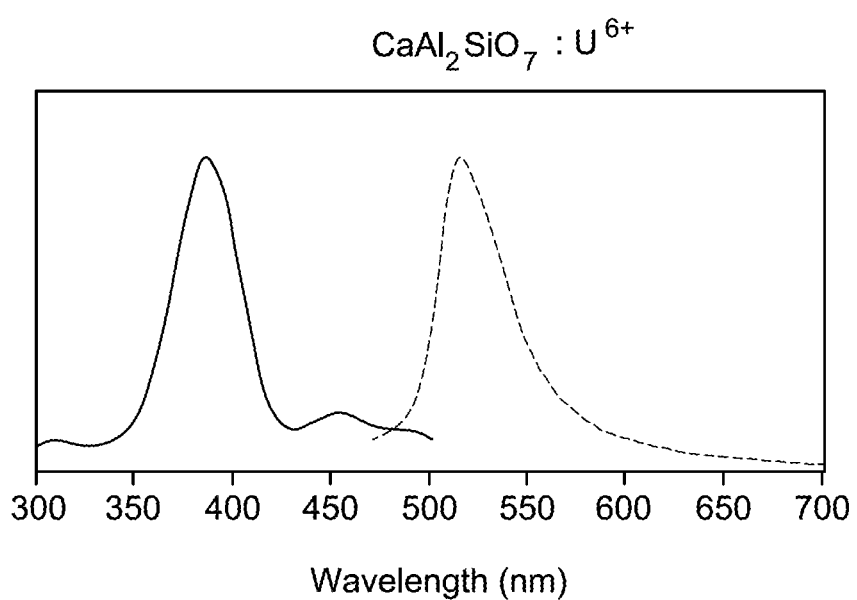
FIG. 79 shows an excitation spectrum and an emission spectrum of a green emitting $U^{6+}$-doped phosphor of formula D6.

A 3-gram sample of 1% $U^{6+}$-doped $Ca_2Al_2SiO_7$ was synthesized using 1.8315 g of $CaCO_3$, 0.0499 g of $UO_2$, 0.9423 g of $Al_2O_3$ and 0.5853 g of $SiO_2$. The sample was ball milled for 2 hrs in a Nalgene bottle using YSZ media. The powder was then transferred to an alumina crucible and fired at 1100° C. in air for 5 hrs. After firing the powder was again blended for 2 hrs and fired at 1100° C. in air for 5 hrs. FIG. 79 shows excitation spectrum (solid line graph) and emission spectrum (dotted line graph) of $U^{6+}$-doped $Ca_2Al_2SiO_7$.

Example 74: Preparation of $U^{6+}$-doped $Ca_2BO_3Cl$

Figure 80:
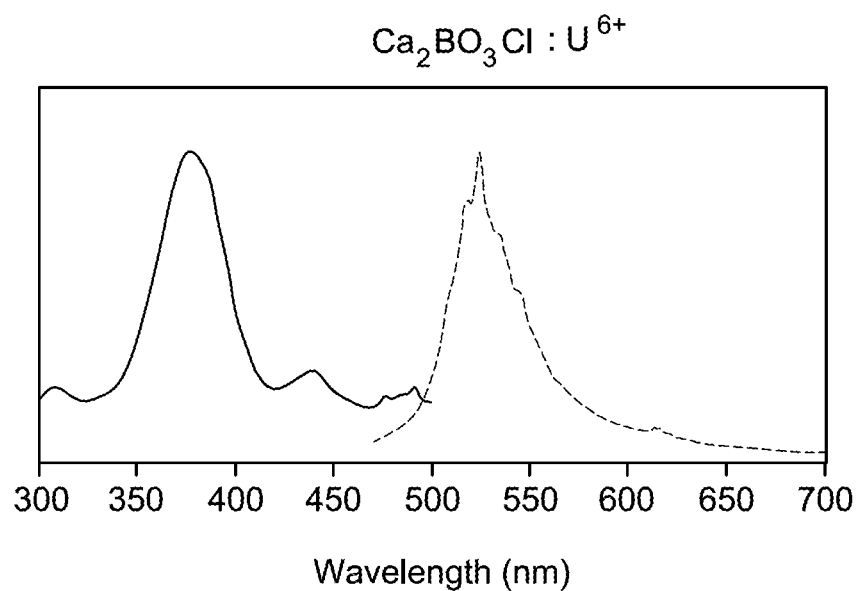
FIG. 80 shows an excitation spectrum and an emission spectrum of a green emitting $U^{6+}$-doped phosphor of formula C1.

A 3-gram sample of 1% $U^{6+}$-doped $Ca_2BO_3Cl$ was synthesized using 3.3330 g of $CaCO_3$, 0.0908 g of $UO_2$, 0.9332 g of $CaCl_2$, 0.5854 g of $B_2O_3$ and 0.0900 g of $NH_4Cl$. The sample was ball milled for 2 hrs in a Nalgene bottle using YSZ media. The powder was then transferred to an alumina crucible and fired at 800° C. in air for 5 hrs. After firing the powder was again blended for 2 hrs and fired at 850° C. in air for 5 hrs. FIG. 80 shows excitation spectrum (solid line graph) and emission spectrum (dotted line graph) of $U^{6+}$-doped $Ca_2BO_3Cl$.

Example 75: Preparation of $U^{6+}$-doped $Ca_2PO_4Cl$

Figure 81:
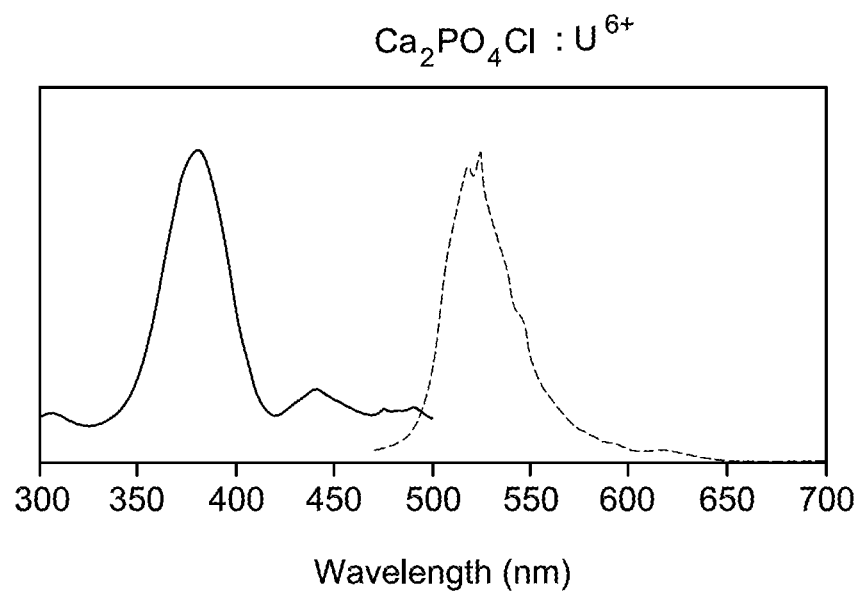
FIG. 81 shows an excitation spectrum and an emission spectrum of a green emitting $U^{6+}$-doped phosphor of formula C2.

A 3-gram sample of 1% $U^{6+}$-doped $Ca_2PO_4Cl$ was synthesized using 1.9026 g of $CaHPO_4$, 0.0755 g of $UO_2$, 0.7759 g of $CaCl_2$, 0.6718 g of $CaCO_3$ and 0.0748 g of $NH_4Cl$. The sample was ball milled for 2 hrs in a Nalgene bottle using YSZ media. The powder was then transferred to an alumina crucible and fired at 800° C. in air for 5 hrs. After firing the powder was again blended for 2 hrs and fired at 850° C. and 900° C. in air for 5 hrs with ball milling in between firing. FIG. 81 shows excitation spectrum (solid line graph) and emission spectrum (dotted line graph) of $U^{6+}$-doped $Ca_2PO_4Cl$.

Example 76: Preparation of $U^{6+}$-doped $Ca_5(PO_4)_3Cl$

Figure 82:
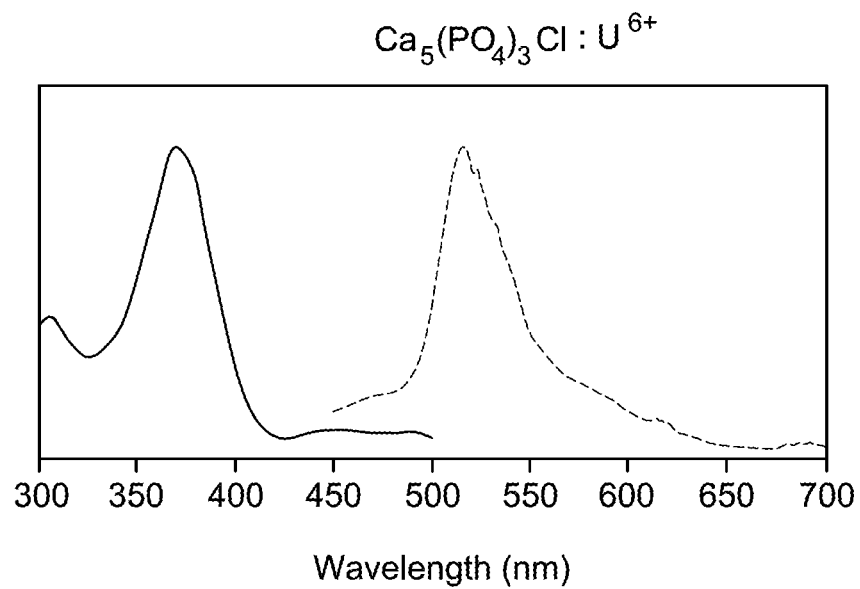
FIG. 82 shows an excitation spectrum and an emission spectrum of a green emitting $U^{6+}$-doped phosphor of formula C3.

A 3-gram sample of 1% $U^{6+}$-doped $Ca_5(PO_4)_3Cl$ was synthesized using 2.3076 g of $CaHPO_4$, 0.0763 g of $UO_2$, 0.3137 g of $CaCl_2$, 0.8205 g of $CaCO_3$ and 0.0302 g of $NH_4Cl$. The sample was ball milled for 2 hrs in a Nalgene bottle using YSZ media. The powder was then transferred to an alumina crucible and fired at 800° C. in air for 5 hrs. After firing the powder was again blended for 2 hrs and fired at 850° C. and 900° C. in air for 5 hrs with ball milling in between firing. FIG. 82 shows excitation spectrum (solid line graph) and emission spectrum (dotted line graph) of $U^{6+}$-doped $Ca_5(PO_4)_3Cl$.

Example 77: Preparation of $U^{6+}$-doped $Ba_5(VO_4)_3Cl$

Figure 83:
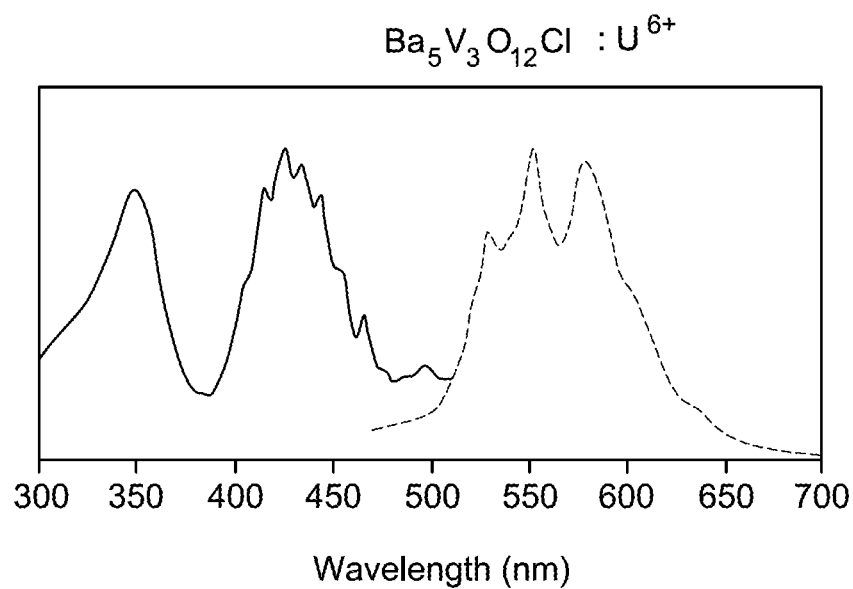
FIG. 83 shows an excitation spectrum and an emission spectrum of a green emitting $U^{6+}$-doped phosphor of formula C3.

A 3-gram sample of 1% $U^{6+}$-doped $Ba_5(VO_4)_3Cl$ was synthesized using 2.4578 g of $BaCO_3$, 0.2914 g of $BaCl_2$, 0.0378 g of $UO_2$, and 0.9821 g of $NH_4VO_3$. The sample was ball milled for 2 hrs in a Nalgene bottle using YSZ media. The powder was then transferred to an alumina crucible and fired at 300° C. in air for 5 hrs. After firing the powder was again blended for 2 hrs and fired at 600° C. and 900° C. in air for 5 hrs with ball milling in between firing. FIG. 83 shows excitation spectrum (solid line graph) and emission spectrum (dotted line graph) of $U^{6+}$-doped $Ba_5(VO_4)_3Cl$.

Example 78: Preparation of $U^{6+}$-doped SrO

Figure 84:
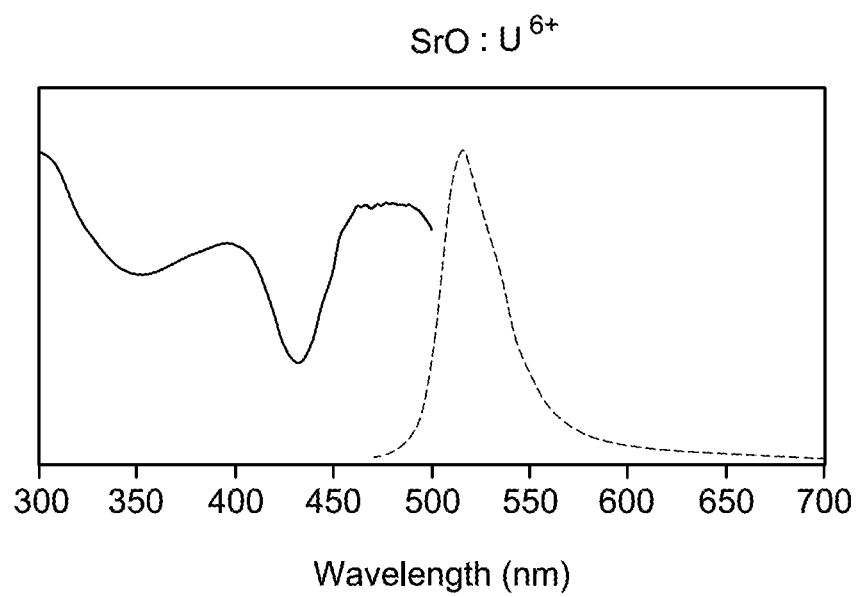
FIG. 84 shows an excitation spectrum and an emission spectrum of a green emitting $U^{6+}$-doped phosphor of formula E8.

A 3-gram sample of 1% $U^{6+}$-doped SrO was synthesized using 4.1709 g of $SrCO_3$, 0.0770 g of $UO_2$. The sample was ball milled for 2 hrs in a Nalgene bottle using YSZ media. The powder was then transferred to an alumina crucible and fired at 1100° C. in air for 5 hrs. FIG. 84 shows excitation spectrum (solid line graph) and emission spectrum (dotted line graph) of $U^{6+}$-doped SrO.

Example 79: Preparation of $U^{6+}$-doped $Cs_2CaP_2O_7$

Figure 85:
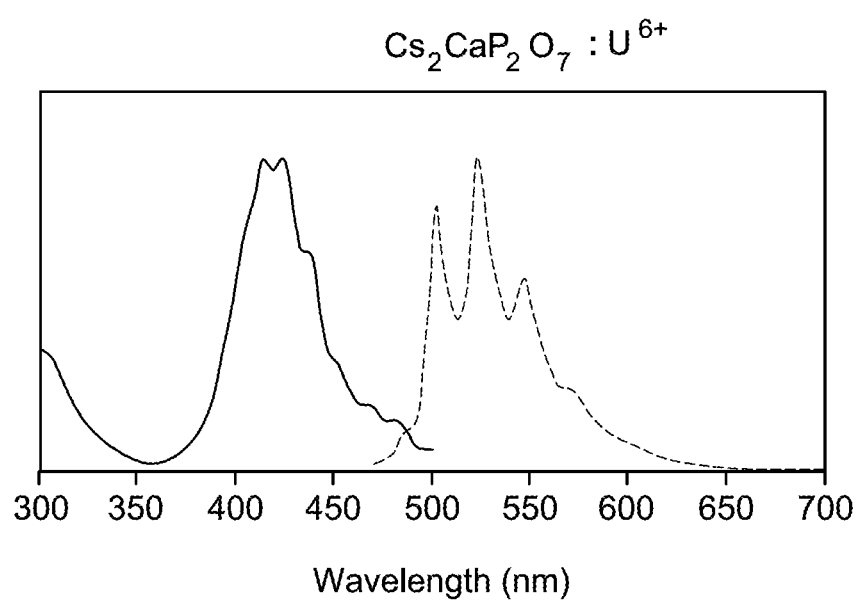
FIG. 85 shows an excitation spectrum and an emission spectrum of a green emitting $U^{6+}$-doped phosphor of formula A8.

A 3-gram sample of 1% $U^{6+}$-doped $Cs_2CaP_2O_7$ was synthesized using 2.0287 g of $Cs_2CO_3$, 0.0168 g of $UO_2$, 0.6170 g of $CaCO_3$ and 1.6445 g of DAP. The sample was ball milled for 2 hrs in a Nalgene bottle using YSZ media. The powder was then transferred to an alumina crucible and fired at 250° C. in air for 5 hrs. After firing the powder was again blended for 2 hrs and fired at 600° C. and 700° C. in air for 5 hrs with ball milling in between firing. FIG. 85 shows excitation spectrum (solid line graph) and emission spectrum (dotted line graph) of $U^{6+}$-doped $Cs_2CaP_2O_7$.

Example 80: Preparation of $U^{6+}$-doped $Cs_2SrP_2O_7$

Figure 86:
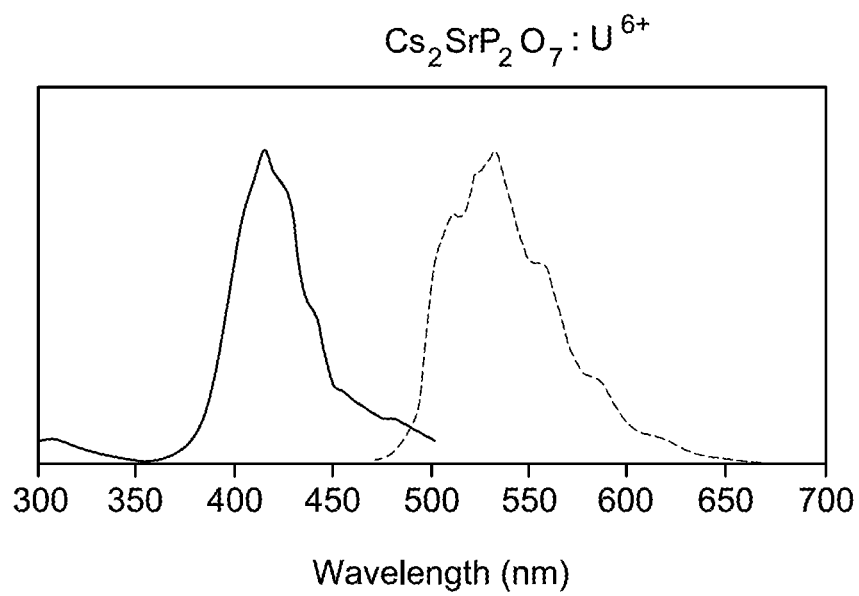
FIG. 86 shows an excitation spectrum and an emission spectrum of a green emitting $U^{6+}$-doped phosphor of formula A8.

A 3-gram sample of 1% $U^{6+}$-doped $Cs_2SrP_2O_7$ was synthesized using 1.8482 g of $Cs_2CO_3$, 0.0153 g of $UO_2$, 0.8290 g of $CaCO_3$ and 1.4982 g of DAP. The sample was ball milled for 2 hrs in a Nalgene bottle using YSZ media. The powder was then transferred to an alumina crucible and fired at 250° C. in air for 5 hrs. After firing the powder was again blended for 2 hrs and fired at 600° C. and 700° C. in air for 5 hrs with ball milling in between firing. FIG. 86 shows excitation spectrum (solid line graph) and emission spectrum (dotted line graph) of $U^{6+}$-doped $Cs_2SrP_2O_7$.

Example 81: Preparation of $U^{6+}$-doped $Cs_2CaV_2O_7$

Figure 87:
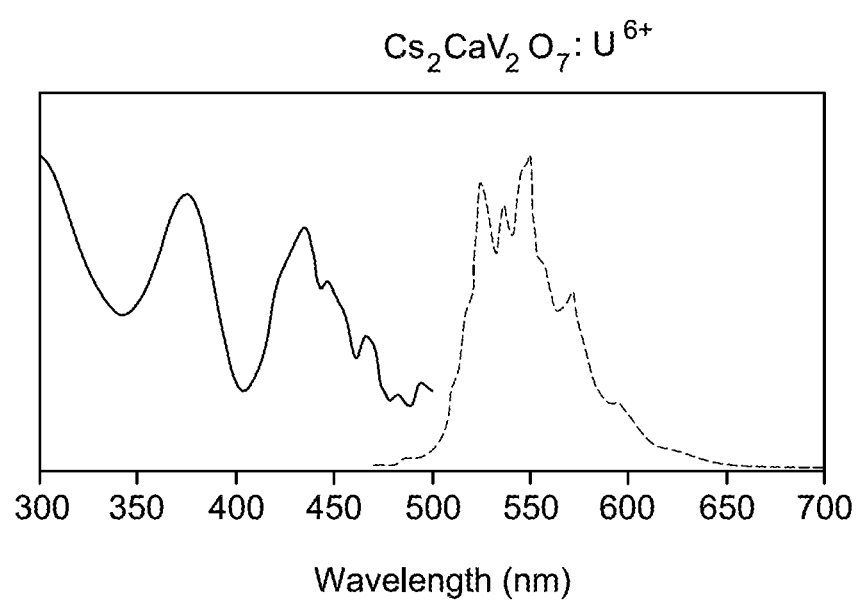
FIG. 87 shows an excitation spectrum and an emission spectrum of a green emitting $U^{6+}$-doped phosphor of formula A8.

A 3-gram sample of 1% $U^{6+}$-doped $Cs_2CaV_2O_7$ was synthesized using 1.8734 g of $Cs_2CO_3$, 0.0155 g of $UO_2$, 0.5698 g of $CaCO_3$ and 1.3452 g of $NH_4VO_3$. The sample was ball milled for 2 hrs in a Nalgene bottle using YSZ media. The powder was then transferred to an alumina crucible and fired at 250° C. in air for 5 hrs. After firing the powder was again blended for 2 hrs and fired at 600° C. in air for 5 hrs. FIG. 87 shows excitation spectrum (solid line graph) and emission spectrum (dotted line graph) of $U^{6+}$-doped $Cs_2CaV_2O_7$.

Example 82: Preparation of $U^{6+}$-doped $Cs_2SrV_2O_7$

Figure 88:
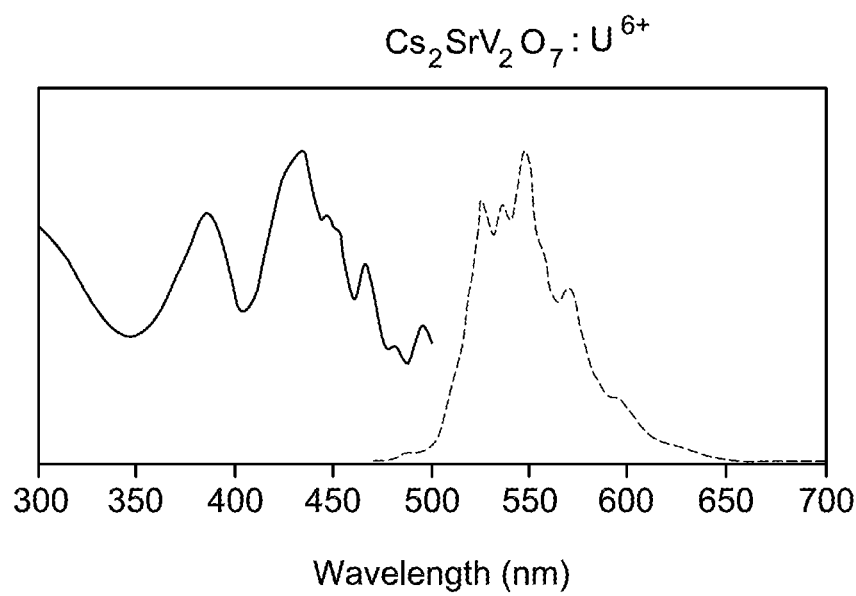
FIG. 88 shows an excitation spectrum and an emission spectrum of a green emitting $U^{6+}$-doped phosphor of formula A8.

A 3-gram sample of 1% $U^{6+}$-doped $Cs_2SrV_2O_7$ was synthesized using 1.7184 g of $Cs_2CO_3$, 0.0142 g of $UO_2$, 0.7708 g of $SrCO_3$ and 1.2339 g of $NH_4VO_3$. The sample was ball milled for 2 hrs in a Nalgene bottle using YSZ media. The powder was then transferred to an alumina crucible and fired at 250° C. in air for 5 hrs. After firing the powder was again blended for 2 hrs and fired at 600° C. in air for 5 hrs. FIG. 88 shows excitation spectrum (solid line graph) and emission spectrum (dotted line graph) of $U^{6+}$-doped $Cs_2SrV_2O_7$.

Example 83: Preparation of $U^{6+}$-doped $NaCaPO_4$

Figure 89:
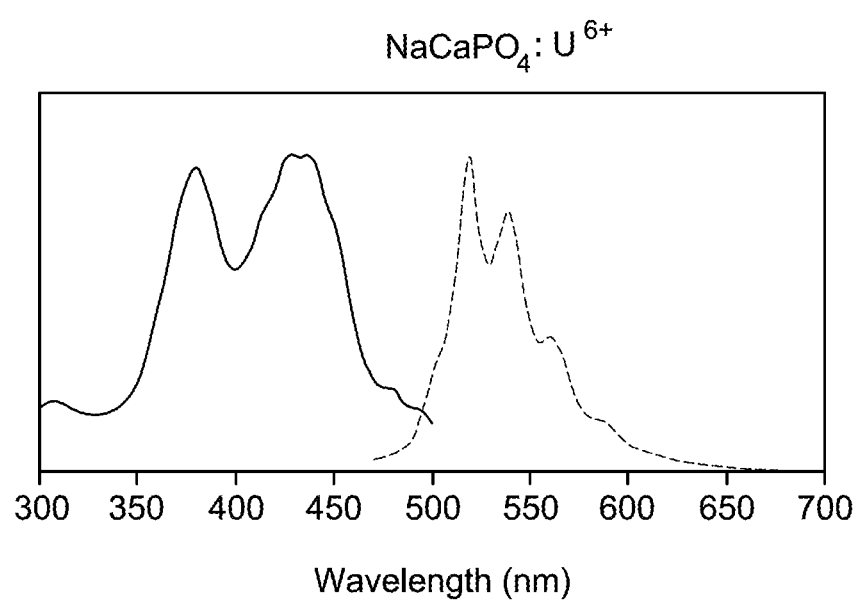
FIG. 89 shows an excitation spectrum and an emission spectrum of a green emitting $U^{6+}$-doped phosphor of formula A9.

A 3-gram sample of 1% $U^{6+}$-doped $NaCaPO_4$ was synthesized using 1.3309 g of $Na_2HPO_4$, 0.0506 g of $UO_2$, 0.9195 g of $CaCO_3$ and 1.2754 g of $CaHPO_4$. The sample was ball milled for 2 hrs in a Nalgene bottle using YSZ media. The powder was then transferred to an alumina crucible and fired at 600° C. in air for 5 hrs. After firing the powder was again blended for 2 hrs and fired at 800° C. and 900° C. in air for 5 hrs with ball milling in between firing. FIG. 89 shows excitation spectrum (solid line graph) and emission spectrum (dotted line graph) of $U^{6+}$-doped $NaCaPO_4$.

Example 84: Preparation of $U^{6+}$-doped $LiSrPO_4$

Figure 90:
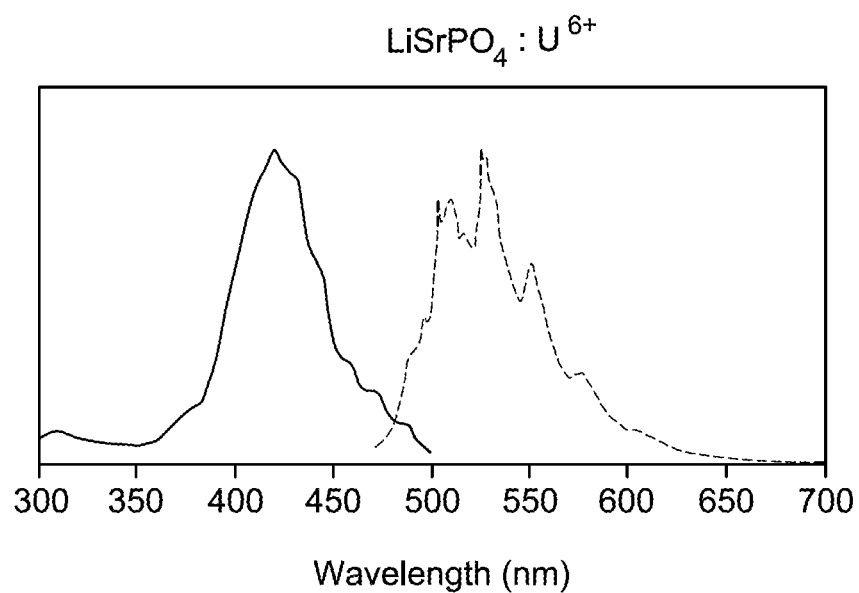
FIG. 90 shows an excitation spectrum and an emission spectrum of a green emitting $U^{6+}$-doped phosphor of formula A9.

A 3-gram sample of 1% $U^{6+}$-doped $LiSrPO_4$ was synthesized using 0.6061 g of $Li_3PO_4$, 0.0424 g of $UO_2$, 0.7488 g of $SrCO_3$ and 1.9221 g of $SrHPO_4$. The sample was ball milled for 2 hrs in a Nalgene bottle using YSZ media. The powder was then transferred to an alumina crucible and fired at 600° C. in air for 5 hrs. After firing the powder was again blended for 2 hrs and fired at 800° C. in air for 5 hrs. FIG. 90 shows excitation spectrum (solid line graph) and emission spectrum (dotted line graph) of $U^{6+}$-doped $LiSrPO_4$.

Example 85: Preparation of $U^{6+}$-doped $NaSrPO_4$

Figure 91:
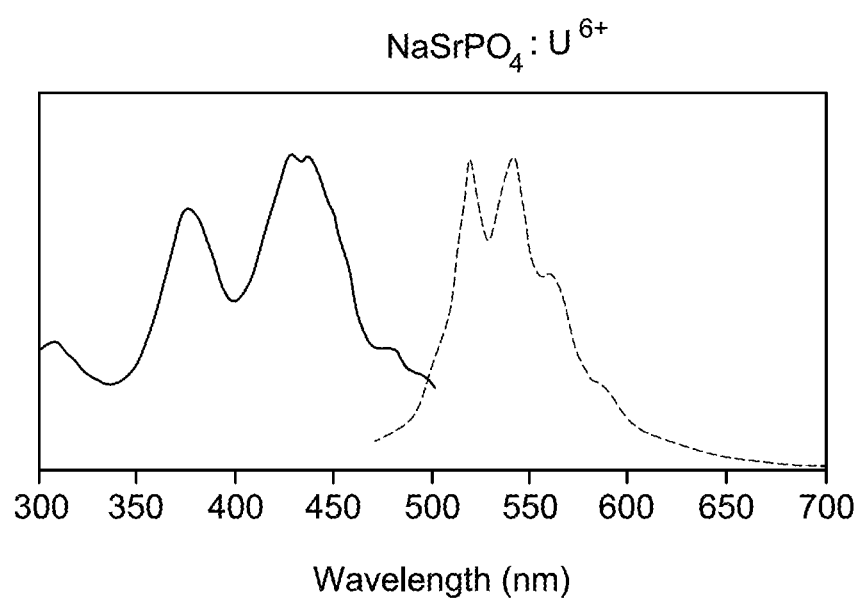
FIG. 91 shows an excitation spectrum and an emission spectrum of a green emitting $U^{6+}$-doped phosphor of formula A9.

A 3-gram sample of 1% $U^{6+}$-doped $NaSrPO_4$ was synthesized using 1.0284 g of $Na_2HPO_4$, 0.0391 g of $UO_2$, 1.0480 g of $SrCO_3$ and 1.3299 g of $SrHPO_4$. The sample was ball milled for 2 hrs in a Nalgene bottle using YSZ media. The powder was then transferred to an alumina crucible and fired at 600° C. in air for 5 hrs. After firing the powder was again blended for 2 hrs and fired at 800° C. and 900° C. in air for 5 hrs with ball milling in between firing. FIG. 91 shows excitation spectrum (solid line graph) and emission spectrum (dotted line graph) of $U^{6+}$-doped $NaSrPO_4$.

Example 86: Preparation of $U^{6+}$-doped $KSrPO_4$

Figure 92:
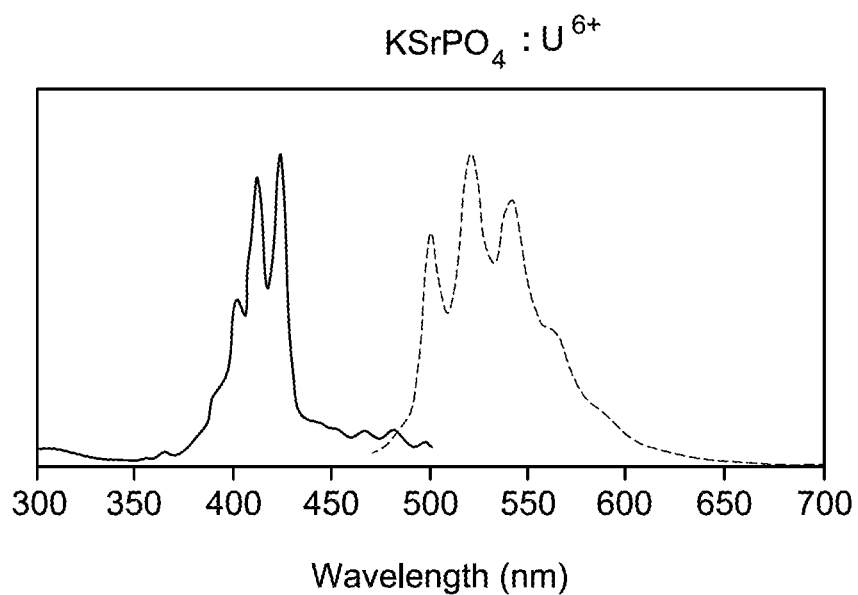
FIG. 92 shows an excitation spectrum and an emission spectrum of a green emitting $U^{6+}$-doped phosphor of formula A9.

A 3-gram sample of 1% $U^{6+}$-doped $KSrPO_4$ was synthesized using 1.1706 g of $K_2HPO_4$, 0.0363 g of $UO_2$, 0.9723 g of $SrCO_3$ and 1.2339 g of $SrHPO_4$. The sample was ball milled for 2 hrs in a Nalgene bottle using YSZ media. The powder was then transferred to an alumina crucible and fired at 600° C. in air for 5 hrs. After firing the powder was again blended for 2 hrs and fired at 800° C. and 900° C. in air for 5 hrs with ball milling in between firing. FIG. 92 shows excitation spectrum (solid line graph) and emission spectrum (dotted line graph) of $U^{6+}$-doped $KSrPO_4$.

Example 87: Preparation of $U^{6+}$-doped $KBaVO_4$

Figure 93:
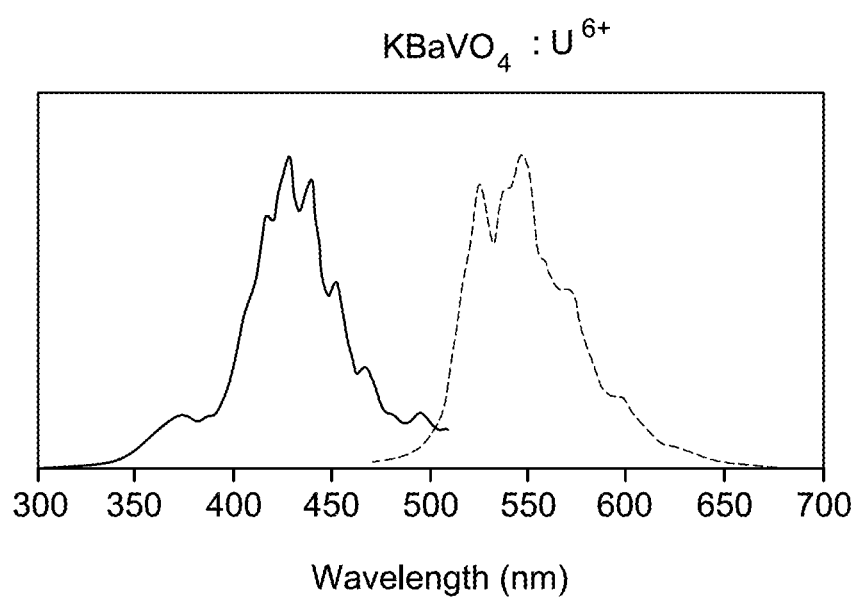
FIG. 93 shows an excitation spectrum and an emission spectrum of a green emitting $U^{6+}$-doped phosphor of formula A9.

A 3-gram sample of 1% $U^{6+}$-doped $KBaVO_4$ was synthesized using 0.7091 g of $K_2CO_3$, 0.0277 g of $UO_2$, 2.0047 g of $BaCO_3$ and 1.2003 g of $NH_4VO_3$. The sample was ball milled for 2 hrs in a Nalgene bottle using YSZ media. The powder was then transferred to an alumina crucible and fired at 300° C. in air for 5 hrs. After firing the powder was again blended for 2 hrs and fired at 600° C. and 900° C. in air for 5 hrs with ball milling in between firing. FIG. 93 shows excitation spectrum (solid line graph) and emission spectrum (dotted line graph) of $U^{6+}$-doped $KBaVO_4$.

Example 88: Preparation of $U^{6+}$-doped $KSrVO_4$

Figure 94:
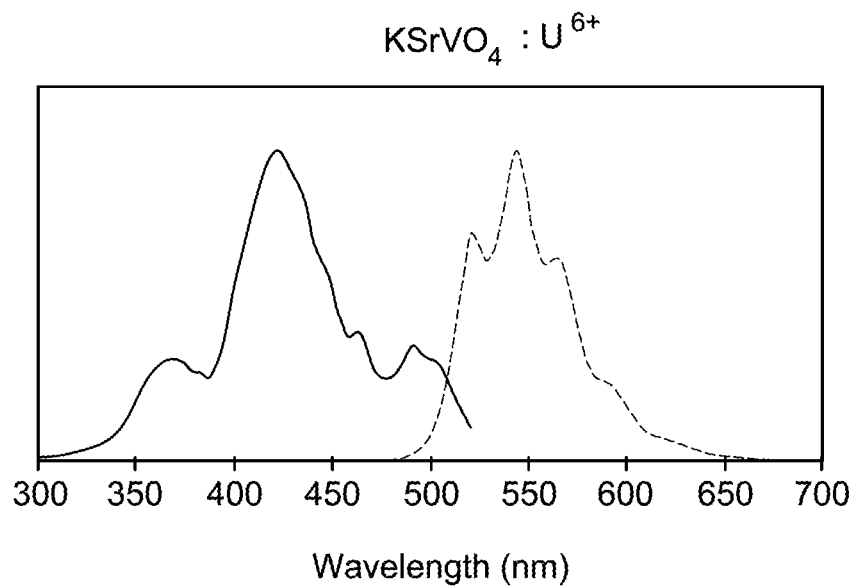
FIG. 94 shows an excitation spectrum and an emission spectrum of a green emitting $U^{6+}$-doped phosphor of formula A9.

A 3-gram sample of 1% $U^{6+}$-doped $KSrVO_4$ was synthesized using 0.8526 g of $K_2CO_3$, 0.0333 g of $UO_2$, 1.8032 g of $SrCO_3$ and 1.4432 g of $NH_4VO_3$. The sample was ball milled for 2 hrs in a Nalgene bottle using YSZ media. The powder was then transferred to an alumina crucible and fired at 500° C. in air for 5 hrs. After firing the powder was again blended for 2 hrs and fired at 800° C. in air for 5 hrs with ball milling in between firing. FIG. 94 shows excitation spectrum (solid line graph) and emission spectrum (dotted line graph) of $U^{6+}$-doped $KSrVO_4$.

Example 89: Preparation of $U^{6+}$-doped $KCaVO_4$

Figure 95:
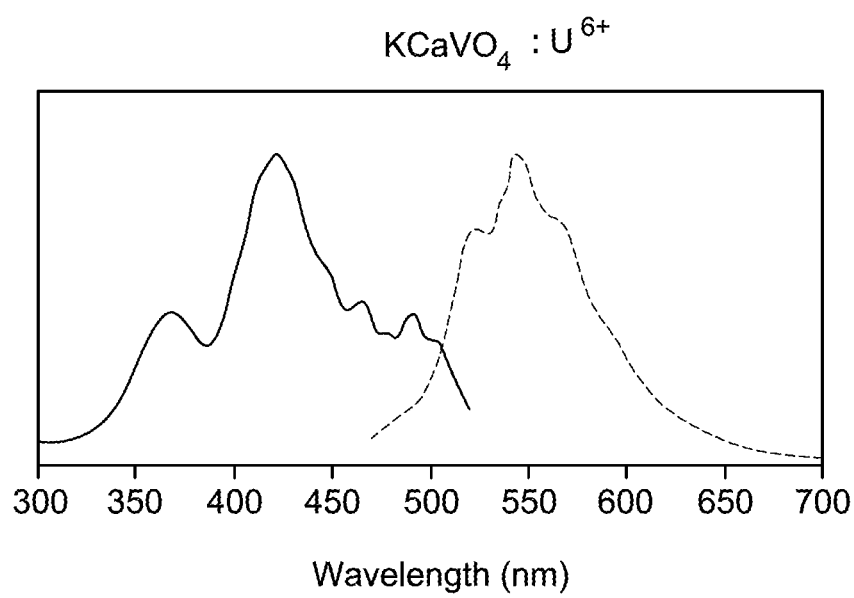
FIG. 95 shows an excitation spectrum and an emission spectrum of a green emitting $U^{6+}$-doped phosphor of formula A9.

A 3-gram sample of 1% $U^{6+}$-doped $KCaVO_4$ was synthesized using 1.0572 g of $K_2CO_3$, 0.0413 g of $UO_2$, 1.5159 g of $CaCO_3$ and 1.7896 g of $NH_4VO_3$. The sample was ball milled for 2 hrs in a Nalgene bottle using YSZ media. The powder was then transferred to an alumina crucible and fired at 500° C. in air for 5 hrs. After firing the powder was again blended for 2 hrs and fired at 800° C. in air for 5 hrs with ball milling in between firing. FIG. 95 shows excitation spectrum (solid line graph) and emission spectrum (dotted line graph) of $U^{6+}$-doped $KCaVO_4$.

Example 90: Preparation of $U^{6+}$-doped $BaP_2O_6$

Figure 96:
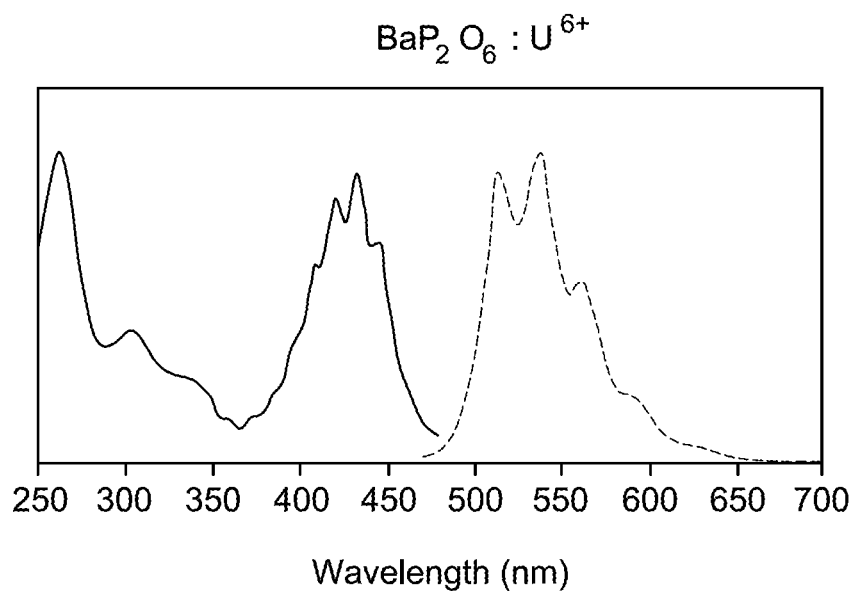
FIG. 96 shows an excitation spectrum and an emission spectrum of a green emitting $U^{6+}$-doped phosphor of formula A10.

A 3-gram sample of 1% $U^{6+}$-doped $BaP_2O_6$ was synthesized using 2.3388 g of $BaHPO_4$, 0.0273 g of $UO_2$, and 1.3505 g of DAP. The sample was ball milled for 2 hrs in a Nalgene bottle using YSZ media. The powder was then transferred to an alumina crucible and fired at 150° C. in air for 5 hrs. Then fired at 300° C., 500° C., 700° C. and finally 800° C., for 5 hrs each, with 2 hrs mill times in between firings. FIG. 96 shows excitation spectrum (solid line graph) and emission spectrum (dotted line graph) of $U^{6+}$-doped $BaP_2O_6$.

Example 91: Preparation of $U^{6+}$-doped $CaV_2O_6$

Figure 97:
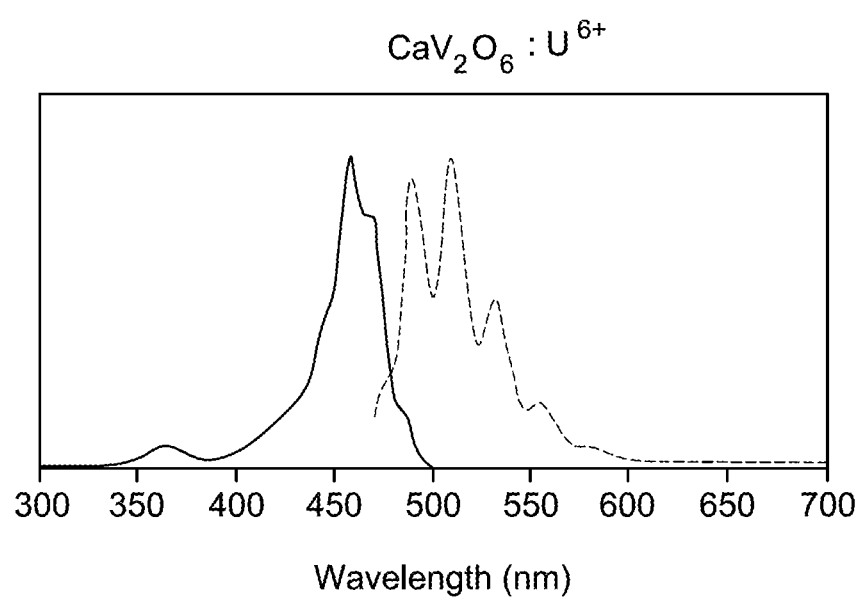
FIG. 97 shows an excitation spectrum and an emission spectrum of a green emitting $U^{6+}$-doped phosphor of formula A10.

A 3-gram sample of 1% $U^{6+}$-doped $CaV_2O_6$ was synthesized using 1.2389 g of $CaCO_3$, 0.0378 g of $UO_2$, and 2.9253 g of $NH_4VO_3$. The sample was ball milled for 2 hrs in a Nalgene bottle using YSZ media. The powder was then transferred to an alumina crucible and fired at 500° C. in air for 5 hrs. Then fired at 600° C. and finally 700° C., for 5 hrs each, with 2 hrs mill times in between firings. FIG. 97 shows excitation spectrum (solid line graph) and emission spectrum (dotted line graph) of $U^{6+}$-doped $CaV_2O$.

Example 92: Preparation of $U^{6+}$-doped $Sr_5(BO_3)_3Cl$

Figure 98:
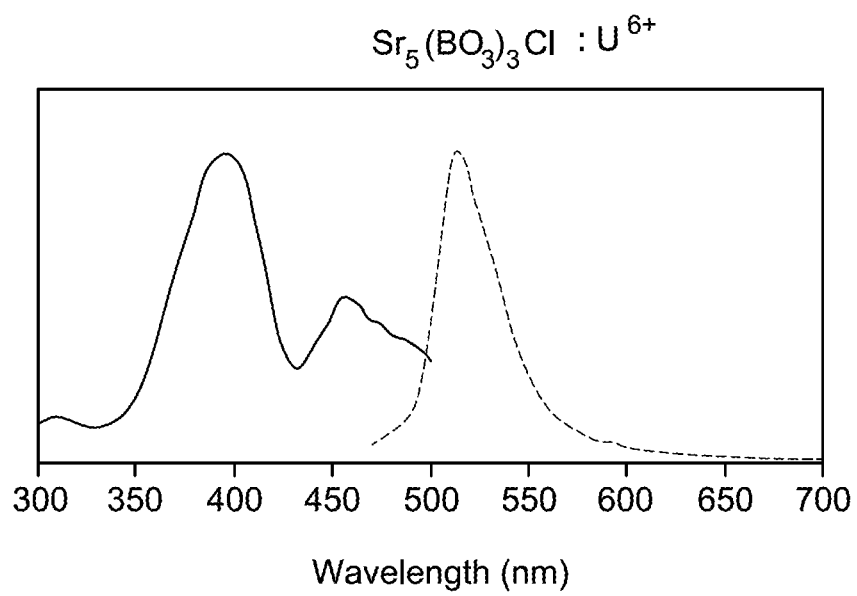
FIG. 98 shows an excitation spectrum and an emission spectrum of a green emitting $U^{6+}$-doped phosphor of formula C4.

A 3-gram sample of 1% $U^{6+}$-doped $Sr_5(BO_3)_3Cl$ was synthesized using 2.9975 g of $SrCO_3$, 0.0616 g of $UO_2$, 0.3617 g of $SrCl_2$, 0.4765 g of $B_2O_3$ and 0.0244 g of $NH_4Cl$. The sample was ball milled for 2 hrs in a Nalgene bottle using YSZ media. The powder was then transferred to an alumina crucible and fired at 800° C. in air for 5 hrs. After firing the powder was again blended for 2 hrs and fired at 850° C. in air for 5 hrs. FIG. 98 shows excitation spectrum (solid line graph) and emission spectrum (dotted line graph) of $U^{6+}$-doped $Sr_5(BO_3)_3Cl$.

Example 93: Preparation of $U^{6+}$-doped $LiSrBO_3$

Figure 99:
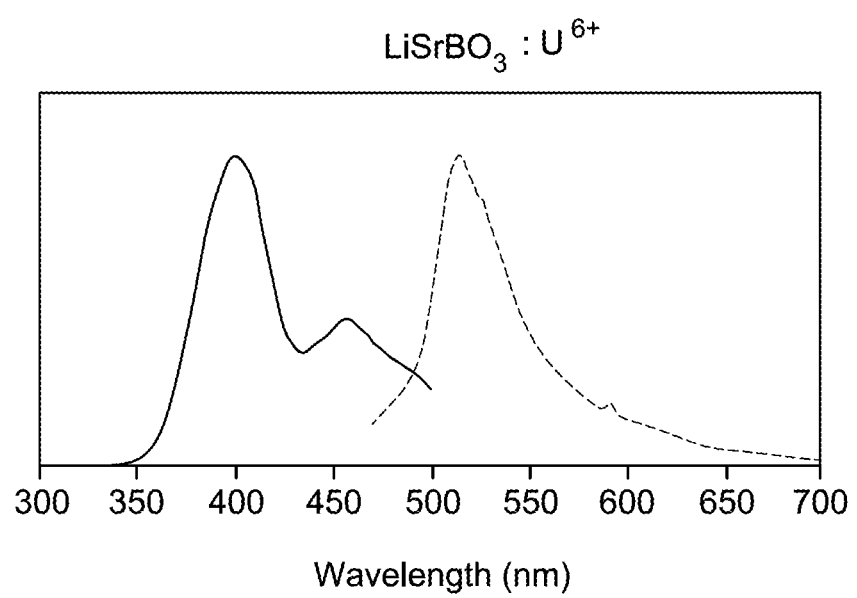
FIG. 99 shows an excitation spectrum and an emission spectrum of a green emitting $U^{6+}$-doped phosphor of formula E7.

A 3-gram sample of 1% $U^{6+}$-doped $LiSrBO_3$ was synthesized using 0.9637 g of $LiBO_2$, 0.0523 g of $UO_2$, and 2.8310 g of $SrCO_3$. The sample was ball milled for 2 hrs in a Nalgene bottle using YSZ media. The powder was then transferred to an alumina crucible and fired at 700° C. in air for 5 hrs. After firing the powder was again blended for 2 hrs and fired at 750° C. in air for 5 hrs with ball milling in between firing. FIG. 99 shows excitation spectrum (solid line graph) and emission spectrum (dotted line graph) of $U^{6+}$-doped $LiSrBO_3$.

Example 94: Preparation of $U^{6+}$-doped $LiCaBO_3$

Figure 100:
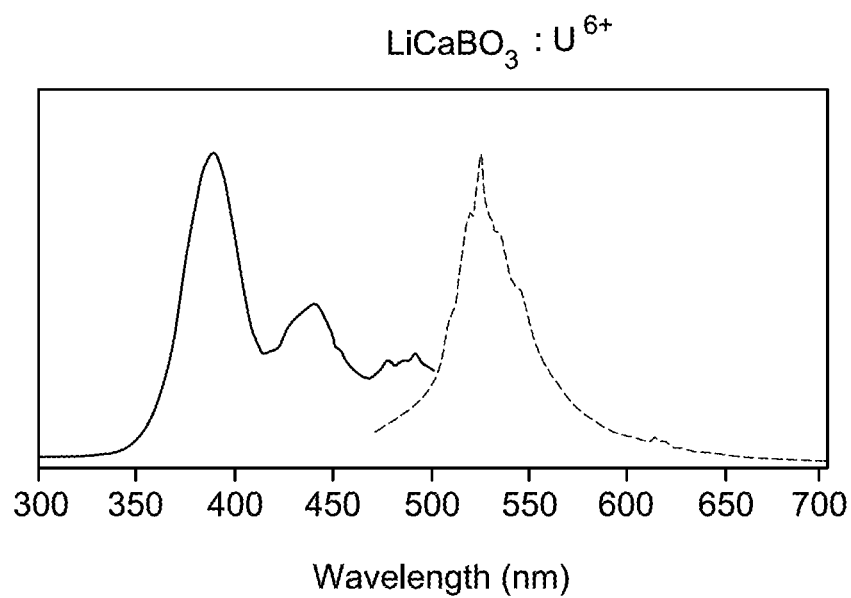
FIG. 100 shows an excitation spectrum and an emission spectrum of a green emitting $U^{6+}$-doped phosphor of formula E7.

A 3-gram sample of 1% $U^{6+}$-doped $LiCaBO_3$ was synthesized using 1.3844 g of $LiBO_2$, 0.0751 g of $UO_2$, and 2.7574 g of $CaCO_3$. The sample was ball milled for 2 hrs in a Nalgene bottle using YSZ media. The powder was then transferred to an alumina crucible and fired at 700° C. in air for 5 hrs. FIG. 100 shows excitation spectrum (solid line graph) and emission spectrum (dotted line graph) of $U^{6+}$-doped $LiCaBO_3$.

Example 95: Preparation of $U^{6+}$-doped $Sr_3GeO_4F$

Figure 101:
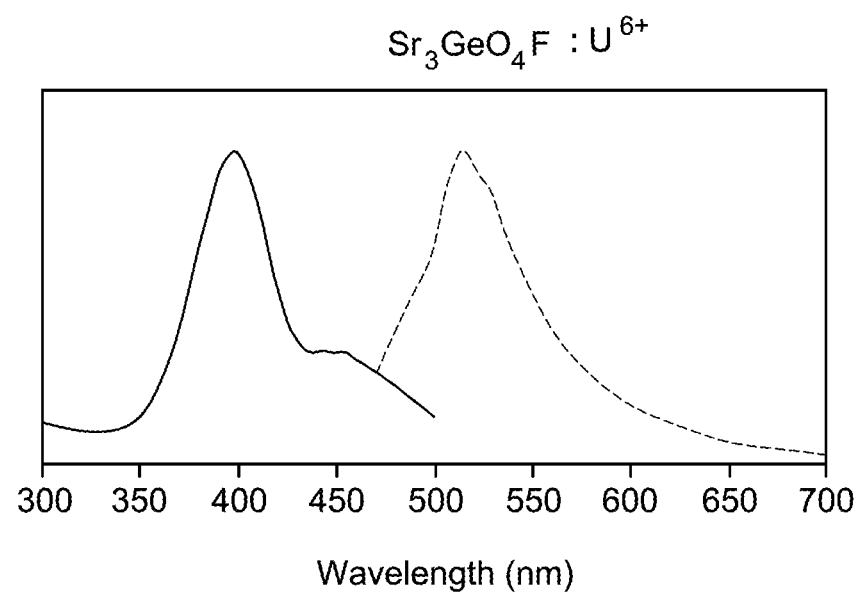
FIG. 101 shows an excitation spectrum and an emission spectrum of a green emitting $U^{6+}$-doped phosphor of formula C5.

A 3-gram sample of 1% $U^{6+}$-doped $Sr_3GeO_4F$ was synthesized using 0.4455 g of $SrF_2$, 0.0192 g of $UO_2$, 0.7418 g of $GeO_2$ and 2.5863 g of $SrCO_3$. The sample was ball milled for 2 hrs in a Nalgene bottle using YSZ media. The powder was then transferred to an alumina crucible and fired at 1000° C. in air for 5 hrs. After firing the powder was again blended for 2 hrs and fired at 1050° C. in air for 5 hrs with ball milling in between firing. FIG. 101 shows excitation spectrum (solid line graph) and emission spectrum (dotted line graph) of $U^{6+}$-doped $Sr_3GeO_4F$.

Example 96: Preparation of $U^{6+}$-doped $Ba_3BPO_7$

Figure 102:
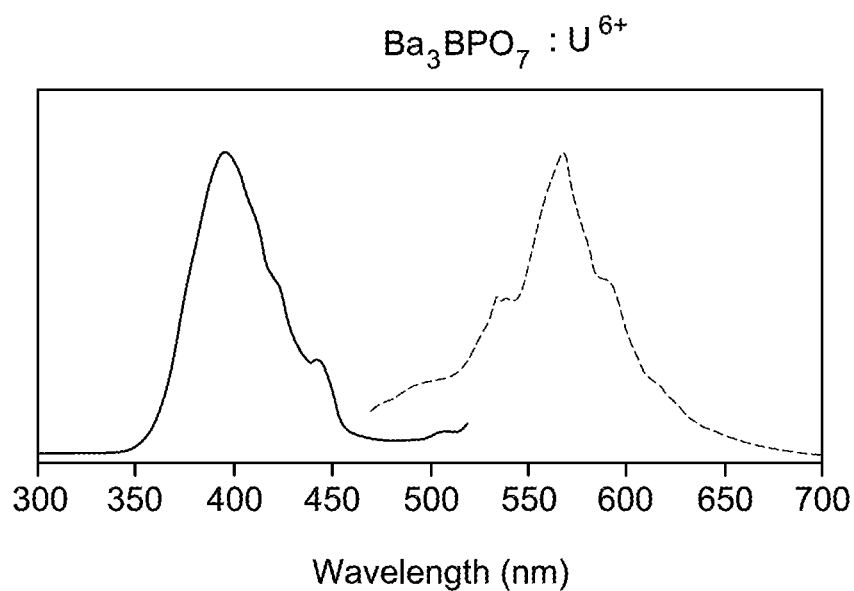
FIG. 102 shows an excitation spectrum and an emission spectrum of a green emitting $U^{6+}$-doped phosphor of formula A11.

A 3-gram sample of 1% $U^{6+}$-doped $Ba_3BPO_7$ was synthesized using 0.5579 g of $BPO_4$, 0.0427 g of $UO_2$, and 3.0914 g of $BaCO_3$. The sample was ball milled for 2 hrs in a Nalgene bottle using YSZ media. The powder was then transferred to an alumina crucible and fired at 1100° C. in air for 5 hrs. After firing the powder was again blended for 2 hrs and fired at 1100° C. in air for 5 hrs with ball milling in between firing. FIG. 102 shows excitation spectrum (solid line graph) and emission spectrum (dotted line graph) of $U^{6+}$-doped $Ba_3BPO_7$.

Example 97: Preparation of $U^{6+}$-doped $Sr_3BPO_7$

Figure 103:
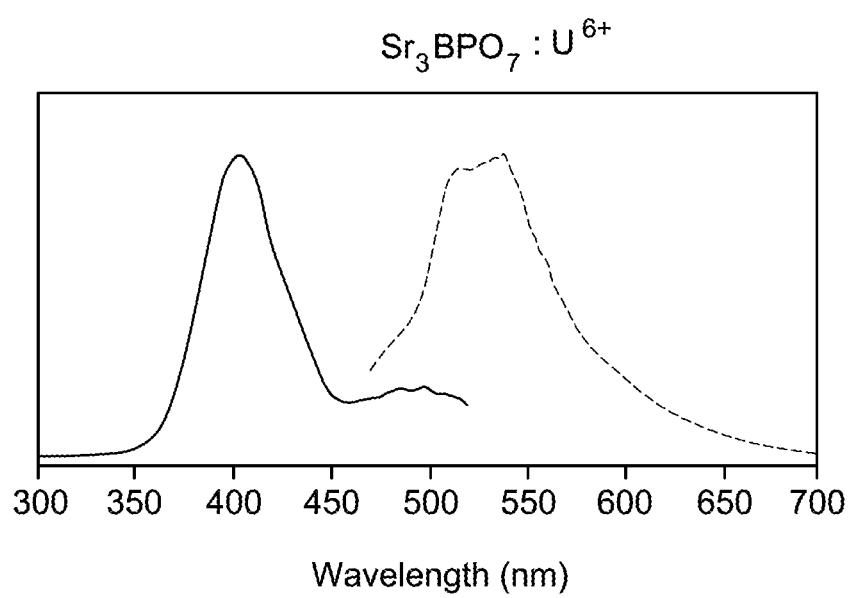
FIG. 103 shows an excitation spectrum and an emission spectrum of a green emitting $U^{6+}$-doped phosphor of formula A11.

A 3-gram sample of 1% $U^{6+}$-doped $Sr_3BPO_7$ was synthesized using 0.7535 g of $BPO_4$, 0.0577 g of $UO_2$, and 1.2333 g of $SrCO_3$. The sample was ball milled for 2 hrs in a Nalgene bottle using YSZ media. The powder was then transferred to an alumina crucible and fired at 1100° C. in air for 5 hrs. After firing the powder was again blended for 2 hrs and fired at 1100° C. in air for 5 hrs with ball milling in between firing. FIG. 103 shows excitation spectrum (solid line graph) and emission spectrum (dotted line graph) of $U^{6+}$-doped $Sr_3BPO_7$.

Example 98: Preparation of $U^{6+}$-doped $Ba_3B_6Si_2O_{16}$

Figure 104:
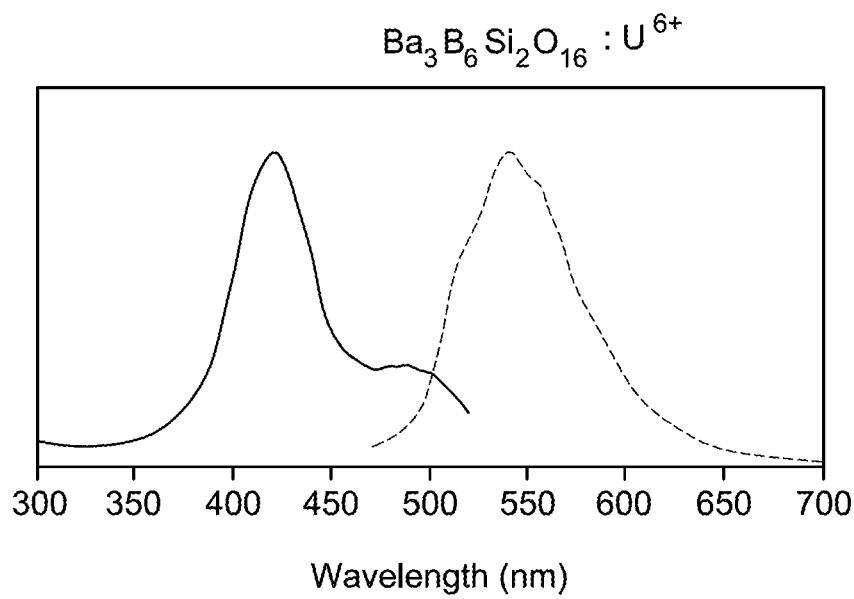
FIG. 104 shows an excitation spectrum and an emission spectrum of a green emitting $U^{6+}$-doped phosphor of formula D7.

A 3-gram sample of 1% $U^{6+}$-doped $Ba_3B_6Si_2O_{16}$ was synthesized using 0.4798 g of $SiO_2$, 0.0307 g of $UO_2$, and 2.7108 g of $BaB_2O_4$—$H_2O$. The sample was ball milled for 2 hrs in a Nalgene bottle using YSZ media. The powder was then transferred to an alumina crucible and fired at 750° C. in air for 5 hrs. FIG. 104 shows excitation spectrum (solid line graph) and emission spectrum (dotted line graph) of $U^{6+}$-doped $Ba_3B_6Si_2O_{16}$.

Example 99: Preparation of $U^{6+}$-doped $Sr_3B_2SiO_8$

Figure 105:
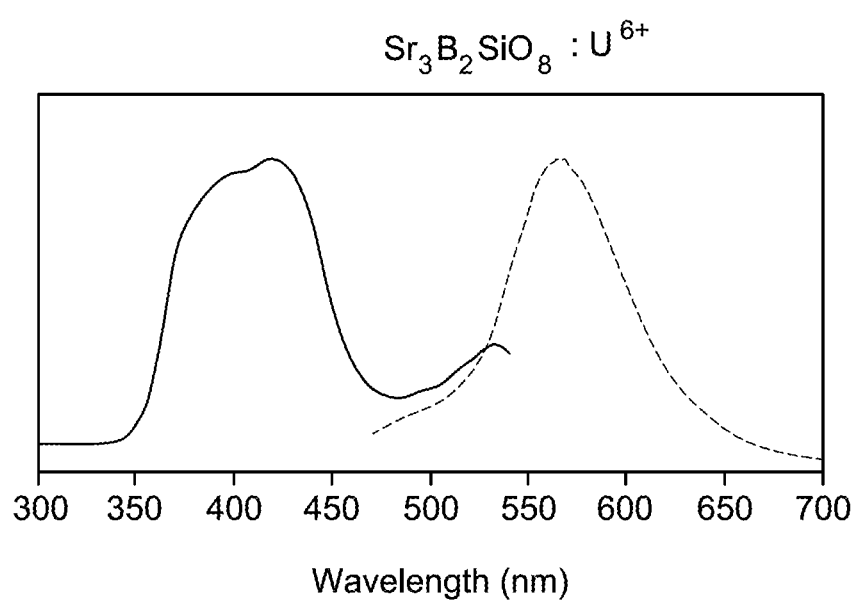
FIG. 105 shows an excitation spectrum and an emission spectrum of a green emitting $U^{6+}$-doped phosphor of formula D8.

A 3-gram sample of 1% $U^{6+}$-doped $Sr_3B_2SiO_8$ was synthesized using 0.4269 g of $SiO_2$, 0.5162 g of $B_2O_3$ 0.0546 g of $UO_2$, and 2.9554 g of $SrCO_3$. The sample was ball milled for 2 hrs in a Nalgene bottle using YSZ media. The powder was then transferred to an alumina crucible and fired at 500° C. in air for 5 hrs. Then fired at 900° C. and finally 1100° C., for 5 hrs each, with 2 hrs mill times in between firings. FIG. 105 shows excitation spectrum (solid line graph) and emission spectrum (dotted line graph) of $U^{6+}$-doped $Sr_3B_2SiO_8$.

Example 100: Preparation of $U^{6+}$-doped $Ca_{11}B_2Si_4O_{22}$

Figure 106:
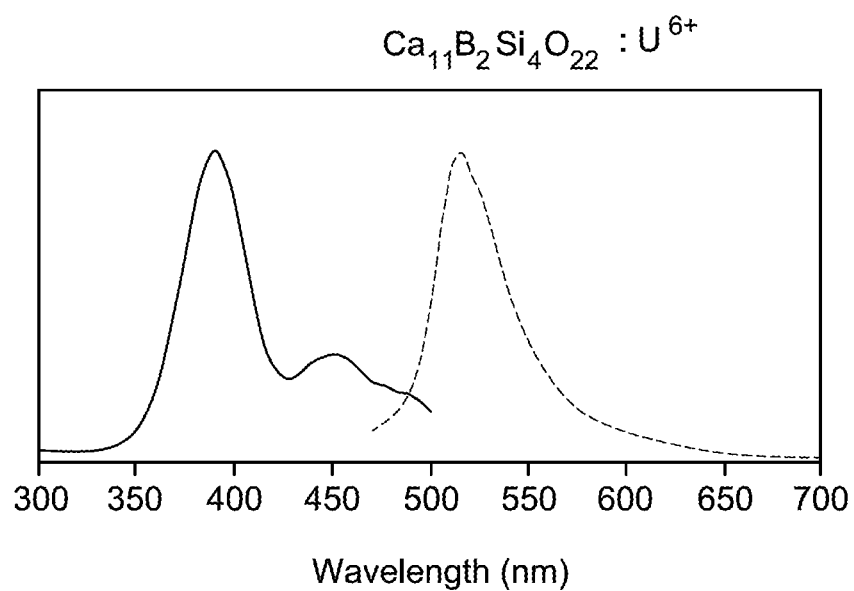
FIG. 106 shows an excitation spectrum and an emission spectrum of a green emitting $U^{6+}$-doped phosphor of formula D9.

A 3-gram sample of 1% $U^{6+}$-doped $Ca_{11}B_2Si_4O_{22}$ was synthesized using 0.8012 g of $SiO_2$, 0.2422 g of $B_2O_3$ 0.0939 g of $UO_2$, and 3.4472 g of $CaCO_3$. The sample was ball milled for 2 hrs in a Nalgene bottle using YSZ media. The powder was then transferred to an alumina crucible and fired at 500° C. in air for 5 hrs. Then fired at 900° C. and finally 1100° C., for 5 hrs each, with 2 hrs mill times in between firings. FIG. 106 shows excitation spectrum (solid line graph) and emission spectrum (dotted line graph) of $U^{6+}$-doped $Ca_{11}B_2Si_4O_{22}$.

Example 101: Preparation of $U^{6+}$-doped $Sr_3Al_{10}SiO_{20}$

Figure 107:
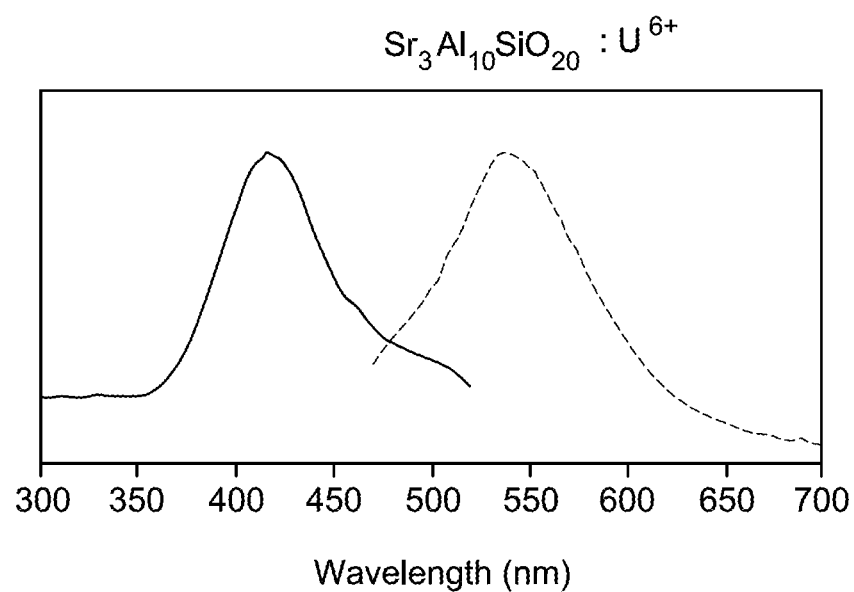
FIG. 107 shows an excitation spectrum and an emission spectrum of a green emitting $U^{6+}$-doped phosphor of formula D10.

A 3-gram sample of 1% $U^{6+}$-doped $Sr_3Al_{10}SiO_{20}$ was synthesized using 0.2146 g of $SiO_2$, 1.7276 g of $Al_2O_3$, 0.0275 g of $UO_2$, and 1.4859 g of $SrCO_3$. The sample was ball milled for 2 hrs in a Nalgene bottle using YSZ media. The powder was then transferred to an alumina crucible and fired at 1100° C. in air for 5 hrs. Then fired at 1100° C., for 5 hrs each, with 2 hrs mill times in between firings. FIG. 107 shows excitation spectrum (solid line graph) and emission spectrum (dotted line graph) of $U^{6+}$-doped $Sr_3Al_{10}SiO_{20}$.

Example 102: Preparation of $U^{6+}$-doped $Ba_{6.5}Al_{11}Si_5O_{33}$

A 3-gram sample of 1% $U^{6+}$-doped $Ba_{6.5}Al_{11}Si_5O_{33}$ was synthesized using 0.5096 g of $SiO_2$, 0.9024 g of $Al_2O_3$, 0.0282 g of $UO_2$, and 2.0435 g of $BaCO_3$. The sample was ball milled for 2 hrs in a Nalgene bottle using YSZ media.

Figure 108:
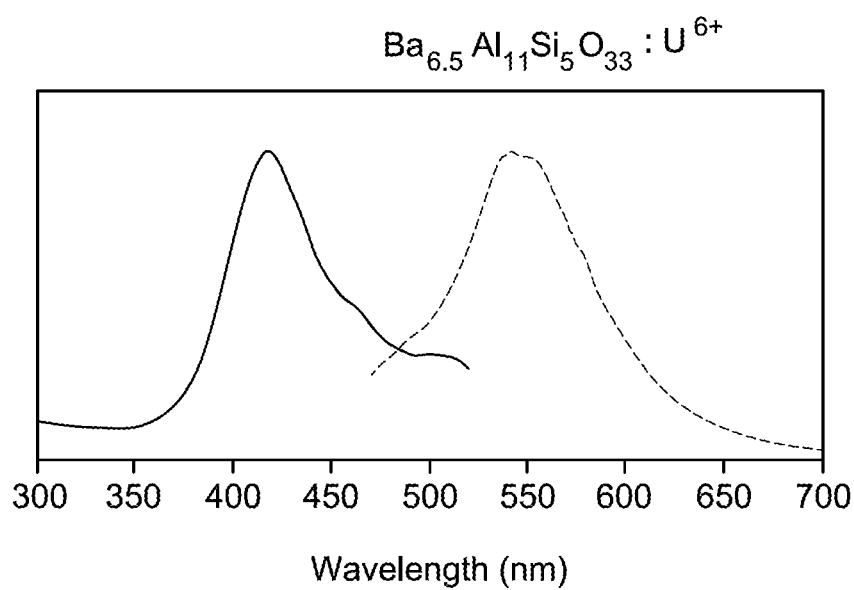
FIG. 108 shows an excitation spectrum and an emission spectrum of a green emitting $U^{6+}$-doped phosphor of formula D11.

The powder was then transferred to an alumina crucible and fired at 1100° C. in air for 5 hrs. Then fired at 1100° C., for 5 hrs each, with 2 hrs mill times in between firings. FIG. 108 shows excitation spectrum (solid line graph) and emission spectrum (dotted line graph) of $U^{6+}$-doped $Ba_{6.5}Al_{11}Si_5O_{33}$.

Example 103: Preparation of $U^{6+}$-doped $Sr_{10}Ga_6Sc_4O_{25}$

Figure 109:
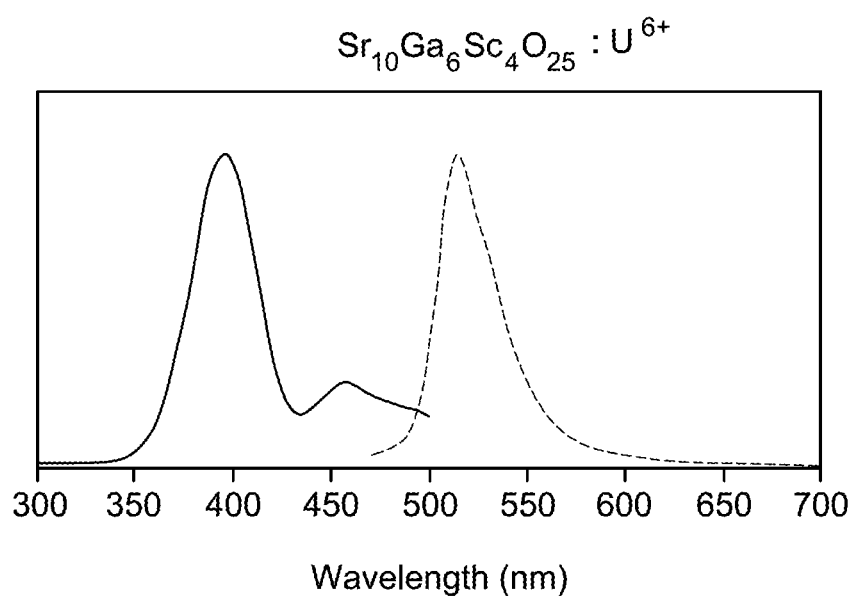
FIG. 109 shows an excitation spectrum and an emission spectrum of a green emitting $U^{6+}$-doped phosphor of formula E9.

A 3-gram sample of 1% $U^{6+}$-doped $Sr_{10}Ga_6Sc_4O_{25}$ was synthesized using 0.8929 g of $Ga_2O_3$, 0.4380 g of $Sc_2O_3$, 0.0429 g of $UO_2$, and 2.3207 g of $SrCO_3$. The sample was ball milled for 2 hrs in a Nalgene bottle using YSZ media. The powder was then transferred to an alumina crucible and fired at 1100° C. in air for 5 hrs. Then fired at 1100° C., for 5 hrs each, with 2 hr mill times in between firings. FIG. 109 shows excitation spectrum (solid line graph) and emission spectrum (dotted line graph) of $U^{6+}$-doped $Sr_{10}Ga_6Sc_4O_{25}$.

Example 104: Preparation of $U^{6+}$-doped $LiBa_2B_5O_{10}$

Figure 110:
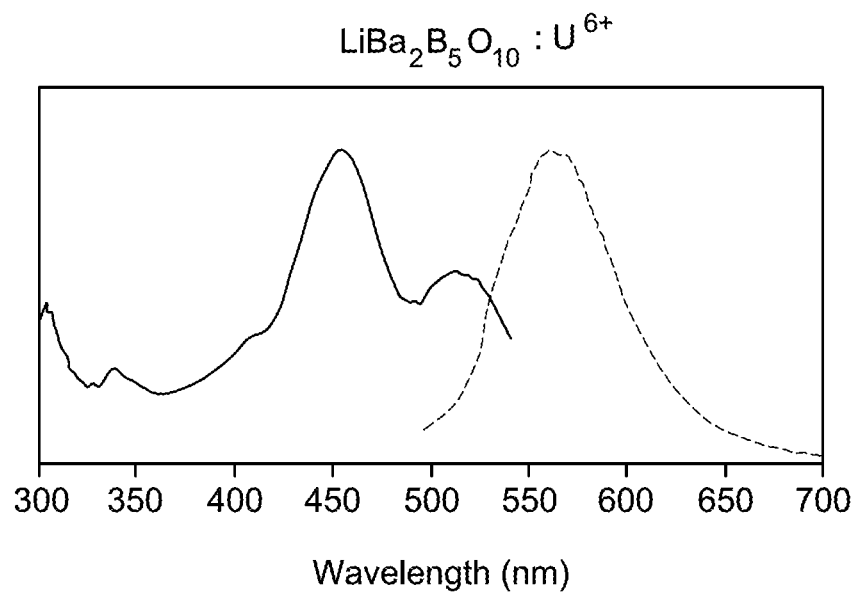
FIG. 110 shows an excitation spectrum and an emission spectrum of a green emitting $U^{6+}$-doped phosphor of formula E10.

A 3-gram sample of 1% $U^{6+}$-doped $LiBa_2B_5O_{10}$ was synthesized using 0.2999 g of $LiBO_2$, 0.0625 g of $UO_2$, and 2.8761 g of $BaB_2O_4$—$H_2O$. The sample was ball milled for 2 hrs in a Nalgene bottle using YSZ media. The powder was then transferred to an alumina crucible and fired at 500° C. in air for 5 hrs. After firing the powder was again blended for 2 hrs and fired at 600° C. in air for 5 hrs with ball milling in between firing. FIG. 110 shows excitation spectrum (solid line graph) and emission spectrum (dotted line graph) of $U^{6+}$-doped $LiBa_2B_5O_{10}$.

Example 105: Preparation of $U^{6+}$-doped $LiSr_4B_3O_9$

Figure 111:
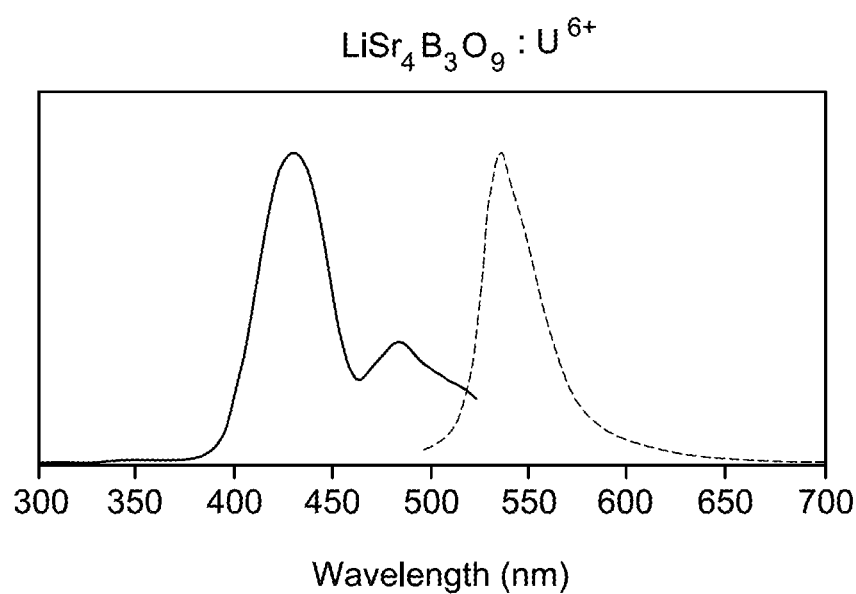
FIG. 111 shows an excitation spectrum and an emission spectrum of a green emitting $U^{6+}$-doped phosphor of formula E11.

A 3-gram sample of 1% $U^{6+}$-doped $LiSr_4B_3O_9$ was synthesized using 0.4699 g of $U_2B_4O_7$, 0.0600 g of $UO_2$, 3.2487 g of $SrCO_3$ and 0.1934 g of $B_2O_3$. The sample was ball milled for 2 hrs in a Nalgene bottle using YSZ media. The powder was then transferred to an alumina crucible and fired at 500° C. in air for 5 hrs. After firing the powder was again blended for 2 hrs and fired at 600° C. and 700° C. in air for 5 hrs with ball milling in between firing. FIG. 111 shows excitation spectrum (solid line graph) and emission spectrum (dotted line graph) of $U^{6+}$-doped $LiSr_4B_3O_9$.

While only certain features of the disclosure have been illustrated and described herein, many modifications and changes will occur to those skilled in the art. It is, therefore, to be understood that the appended claims are intended to cover all such modifications and changes as fall within the true spirit of the disclosure.

The invention claimed is:

1. A device comprising an LED light source optically coupled to a green-emitting $U^{6+}$-doped phosphor selected from the group consisting of $U^{6+}$-doped phosphate-vanadate phosphors, $U^{6+}$-doped halide phosphors, $U^{6+}$-doped oxyhalide phosphors, $U^{6+}$-doped silicate-germanate phosphors, $U^{6+}$-doped alkali earth oxide phosphors, and combinations thereof;
wherein,
the $U^{6+}$-doped phosphate-vanadate phosphors are selected from the group consisting of:
(A2) $Ba_{2-x}[Sr, Ca, Mg]_x[P_{1-y}, V_y]_2O_7$: $U^{6+}$; wherein $0 \leq x \leq 2$, $0 \leq y \leq 1$, and $x \neq 0$ when $y=0$;
(A3) $[Ba, Sr, Ca, Mg]_4[P, V]_2O_9$: $U^{6+}$;
(A4) $[Ba, Sr, Ca, Mg]_3[P, V]_4O_{13}$: $U^{6+}$;
(A5) $[Ba, Sr, Ca, Mg]_4[B, Al, Ga, In][P, V]O_8$: $U^{6+}$;
(A6) $[Ba, Sr, Ca, Mg]_6[B, Al, Ga, In]_5[P, V]_5O_{26}$: $U^{6+}$;
(A8) $A_2[Ba, Sr, Ca, Mg][P, V]_2O_7$: $U^{6+}$;
(A9) $A[Ba, Sr, Ca, Mg][P, V]O_4$: $U^{6+}$;
(A10) $[Ba, Sr, Ca, Mg][P, V]_2O_6$: $U^{6+}$;
(A11) $[Ba, Sr, Ca, Mg]_3[B, Al, Ga, In][P, V]O_7$: $U^{6+}$; and
(A12) $[Ba, Sr, Ca, Mg]_{10}[P, V]_6O_{25}$: $U^{6+}$;
the $U^{6+}$-doped halide phosphors are selected from the group consisting of:
(B2) $A[Ba, Sr, Ca, Mg]X_3$: $U^{6+}$; and
(B3) $[Ba, Sr, Ca, Mg]_2X_4$: $U^{6+}$;
the $U^{6+}$-doped oxyhalide phosphors are selected from the group consisting of:
(C1) $[Ba, Sr, Ca, Mg]_2[B, Al, Ga, In]O_3X$: $U^{6+}$;
(C2) $[Ba, Sr, Ca, Mg]_2[P, V]O_4X$: $U^{6+}$;
(C4) $[Ba, Sr, Ca, Mg]_5[B, Al, Ga, In]_3O_9X$: $U^{6+}$; and
(C5) $[Ba, Sr, Ca, Mg]_3[Si, Ge]O_4X$: $U^{6+}$;
the $U^{6+}$-doped silicate-germanate phosphors are selected from the group consisting of:
(D1) $[Ba, Sr, Ca, Mg]_2[Si, Ge]O_4$: $U^{6+}$;
(D2) $[Ba, Sr, Ca, Mg]_3[Si, Ge]O_5$: $U^{6+}$;
(D3) $[Ba, Sr, Ca, Mg]_3[Si, Ge]_2O_7$: $U^{6+}$;
(D4) $[Ba, Sr, Ca, Mg][Si, Ge]O_3$: $U^{6+}$;
(D5) $[Ba, Sr, Ca, Mg][B, Al, Ga, In]_2[Si, Ge]_2O_8$: $U^{6+}$;
(D6) $[Ba, Sr, Ca, Mg]_2[B, Al, Ga, In]_2[Si, Ge]O_7$: $U^{6+}$;
(D7) $[Ba, Sr, Ca, Mg]_3[B, Al, Ga, In]_6[Si, Ge]_2O_{16}$: $U^{6+}$;
(D8) $[Ba, Sr, Ca, Mg]_3[B, Al, Ga, In]_2[Si, Ge]O_8$: $U^{6+}$;
(D9) $[Ba, Sr, Ca, Mg]_{11}[B, Al, Ga, In]_2[Si, Ge]_4O_{22}$: $U^{6+}$;
(D10) $[Ba, Sr, Ca, Mg]_3[B, Al, Ga, In]_{10}[Si, Ge]O_{20}$: $U^{6+}$; and
(D11) $[Ba, Sr, Ca, Mg]_{6.5}[B, Al, Ga, In]_{11}[Si, Ge]_5O_{33}$: $U^{6+}$; and
the $U^{6+}$-doped alkali earth oxide phosphors are selected from the group consisting of:
(E1) $[Ba, Sr, Ca, Mg][B, Al, Ga, In]_4O_7$: $U^{6+}$;
(E2) $[Ba, Sr, Ca, Mg]_3[B, Al, Ga, In]_2O_6$: $U^{6+}$;
(E3) $[Ba, Sr, Ca, Mg][B, Al, Ga, In]_6O_{10}$: $U^{6+}$;
(E4) $[Ba, Sr, Ca, Mg][B, Al, Ga, In]_2O_4$: $U^{6+}$;
(E5) $[Ba, Sr, Ca, Mg]_4[B, Al, Ga, In]_2O_7$: $U^{6+}$;
(E6) $[Ba, Sr, Ca, Mg]_{12}[B, Al, Ga, In]_{14}O_{33}$: $U^{6+}$;
(E7) $A[Ba, Sr, Ca, Mg][B, Al, Ga, In]O_3$: $U^{6+}$;
(E9) $[Ba, Sr, Ca, Mg]_2[B, Al, Ga, In, Sc]_2O_5$: $U^{6+}$;
(E10) $A[Ba, Sr, Ca, Mg]_2[B, Al, Ga, In]_5O_{10}$: $U^{6+}$; and
(E11) $A[Ba, Sr, Ca, Mg]_4[B, Al, Ga, In]_3O_9$: $U^{6+}$;
wherein,
A is Li, Na, K, Rb, Cs, or a combination thereof
X is F, Cl, Br or a combination thereof.

2. A device according to claim 1, wherein the green-emitting $U^{6+}$-doped phosphor is a $U^{6+}$-doped phosphate-vanadate phosphor selected from the group consisting of:
(A2) $Ba_{2-x}[Sr, Ca, Mg]_x[P_{1-y}, V_y]_2O_7$: $U^{6+}$; wherein $0 \leq x \leq 2$, $0 \leq y \leq 1$, and $x \neq 0$ when $y=0$;
(A3) $[Ba, Sr, Ca, Mg]_4[P, V]_2O_9$: $U^{6+}$;
(A4) $[Ba, Sr, Ca, Mg]_3[P, V]_4O_{13}$: $U^{6+}$;
(A5) $[Ba, Sr, Ca, Mg]_4[B, Al, Ga, In][P, V]O_8$: $U^{6+}$;
(A6) $[Ba, Sr, Ca, Mg]_6[B, Al, Ga, In]_5[P, V]_5O_{26}$: $U^{6+}$;
(A8) $A_2[Ba, Sr, Ca, Mg][P, V]_2O_7$: $U^{6+}$;
(A9) $A[Ba, Sr, Ca, Mg][P, V]O_4$: $U^{6+}$;
(A10) $[Ba, Sr, Ca, Mg][P, V]_2O_6$: $U^{6+}$;
(A11) $[Ba, Sr, Ca, Mg]_3[B, Al, Ga, In][P, V]O_7$: $U^{6+}$; and
(A12) $[Ba, Sr, Ca, Mg]_{10}[P, V]_6O_{25}$: $U^{6+}$.

3. A device according to claim 1, wherein the green-emitting $U^{6+}$-doped phosphor is a $U^{6+}$-doped halide phosphor selected from the group consisting of:

(B2) A[Ba, Sr, Ca, Mg]X$_3$: U$^{6+}$; and
(B3) [Ba, Sr, Ca, Mg]$_2$X$_4$: U$^{6+}$.

4. A device according to claim 1, wherein the green-emitting U$^{6+}$-doped phosphor is a U$^{6+}$-doped oxyhalide phosphor selected from the group consisting of:
(C1) [Ba, Sr, Ca, Mg]$_2$[B, Al, Ga, In]O$_3$X: U$^{6+}$;
(C2) [Ba, Sr, Ca, Mg]$_2$[P, V]O$_4$X: U$^{6+}$;
(C4) [Ba, Sr, Ca, Mg]$_5$[B, Al, Ga, In]$_3$O$_9$X: U$^{6+}$; and
(C5) [Ba, Sr, Ca, Mg]$_3$[Si, Ge]O$_4$X: U$^{6+}$.

5. A device according to claim 1, wherein the green-emitting U$^{6+}$-doped phosphor is a U$^{6+}$-doped silicate-germanate phosphor selected from the group consisting of:
(D1) [Ba, Sr, Ca, Mg]$_2$[Si, Ge]O$_4$: U$^{6+}$;
(D2) [Ba, Sr, Ca, Mg]$_3$[Si, Ge]O$_5$: U$^{6+}$;
(D3) [Ba, Sr, Ca, Mg]$_3$[Si, Ge]$_2$O$_7$: U$^{6+}$;
(D4) [Ba, Sr, Ca, Mg][Si, Ge]O$_3$: U$^{6+}$;
(D5) [Ba, Sr, Ca, Mg][B, Al, Ga, In]$_2$[Si, Ge]$_2$O$_8$: U$^{6+}$;
(D6) [Ba, Sr, Ca, Mg]$_2$[B, Al, Ga, In]$_2$[Si, Ge]O$_7$: U$^{6+}$;
(D7) [Ba, Sr, Ca, Mg]$_3$[B, Al, Ga, In]$_6$[Si, Ge]$_2$O$_{16}$: U$^{6+}$;
(D8) [Ba, Sr, Ca, Mg]$_3$[B, Al, Ga, In]$_2$[Si, Ge]O$_8$: U$^{6+}$;
(D9) [Ba, Sr, Ca, Mg]$_{ii}$[B, Al, Ga, In]$_2$[Si, Ge]$_4$O$_{22}$: U$^{6+}$;
(D10) [Ba, Sr, Ca, Mg]$_3$[B, Al, Ga, In]$_{10}$[Si, Ge]O$_{20}$: U$^{6+}$; and
(D11) [Ba, Sr, Ca, Mg]$_{6.5}$[B, Al, Ga, In]$_{11}$[Si, Ge]$_5$O$_{33}$: U$^{6+}$.

6. A device according to claim 1, wherein the green-emitting U$^{6+}$-doped phosphor is a U$^{6+}$-doped alkali earth oxide phosphor selected from the group consisting of:
(E1) [Ba, Sr, Ca, Mg][B, Al, Ga, In]$_4$O$_7$: U$^{6+}$;
(E2) [Ba, Sr, Ca, Mg]$_3$[B, Al, Ga, In]$_2$O$_6$: U$^{6+}$;
(E3) [Ba, Sr, Ca, Mg][B, Al, Ga, In]$_6$O$_{10}$: U$^{6+}$;
(E4) [Ba, Sr, Ca, Mg][B, Al, Ga, In]$_2$O$_4$: U$^{6+}$;
(E5) [Ba, Sr, Ca, Mg]$_4$[B, Al, Ga, In]$_2$O$_7$: U$^{6+}$;
(E6) [Ba, Sr, Ca, Mg]$_{12}$[B, Al, Ga, In]$_{14}$O$_{33}$: U$^{6+}$;
(E7) A[Ba, Sr, Ca, Mg][B, Al, Ga, In]O$_3$: U$^{6+}$;
(E9) [Ba, Sr, Ca, Mg]$_2$[B, Al, Ga, In, Sc]$_2$O$_5$: U$^{6+}$;
(E10) A[Ba, Sr, Ca, Mg]$_2$[B, Al, Ga, In]$_5$O$_{10}$: U$^{6+}$; and
(E11) A[Ba, Sr, Ca, Mg]$_4$[B, Al, Ga, In]$_3$O$_9$: U$^{6+}$.

7. A device according to claim 1, additionally comprising a phosphor of formula I

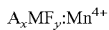

A$_x$MF$_y$:Mn$^{4+}$      I wherein
A is Li, Na, K, Rb, Cs, or a combination thereof;
M is Si, Ge, Sn, Ti, Zr, Al, Ga, In, Sc, Hf, Y, La, Nb, Ta, Bi, Gd, or a combination thereof;
x is an absolute value of a charge of the MF$_y$ ion; and
y is 5, 6 or 7.

8. A device according to claim 7, wherein the phosphor of formula I is K$_2$SiF$_6$:Mn$^{4+}$.

9. A lighting apparatus comprising the device of claim 1.

10. A backlight apparatus comprising the device of claim 1.

11. The backlight apparatus according to claim 10, wherein the device comprises a green-emitting U$^{6+}$-doped phosphor selected from the group consisting of Sr$_3$B$_2$O$_6$: U$^{6+}$, Ca$_3$B$_2$O$_6$: U$^{6+}$, Ca$_{10}$P$_6$O$_{25}$: U$^{6+}$, Sr$_{10}$P$_6$O$_{25}$: U$^{6+}$, Sr$_4$AlPO$_8$: U$^{6+}$, Ba$_4$AlPO$_8$: U$^{6+}$, Sr$_2$SiO$_4$: U$^{6+}$, Ca$_2$SiO$_4$: U$^{6+}$, Sr$_3$Al$_2$O$_6$: U$^{6+}$, Ca$_3$Al$_2$O$_6$: U$^{6+}$, Ca$_{12}$Al$_{14}$O$_{33}$: U$^{6+}$, Ca$_2$Al$_2$SiO$_7$: U$^{6+}$, Ca$_2$BO$_3$Cl: U$^{6+}$, Ca$_2$PO$_4$Cl: U$^{6+}$, Sr$_5$(BO$_3$)$_3$Cl: U$^{6+}$, Ca$_2$GeO$_4$: U$^{6+}$, Sr$_2$GeO$_4$: U$^{6+}$, NaCaPO$_4$: U$^{6+}$, Ca$_3$In$_2$O$_6$: U$^{6+}$, LiSrBO$_3$: U$^{6+}$, LiCaBO$_3$: U$^{6+}$, Sr$_3$Ga$_2$O$_6$: U$^{6+}$ and LiSr$_4$B$_3$O$_9$: U$^{6+}$.

12. A television comprising the backlight apparatus of claim 10.

13. A mobile phone comprising the backlight apparatus of claim 10.

14. A computer monitor comprising the backlight apparatus of claim 10.

15. A green-emitting U$^{6+}$-doped phosphor, selected from [Ba, Sr, Ca, Mg]$_4$[B, Al, Ga, In][P, V]O$_8$: U$^{6+}$ and [Ba, Sr, Ca, Mg]$_6$[B, Al, Ga, V]$_5$O$_{26}$: U$^{6+}$.

16. A device comprising an LED light source optically coupled to a green-emitting U$^{6+}$-doped phosphor selected from the group consisting of U$^{6+}$-doped phosphate-vanadate phosphors, U$^{6+}$-doped halide phosphors, U$^{6+}$-doped oxyhalide phosphors, U$^{6+}$-doped silicate-germanate phosphors, U$^{6+}$-doped alkali earth oxide phosphors, and combinations thereof,
wherein the U$^{6+}$-doped phosphate-vanadate phosphors are selected from the group consisting of:
(A2) Ba$_{2-x}$[Sr, Ca, Mg]$_x$[P$_{1-y}$, V$_y$]$_2$O$_7$: U$^{6+}$; wherein 0≤x≤2, 0≤y≤1, and x≠0 when y=0;
(A3) [Ba, Sr, Ca, Mg]$_4$[P, V]$_2$O$_9$: U$^{6+}$;
(A4) [Ba, Sr, Ca, Mg]$_3$[P, V]$_4$O$_{13}$: U$^{6+}$;
(A5) [Ba, Sr, Ca, Mg]$_4$[B, Al, Ga, In][P, V]O$_8$: U$^{6+}$;
(A6) [Ba, Sr, Ca, Mg]$_6$[B, Al, Ga, In]$_5$[P, V]$_5$O$_{26}$: U$^{6+}$;
(A8) A$_2$[Ba, Sr, Ca, Mg][P, V]$_2$O$_7$: U$^{6+}$;
(A9) A[Ba, Sr, Ca, Mg][P, V]O$_4$: U$^{6+}$;
(A10) [Ba, Sr, Ca, Mg][P, V]$_2$O$_6$: U$^{6+}$;
(A11) [Ba, Sr, Ca, Mg]$_3$[B, Al, Ga, In][P, V]O$_7$: U$^{6+}$; and
(A12) [Ba, Sr, Ca, Mg]$_{10}$[P, V]$_6$O$_{25}$: U$^{6+}$;
wherein, A is Li, Na, K, Rb, Cs, or a combination thereof;
the U$^{6+}$-doped halide phosphors are selected from the group consisting of:
(B2) A[Ba, Sr, Ca, Mg]X$_3$: U$^{6+}$; and
(B3) [Ba, Sr, Ca, Mg]$_2$X$_4$: U$^{6+}$;
wherein, A is Li, Na, K, Rb, Cs, or a combination thereof; and X is F, Cl, Br or a combination thereof; the U$^{6+}$-doped oxyhalide phosphors are selected from the group consisting of:
(C1) [Ba, Sr, Ca, Mg]$_2$[B, Al, Ga, In]O$_3$X: U$^{6+}$;
(C2) [Ba, Sr, Ca, Mg]$_2$[P, V]O$_4$X: U$^{6+}$;
(C4) [Ba, Sr, Ca, Mg]$_5$[B, Al, Ga, In]$_3$O$_9$X: U$^{6+}$; and
(C5) [Ba, Sr, Ca, Mg]$_3$[Si, Ge]O$_4$X: U$^{6+}$;
wherein X is F, Cl, Br or a combination thereof; and the U$^{6+}$-doped alkali earth oxide phosphors are selected from the group consisting of:
(E1) [Ba, Sr, Ca, Mg][B, Al, Ga, In]$_4$O$_7$: U$^{6+}$;
(E2) [Ba, Sr, Ca, Mg]$_3$[B, Al, Ga, In]$_2$O$_6$: U$^{6+}$;
(E3) [Ba, Sr, Ca, Mg][B, Al, Ga, In]$_6$O$_{10}$: U$^{6+}$;
(E4) [Ba, Sr, Ca, Mg][B, Al, Ga, In]$_2$O$_4$: U$^{6+}$;
(E5) [Ba, Sr, Ca, Mg]$_4$[B, Al, Ga, In]$_2$O$_7$: U$^{6+}$;
(E6) [Ba, Sr, Ca, Mg]$_{12}$[B, Al, Ga, In]$_{14}$O$_{33}$: U$^{6+}$;
(E7) A[Ba, Sr, Ca, Mg][B, Al, Ga, In]O$_3$: U$^{6+}$;
(E9) [Ba, Sr, Ca, Mg]$_2$[B, Al, Ga, In, Sc]$_2$O$_5$: U$^{6+}$;
(E10) A[Ba, Sr, Ca, Mg]$_2$[B, Al, Ga, In]$_5$O$_{10}$: U$^{6+}$; and
(E11) A[Ba, Sr, Ca, Mg]$_4$[B, Al, Ga, In]$_3$O$_9$: U$^{6+}$
wherein, A is Li, Na, K, Rb, Cs, or a combination thereof.

17. The device according to claim 16, wherein the green-emitting U$^{6+}$-doped phosphor is a U$^{6+}$-doped phosphate-vanadate phosphor.

18. A device according to claim 16, wherein the green-emitting U$^{6+}$-doped phosphor is a U$^{6+}$-doped halide phosphor.

19. A device according to claim 16, wherein the green-emitting U$^{6+}$-doped phosphor is a U$^{6+}$-doped oxyhalide phosphor.

20. A device according to claim 16, wherein the green-emitting U$^{6+}$-doped phosphor is a U$^{6+}$-doped silicate-germanate phosphor selected from the group consisting of:
(D1) [Ba, Sr, Ca, Mg]$_2$[Si, Ge]O$_4$: U$^{6+}$;
(D2) [Ba, Sr, Ca, Mg]$_3$[Si, Ge]O$_5$: U$^{6+}$;
(D3) [Ba, Sr, Ca, Mg]$_3$[Si, Ge]$_2$O$_7$: U$^{6+}$;

(D4) [Ba, Sr, Ca, Mg][Si, Ge]O$_3$: U$^{6+}$;
(D5) [Ba, Sr, Ca, Mg][B, Al, Ga, In]$_2$[Si, Ge]$_2$O$_8$: U$^{6+}$;
(D6) [Ba, Sr, Ca, Mg]$_2$[B, Al, Ga, In]$_2$[Si, Ge]O$_7$: U$^{6+}$;
(D7) [Ba, Sr, Ca, Mg]$_3$[B, Al, Ga, In]$_6$[Si, Ge]$_2$O$_{16}$: U$^{6+}$;
(D8) [Ba, Sr, Ca, Mg]$_3$[B, Al, Ga, In]$_2$[Si, Ge]O$_8$: U$^{6+}$;
(D9) [Ba, Sr, Ca, Mg]$_{11}$[B, Al, Ga, In]$_2$[Si, Ge]$_4$O$_{22}$: U$^{6+}$;
(D10) [Ba, Sr, Ca, Mg]$_3$[B, Al, Ga, In]$_{10}$[Si, Ge]O$_{20}$: U$^{6+}$; and
(D11) [Ba, Sr, Ca, Mg]$_{6.5}$[B, Al, Ga, In]$_{11}$[Si, Ge]$_5$O$_{33}$: U$^{6+}$.

21. A device according to claim 16, wherein the green-emitting U$^{6+}$-doped phosphor is a U$^{6+}$-doped alkali earth oxide phosphor.

\* \* \* \* \*

UNITED STATES PATENT AND TRADEMARK OFFICE
CERTIFICATE OF CORRECTION

PATENT NO. : 10,720,554 B2
APPLICATION NO. : 15/710780
DATED : July 21, 2020
INVENTOR(S) : Samuel Joseph Camardello et al.

It is certified that error appears in the above-identified patent and that said Letters Patent is hereby corrected as shown below:

In the Claims

Claim 15, Column 36, Lines 4-5, "[Ba, Sr, Ca, Mg]$_6$[B, Al, Ga, V]$_5$O$_{26}$: U$^{6+}$" should read -- [Ba, Sr, Ca, Mg]$_6$[B, Al, Ga, In]$_5$[P, V]$_5$O$_{26}$: U$^{6+}$ --.

Signed and Sealed this
Twelfth Day of July, 2022

Katherine Kelly Vidal
*Director of the United States Patent and Trademark Office*